(12) United States Patent
Jourba et al.

(10) Patent No.: US 10,644,012 B2
(45) Date of Patent: May 5, 2020

(54) METHOD OF MAKING SPLIT GATE NON-VOLATILE MEMORY CELLS WITH THREE-DIMENSIONAL FINFET STRUCTURE, AND METHOD OF MAKING SAME

(71) Applicant: Silicon Storage Technology, Inc., San Jose, CA (US)

(72) Inventors: Serguei Jourba, Aix en Provence (FR); Catherine Decobert, Pourrieres (FR); Feng Zhou, Fremont, CA (US); Jinho Kim, Saratoga, CA (US); Xian Liu, Sunnyvale, CA (US); Nhan Do, Saratoga, CA (US)

(73) Assignee: Silicon Storage Technology, Inc., San Jose, CA (US)

( * ) Notice: Subject to any disclaimer, the term of this patent is extended or adjusted under 35 U.S.C. 154(b) by 0 days.

(21) Appl. No.: 16/422,740

(22) Filed: May 24, 2019

(65) Prior Publication Data
US 2020/0013788 A1    Jan. 9, 2020

Related U.S. Application Data

(62) Division of application No. 16/028,244, filed on Jul. 5, 2018.

(51) Int. Cl.
*H01L 27/11524* (2017.01)
*H01L 21/266* (2006.01)
(Continued)

(52) U.S. Cl.
CPC ...... *H01L 27/11524* (2013.01); *H01L 21/266* (2013.01); *H01L 21/7684* (2013.01);
(Continued)

(58) Field of Classification Search
CPC ........... H01L 27/1052; H01L 27/10802; H01L 27/11517; H01L 27/11524; H01L 27/11536; H01L 27/1156
See application file for complete search history.

(56) References Cited

U.S. PATENT DOCUMENTS

| 5,029,130 | A  | 7/1991 | Yeh |
| 6,747,310 | B2 | 6/2004 | Fan |

(Continued)

OTHER PUBLICATIONS

U.S. Appl. No. 16/208,150, filed Dec. 3, 2018 entitled "Split Gate Non-volatile Memory Cells With FINFET Structure and HKMG Memory and Logic Gates, and Method of Making Same," Zhou et al.

(Continued)

*Primary Examiner* — Jae Lee
(74) *Attorney, Agent, or Firm* — DLA Piper LLP (US)

(57) ABSTRACT

A method of forming a memory device including a plurality of upwardly extending fins in a semiconductor substrate upper surface. A memory cell is formed on a first fin, and includes spaced apart source and drain regions in the first fin, with a channel region extending along top and opposing side surfaces of the first fin between the source and drain regions. A floating gate extends along a first portion of the channel region. A select gate extends along a second portion of the channel region. A control gate extends along the floating gate. An erase gate extends along the source region. A second fin has a length that extends in a first direction which is perpendicular to a second direction in which a length of the first fin extends. The source region is formed in the first fin at an intersection of the first and second fins.

14 Claims, 73 Drawing Sheets

(51) Int. Cl.

| | |
|---|---|
| *H01L 21/768* | (2006.01) |
| *H01L 21/8234* | (2006.01) |
| *H01L 21/8238* | (2006.01) |
| *H01L 27/088* | (2006.01) |
| *H01L 29/423* | (2006.01) |
| *H01L 29/66* | (2006.01) |
| *H01L 29/78* | (2006.01) |
| *H01L 29/788* | (2006.01) |

(52) U.S. Cl.
CPC ............... *H01L 21/76883* (2013.01); *H01L 21/823431* (2013.01); *H01L 21/823437* (2013.01); *H01L 21/823821* (2013.01); *H01L 21/823828* (2013.01); *H01L 27/0886* (2013.01); *H01L 29/42328* (2013.01); *H01L 29/6681* (2013.01); *H01L 29/66545* (2013.01); *H01L 29/66825* (2013.01); *H01L 29/785* (2013.01); *H01L 29/7881* (2013.01)

(56) References Cited

U.S. PATENT DOCUMENTS

| | | | |
|---|---|---|---|
| 7,315,056 B2 | 1/2008 | Klinger | |
| 7,329,580 B2 | 2/2008 | Choi | |
| 7,410,913 B2 | 8/2008 | Lee | |
| 7,423,310 B2 | 9/2008 | Verhoeven | |
| 7,868,375 B2 | 1/2011 | Liu | |
| 7,927,994 B1 | 4/2011 | Liu | |
| 8,068,370 B2 | 11/2011 | Lue | |
| 8,148,768 B2 | 4/2012 | Do | |
| 8,420,476 B2 | 4/2013 | Booth | |
| 8,461,640 B2 | 6/2013 | Hu | |
| 8,710,485 B2 | 4/2014 | Saitoh | |
| 8,941,153 B2 | 1/2015 | Lee | |
| 9,276,005 B1 | 3/2016 | Zhou | |
| 9,276,006 B1 | 3/2016 | Chen | |
| 9,406,689 B2 | 8/2016 | Li | |
| 9,614,048 B2 | 4/2017 | Wu | |
| 9,634,018 B2 | 4/2017 | Su | |
| 9,972,630 B2 | 5/2018 | Su | |
| 9,985,042 B2 | 5/2018 | Su | |
| 2005/0012137 A1 | 1/2005 | Levi | |
| 2005/0280000 A1 | 12/2005 | Ishii | |
| 2006/0097310 A1 | 5/2006 | Kim | |
| 2006/0208307 A1* | 9/2006 | Chang | H01L 27/115 257/315 |
| 2007/0158730 A1 | 7/2007 | Burnett | |
| 2008/0173921 A1 | 7/2008 | Li | |
| 2010/0320525 A1 | 12/2010 | Nagashima | |
| 2013/0270627 A1 | 10/2013 | Cheng | |
| 2016/0020219 A1* | 1/2016 | Chuang | H01L 27/11573 257/324 |
| 2016/0064398 A1 | 3/2016 | Toh | |
| 2016/0218110 A1 | 7/2016 | Yang | |
| 2016/0379987 A1* | 12/2016 | Liu | H01L 27/11524 257/316 |
| 2017/0117285 A1 | 4/2017 | Chen | |
| 2017/0243955 A1 | 8/2017 | Shinohara | |
| 2017/0271484 A1 | 9/2017 | Baars et al. | |
| 2017/0301683 A1 | 10/2017 | Chen | |
| 2018/0315765 A1* | 11/2018 | Lin | H01L 21/76232 |
| 2019/0165115 A1* | 5/2019 | Lin | H01L 27/11573 |

OTHER PUBLICATIONS

U.S. Appl. No. 16/208,288, filed Dec. 3, 2018 entitled "FINFET-Based Split Gate Non-volatile Flash Memory With Extended Source Line FINFET, and Method of Fabrication," Jourba et al.

U.S. Appl. No. 15/957,615, filed Apr. 19, 2018 entitled "Split Gate Non-volatile Memory Cells and Logic Devices With FINFET Structure, and Method of Making Same"; Applicant: Silicon Storage Technology, Inc.

U.S. Appl. No. 15/933,124, filed Mar. 22, 2018 entitled "Two Transistor Finfet-Based Split Gate Non-volatile Floating Gate Flash Memory and Method of Fabrication"; Applicant: Silicon Storage Technology, Inc.

* cited by examiner

FIG. 3A (along X-section c)

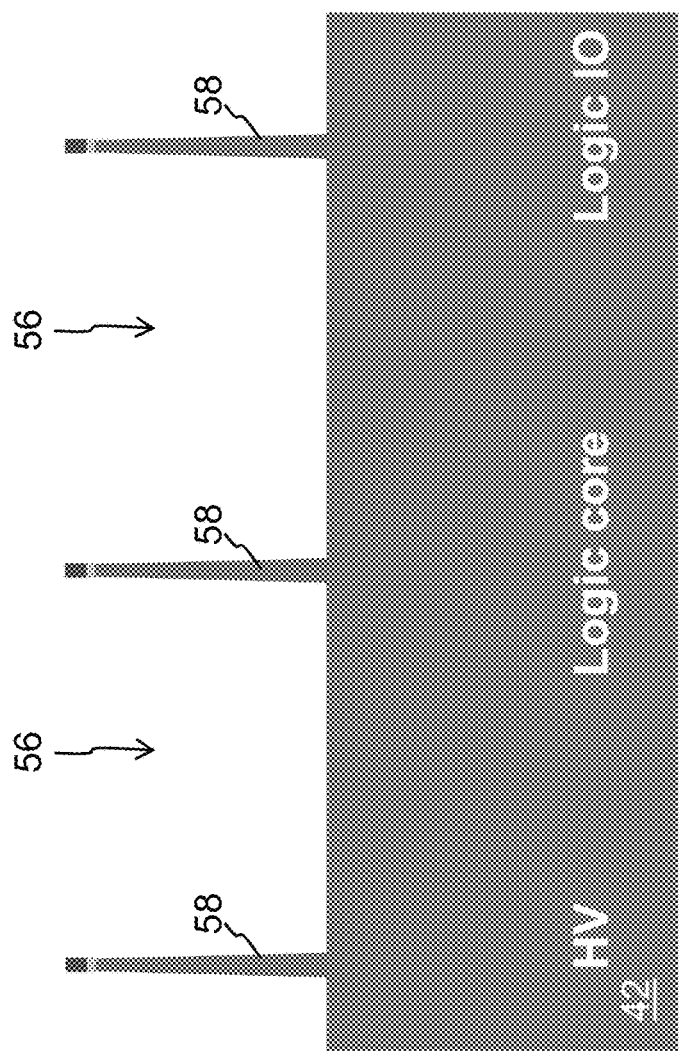
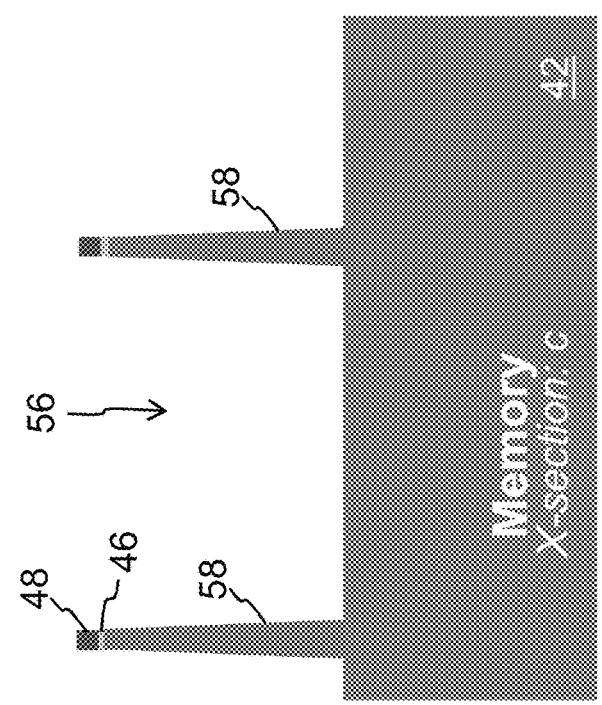

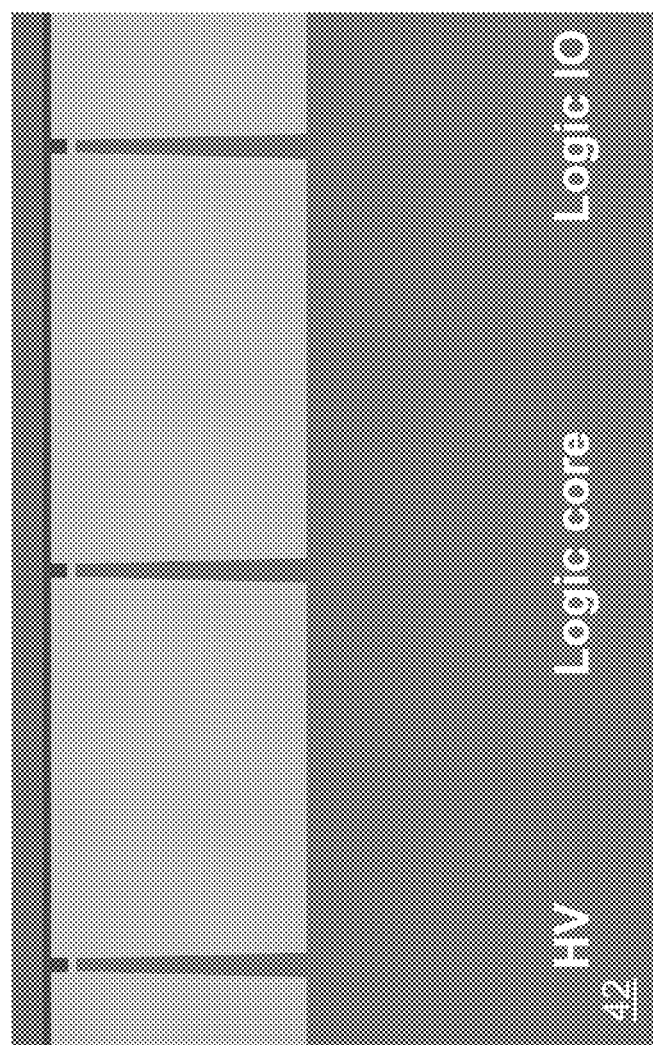
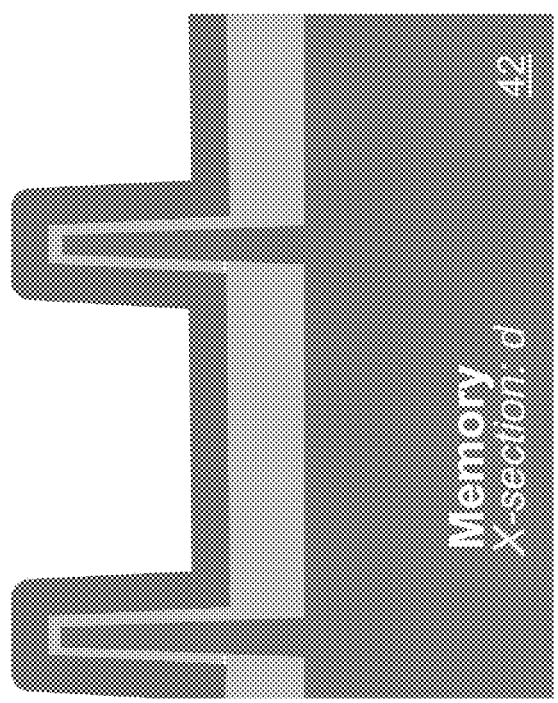
FIG. 11D
FIG. 11C

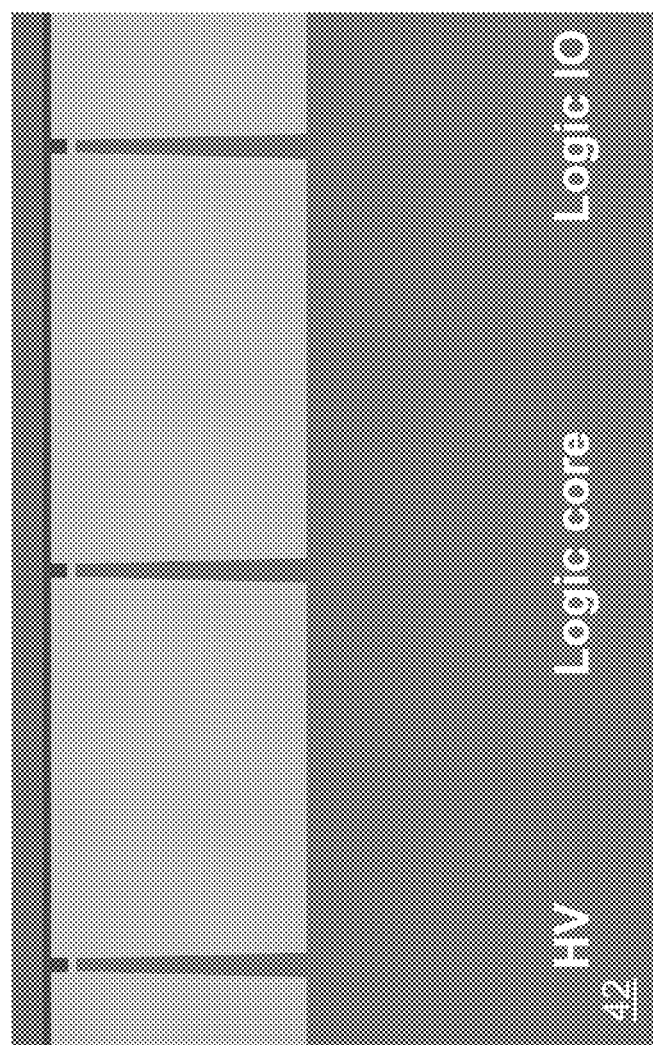
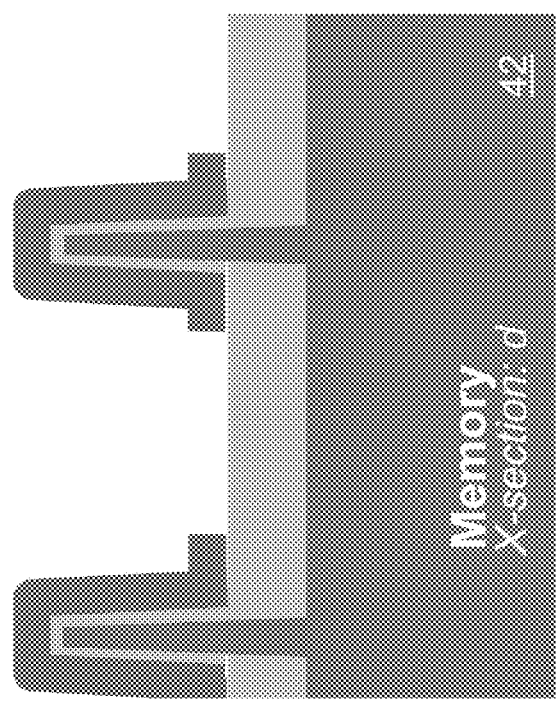

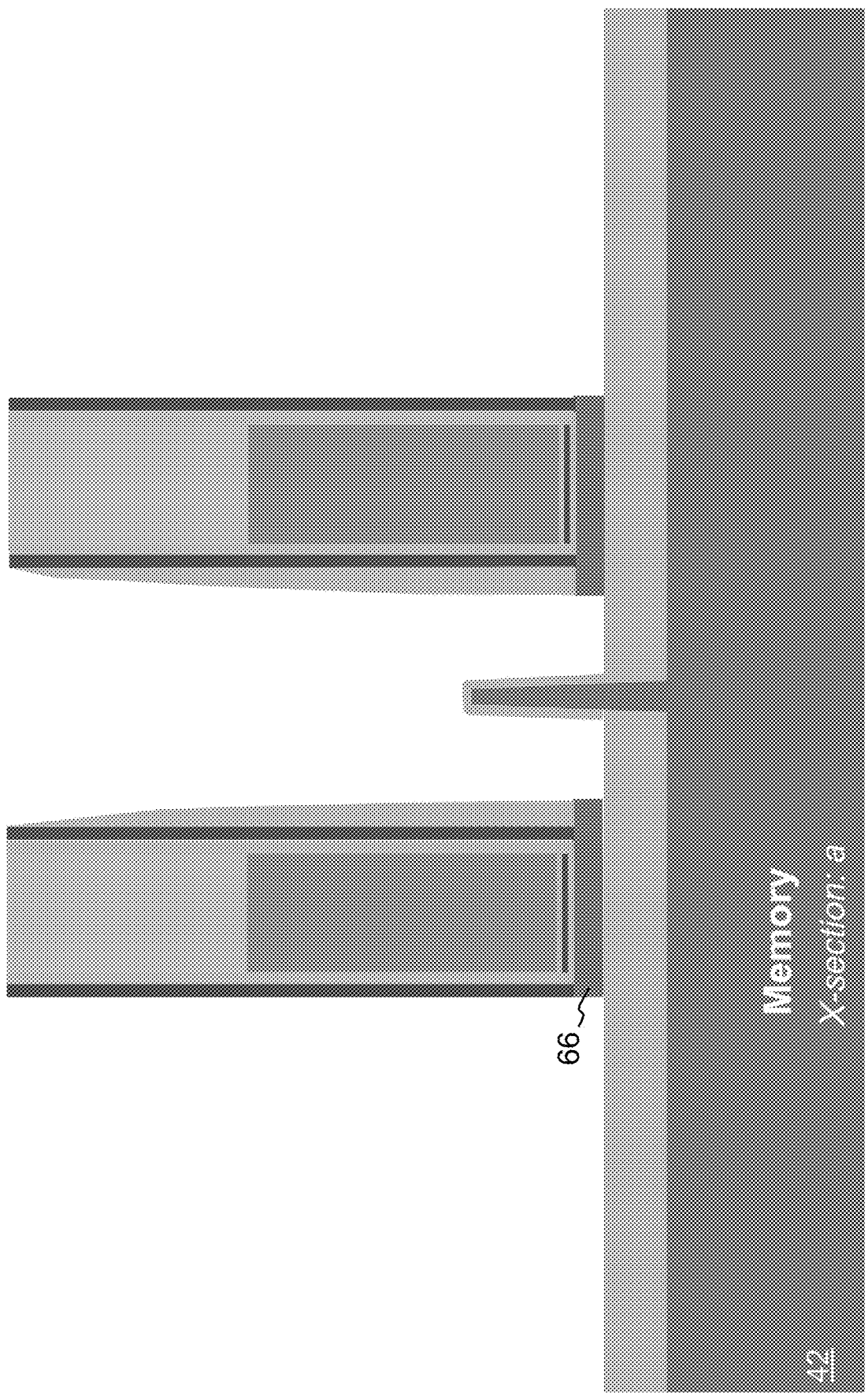

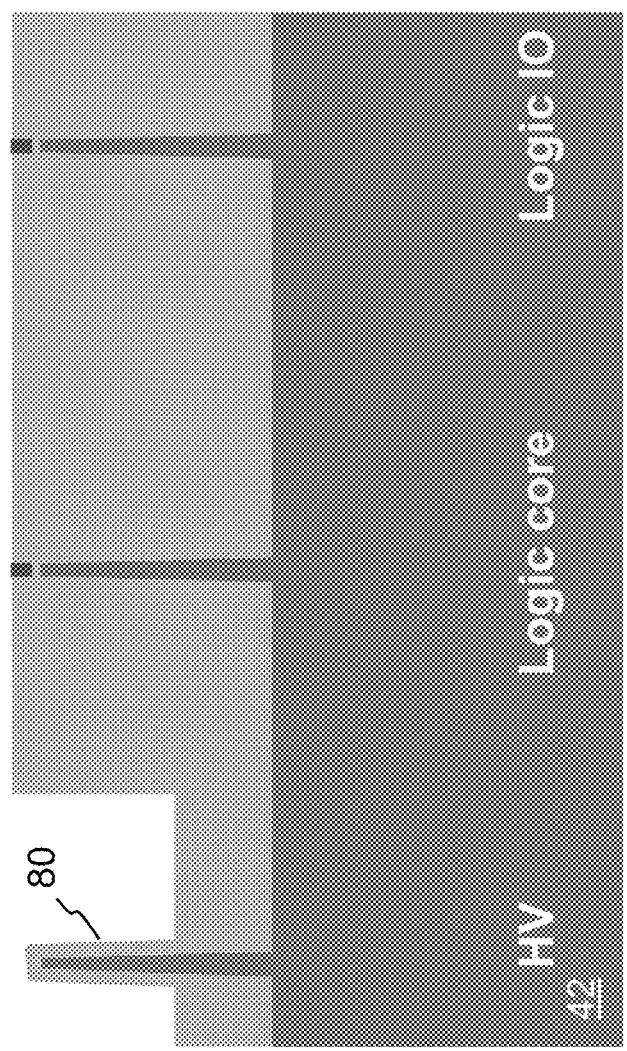
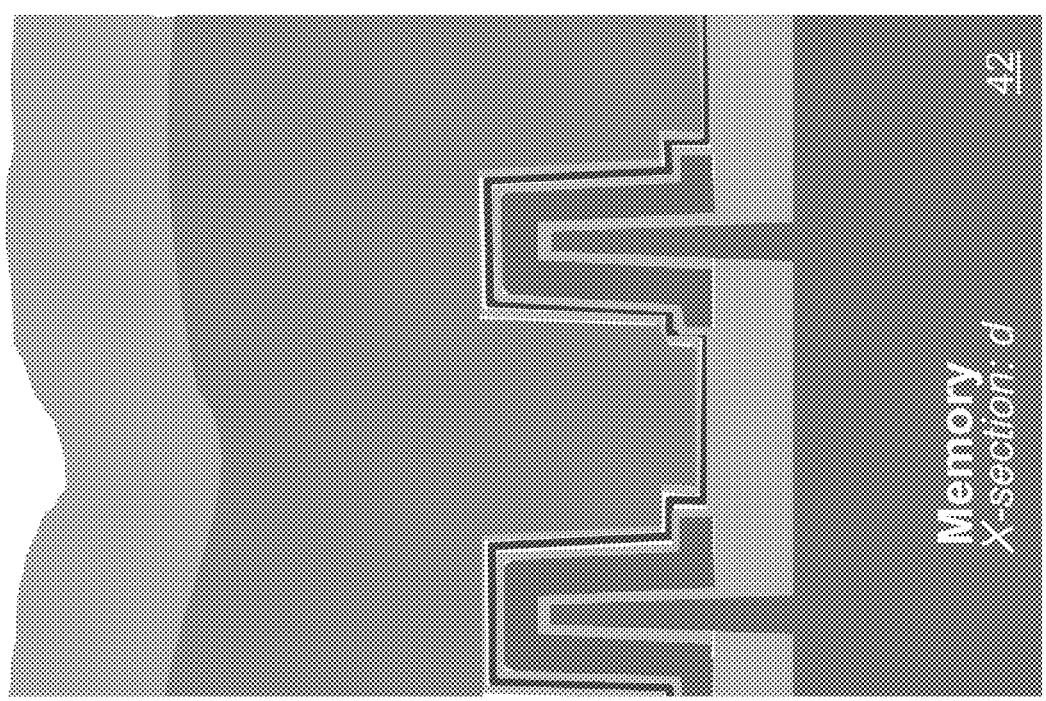
FIG. 19E
FIG. 19D

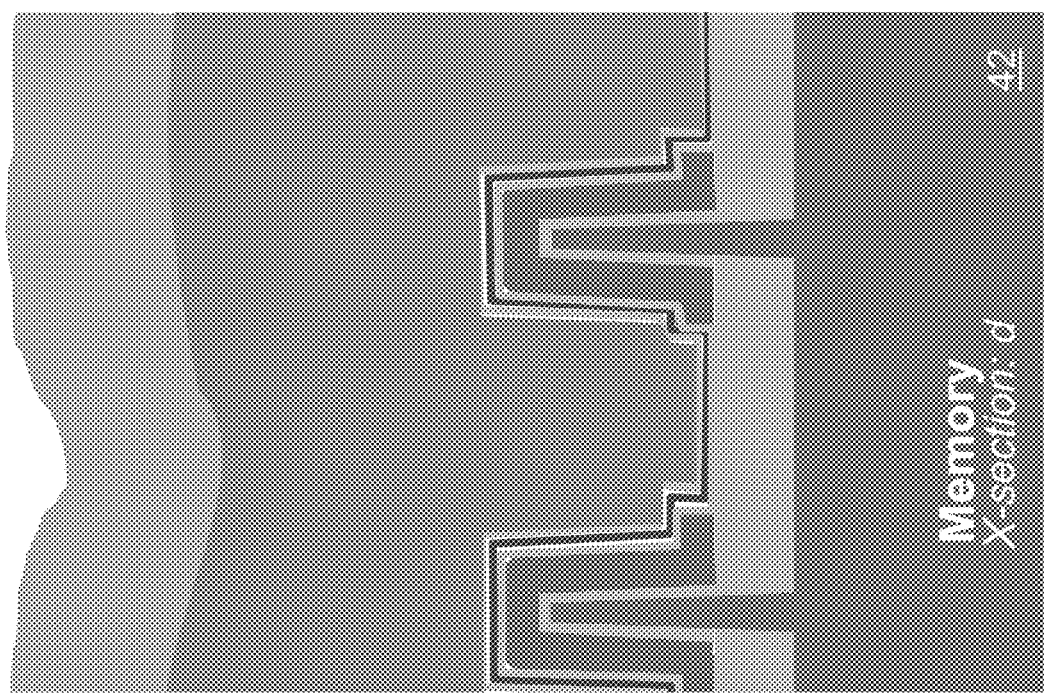
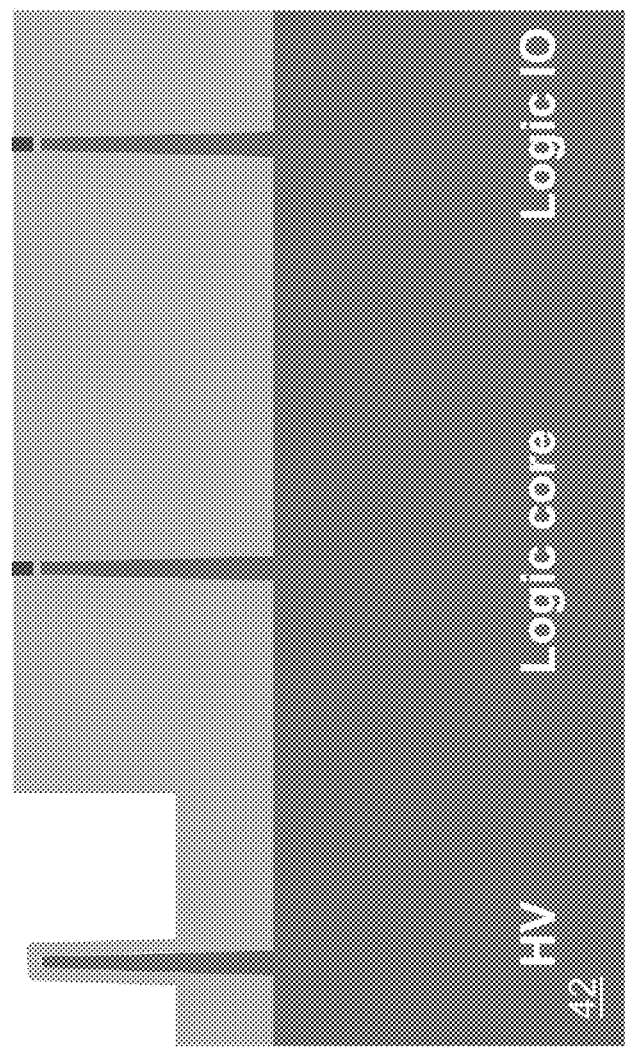
FIG. 20D
FIG. 20E

METHOD OF MAKING SPLIT GATE NON-VOLATILE MEMORY CELLS WITH THREE-DIMENSIONAL FINFET STRUCTURE, AND METHOD OF MAKING SAME

This application is a divisional of U.S. application Ser. No. 16/028,244, filed Jul. 5, 2018.

FIELD OF THE INVENTION

The present invention relates to non-volatile flash memory cell arrays.

BACKGROUND OF THE INVENTION

Split gate non-volatile memory devices are well known in the art. For example, U.S. Pat. No. 7,927,994 discloses a split gate non-volatile memory cell. FIG. 1 illustrates an example of such a split gate memory cell formed on a semiconductor substrate 12. Source and drain regions 16 and 14 are formed as diffusion regions in substrate 12, and define a channel region 18 there between. The memory cell includes four conductive gates: a floating gate 22 disposed over and insulated from a first portion of the channel region 18 and a portion of the source region 16, a control gate 26 disposed over and insulated from the floating gate 22, an erase gate 24 disposed over and insulated from the source region 16, and a select gate 20 disposed over and insulated from a second portion of the channel region 18. A conductive contact 10 can be formed to electrically connect to the drain region 14. Because the channel region is formed along the planar surface of the semiconductor substrate, as device geometries get smaller, so too does total area (e.g. width) of the channel region. This reduces the current flow between the source and drain regions, requiring more sensitive sense amplifiers etc. to detect the state of the memory cell.

Because the problem of shrinking the lithography size thereby reducing the channel width affects all semiconductor devices, a Fin-FET type of structure has been proposed. In a Fin-FET type of structure, a fin shaped member of semiconductor material connects the source to the drain regions. The fin shaped member has two side surfaces terminating in a top surface. Current from the source to the drain regions can then flow along the two side surfaces and the top surface. Thus, the width of the channel region is increased, thereby increasing the current flow. However, the width of the channel region is increased without sacrificing more semiconductor real estate by "folding" the channel region into two side surfaces and the top surface, thereby reducing the "footprint" of the channel region. Non-volatile memory cells using such Fin-FETs have been disclosed, where the floating gates are disposed adjacent to one of the side surfaces of the fin shaped member. Some examples of prior art Fin-FET non-volatile memory structures (although the number and configuration of the gates varies from the above described planar example in FIG. 1) include U.S. Pat. Nos. 7,423,310, 7,410,913 and 8,461,640, and U.S. Patent Publication 2017/0345840. It has also been proposed to form logic devices on fin shaped members. See for example U.S. Patent Publication 2017/0125429 and pending U.S. patent application Ser. No. 15/933,124.

However, these prior art Fin-FET structures have disclosed using the floating gate in stacked gate configuration, or using trapping material, or using SRO (silicon rich oxide) or using nanocrystal silicon to store charges, or other more complicated memory cell configurations.

BRIEF SUMMARY OF THE INVENTION

The aforementioned problems and needs are addressed by a method of forming a memory device that includes forming a plurality of upwardly extending fins in an upper surface of a semiconductor substrate, wherein each of the fins including first and second side surfaces that oppose each other and that terminate in a top surface, and forming a memory cell on a first fin of the plurality of fins. The memory cell is formed by forming spaced apart source and drain regions in the first fin, with a channel region of the first fin extending along the top surface and the opposing side surfaces of the first fin between the source and drain regions, forming a floating gate that extends along a first portion of the channel region, wherein the floating gate extends along and is insulated from the first and second side surfaces and the top surface of the first fin, forming a select gate that extends along a second portion of the channel region, wherein the select gate extends along and is insulated from the first and second side surfaces and the top surface of the first fin, forming a control gate that extends along and is insulated from the floating gate, and forming an erase gate that extends along and is insulated from the source region. A second fin of the plurality of fins has a length that extends in a first direction, wherein the first fin has a length that extends in a second direction that is perpendicular to the first direction, and wherein the source region is formed in the first fin at an intersection of the first and second fins.

A method of forming a memory device includes forming plurality of upwardly extending first fins and a plurality of upwardly extending second fins in an upper surface of a semiconductor substrate where each of the first and second fins including first and second side surfaces that oppose each other and that terminate in a top surface, each of the first fins has a length that extends in a first direction, each of the second fins has a length that extends in a second direction that is perpendicular to the first direction, and the first fins intersect the second fins in a grid like manner. The method further includes forming a plurality of memory cells on the first fins, wherein each memory cell is formed on one of the first fins by forming spaced apart source and drain regions in the one first fin, with a channel region of the one first fin extending along the top surface and the opposing side surfaces of the one first fin between the source and drain regions, forming a floating gate that extends along a first portion of the channel region, wherein the floating gate extends along and is insulated from the first and second side surfaces and the top surface of the one first fin, forming a select gate that extends along a second portion of the channel region, wherein the select gate extends along and is insulated from the first and second side surfaces and the top surface of the one first fin, forming a control gate that extends along and is insulated from the floating gate, and forming an erase gate that extends along and is insulated from the source region, wherein the source region is formed at an intersection of the one first fin and one of the second fins.

Other objects and features of the present invention will become apparent by a review of the specification, claims and appended figures.

BRIEF DESCRIPTION OF THE DRAWINGS

FIGS. 3A, 4A, 5A, 6A, 7A, 8A, 9A, 10A, 11A-11C, 12A-12D, 13A-13D, 14A-14D, 15A-15D, 16A-16D, 17A-17D, 18A-18D, 19A-19D, 20A-20D, 22A-22D, 23A-23D, 24A-24D, 25A-25D, 26A-26B, 27A-27B and 28 are side cross sectional views of different cross sectional positions and directions of the Memory Area showing the steps in forming the memory device of the present invention.

FIGS. 3B, 4B, 5B, 6B, 7B, 8B, 9B, 10B, 11D, 12E, 13E, 14E, 15E, 16E, 17E, 18E, 19E, 20E, 21, 22E, 23E, 24E, 25E and 26C are side cross sectional views of the Logical Device Areas showing the steps in forming the memory device of the present invention.

DETAILED DESCRIPTION OF THE INVENTION

Figure 1:
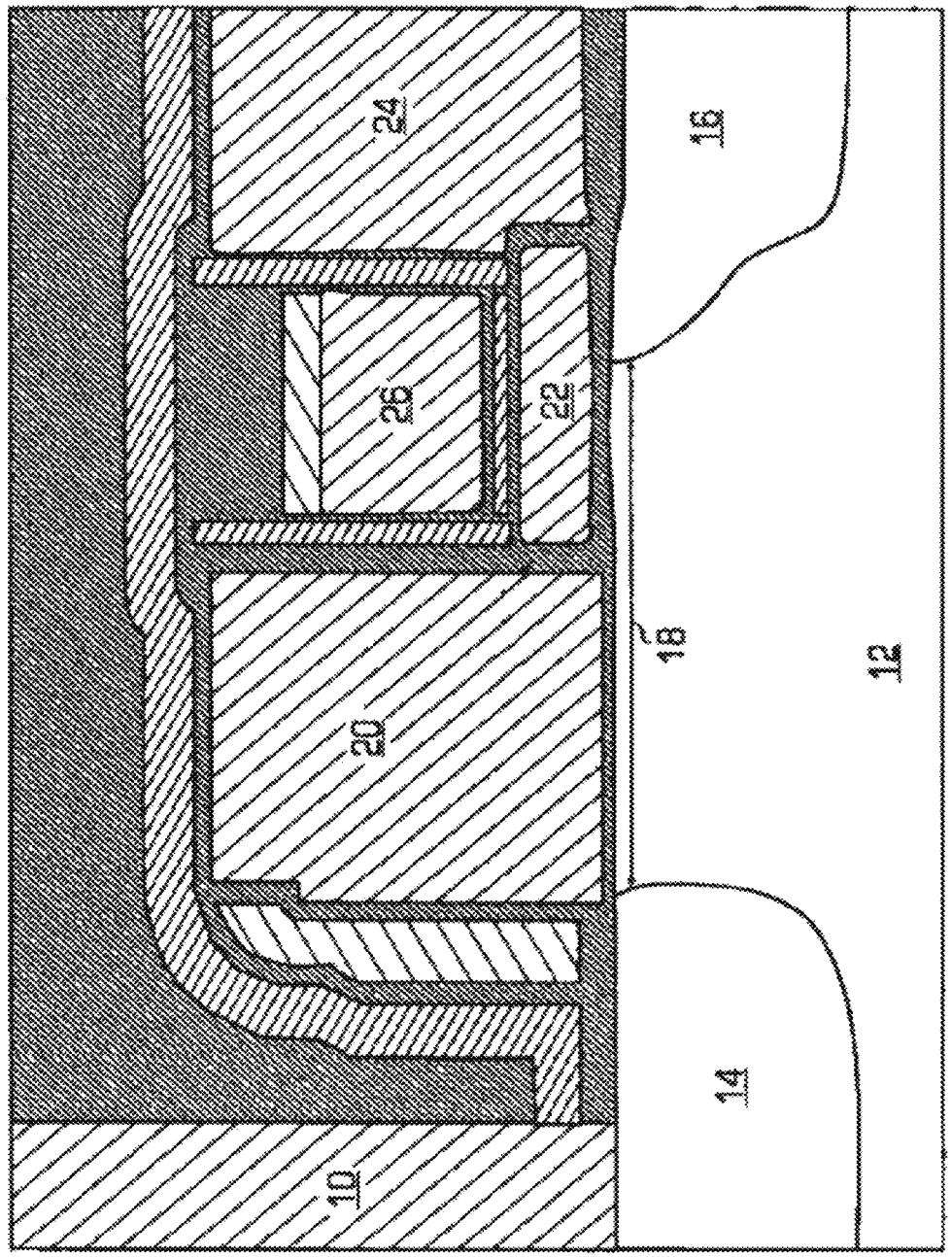
FIG. 1 is a side cross sectional view of a conventional non-volatile memory cell.
Figure 2:
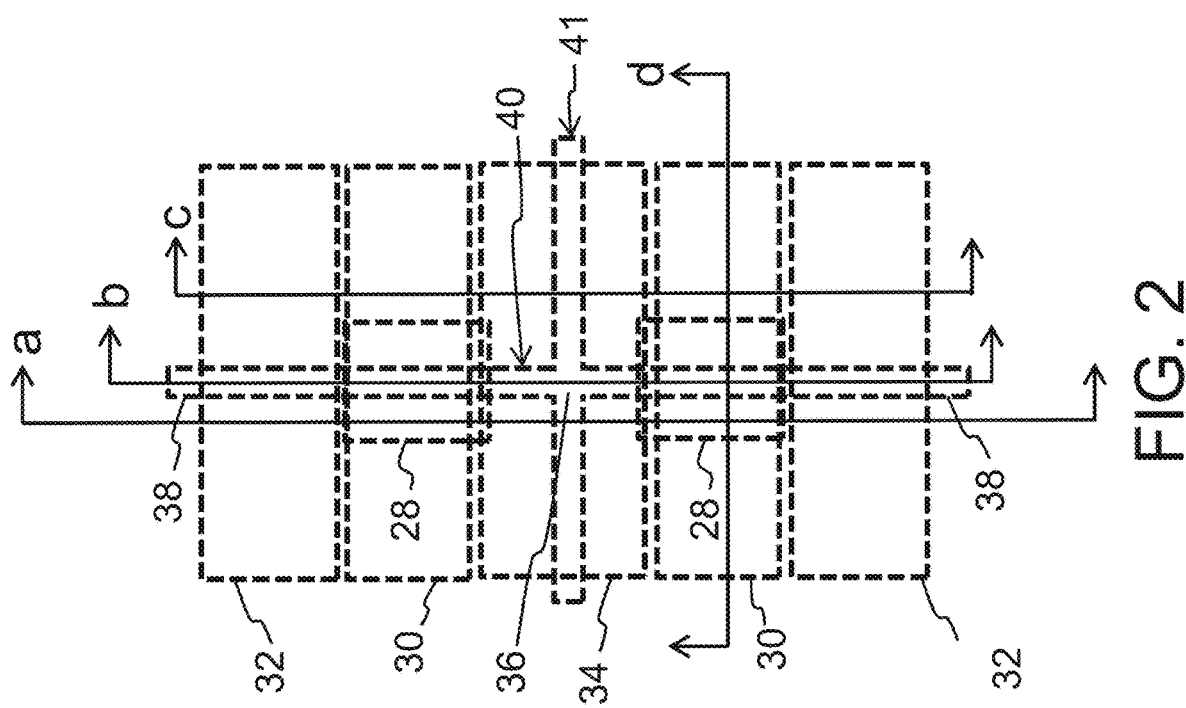
FIG. 2 is a top view of the Memory Area illustrating the various cross sectional view directions for other figures.

The present invention is a memory device having Fin-FET split gate type memory cells each having four gates: a floating gate 28, control gate 30, a select gate 32 and an erase gate 34. Fin-FET logic devices are formed on the same substrate as the memory cells. FIG. 2 is a top view illustrating the configuration of a mirror pair of memory cells in the memory area of the substrate. The mirror pair of memory cells share a common source region 36 (i.e., a region of the substrate having a second conductivity type different than the first conductivity type of the substrate), where drain regions 38 (of the second conductivity type) are shared among adjacent pairs of memory cells (not shown). The substrate includes crossing fin shaped portions 40 and 41 of the upper surface of a semiconductor substrate 42. The memory cells are formed on the fin shaped portions 40. FIG. 2 further shows the cross sectional view directions a, b, c and d for subsequently described figures.

Figure 3B:
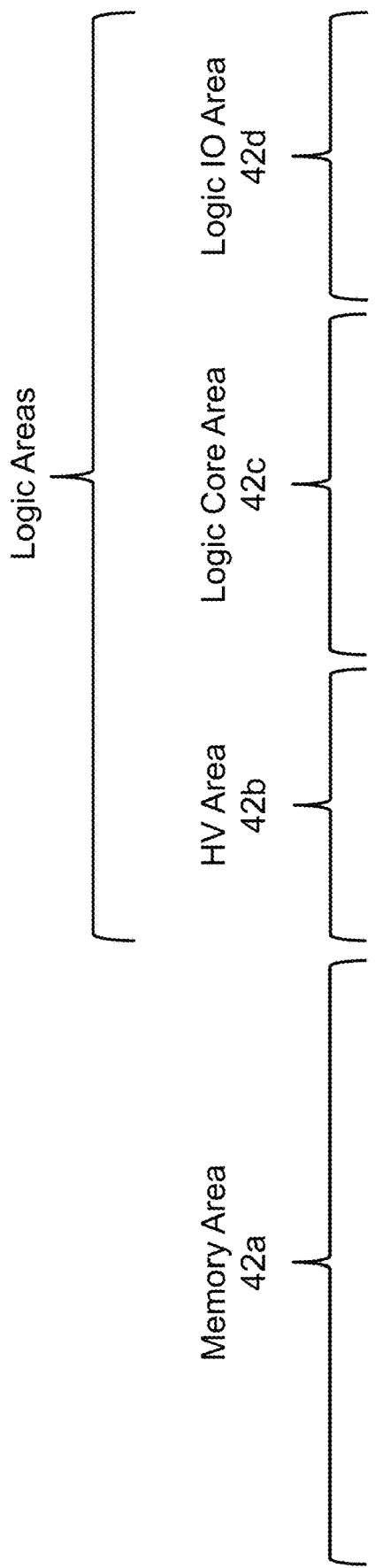
Figure 3B:
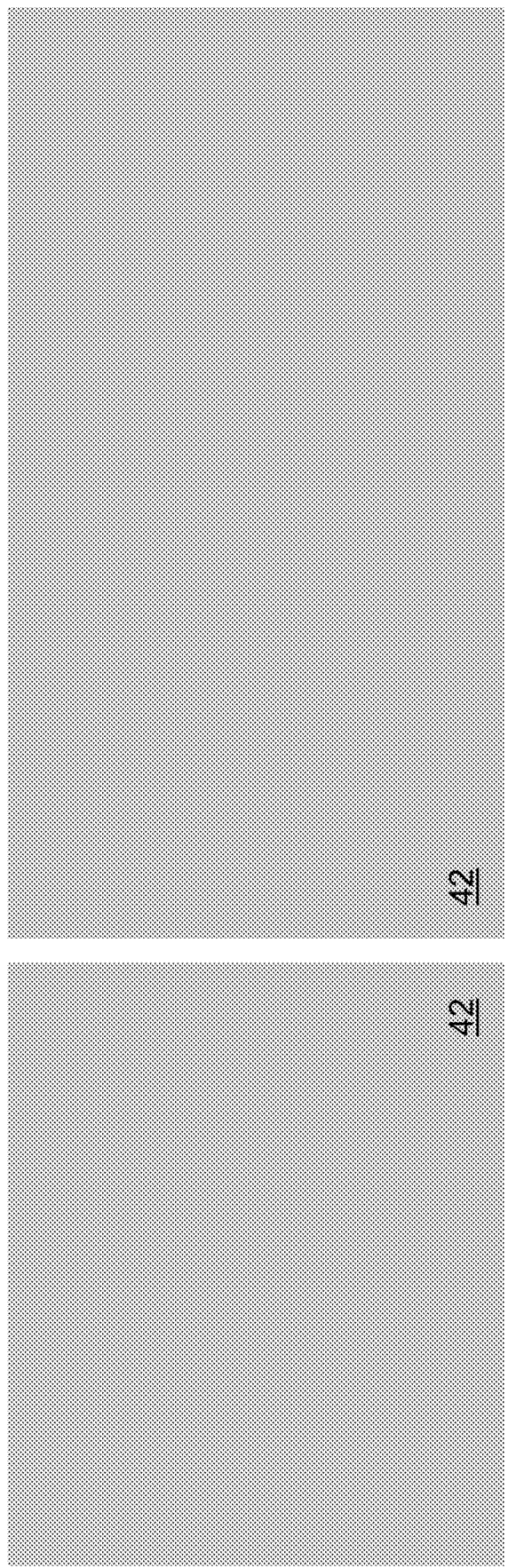

The fabrication process begins by selectively implanting different areas of a semiconductor substrate 42. The various areas of the substrate 42 are shown in FIGS. 3A and 3B (i.e., FIGS. 3A and 3B show different areas of the same substrate 42), where the substrate has four areas relating to memory cells and logic devices: the Memory Area 42a (in which memory cells are formed), the HV Area 42b (in which high voltage logic devices are formed), the Logic Core Area 42c (in which core logic devices are formed) and the Logic IO Area 42d (in which input/output logic devices are formed). Areas 42b, 42c and 42d are referred to herein collectively as the Logic Areas. Preferably, the selective implantation begins by covering the substrate with a masking material except for the HV Area, which is subjected to one or more implantation steps (e.g., an anti-punchthrough implantation that will prevent source to drain leakage in the high voltage logic devices formed in this area). This can be repeated for the Memory Area (e.g., cover the other areas with masking material, and perform an anti-punchthrough implantation that will prevent source to drain leakage in the memory cells formed in this area).

Figures 4A, 4B:
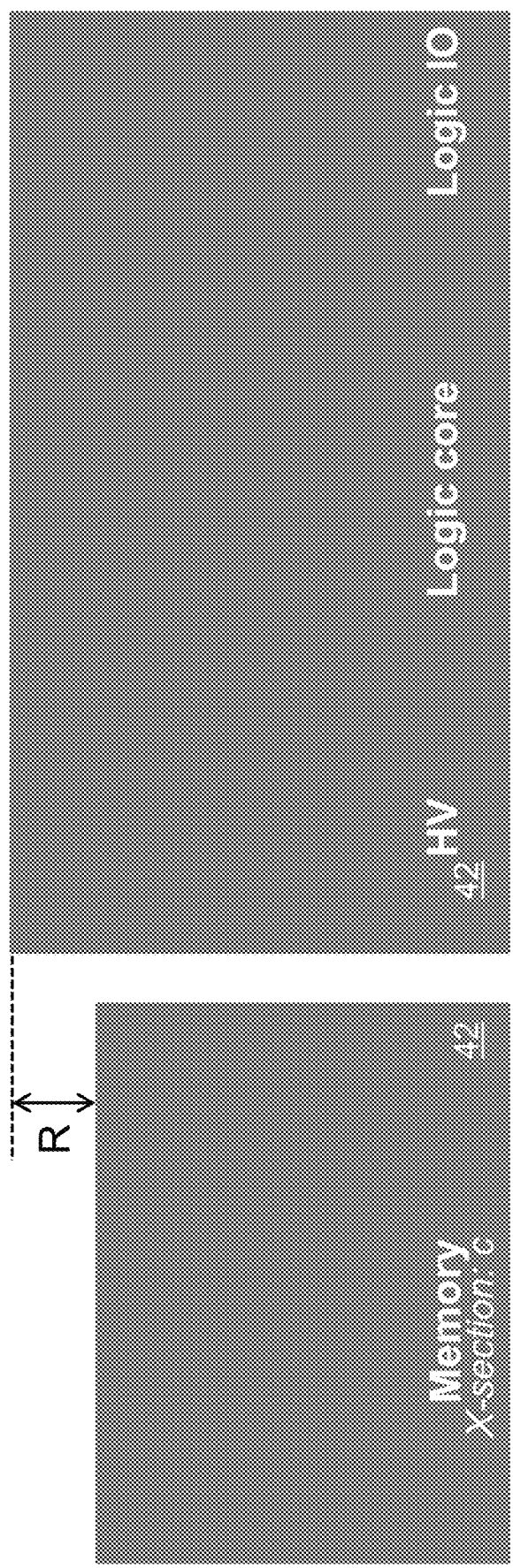

The upper surface of the Memory Area of the substrate 42 is then recessed (lowered) compared to the Logic Areas of the substrate, as shown in FIGS. 4A and 4B. This is preferably done by forming a layer of material (e.g., silicon nitride) on the substrate 42, followed by a masking step (i.e., photo resist deposition, selective photolithography exposure and selective photo resist removal), leaving photo resist on the silicon nitride in the Logic Areas, but leaving the silicon nitride exposed in the Memory Area. A silicon nitride etch is used to remove the silicon nitride from the Memory Area leaving the substrate surface exposed. The exposed portion of the substrate 42 (in the Memory Area) is oxidized, followed by a wet oxide etch to remove the oxidized portion of the substrate, which effectively removes a top portion of the substrate (effectively lowering/recessing its upper surface). These steps can be repeated until the desired level of surface recess R is achieved (e.g., 300-500 nm). A nitride etch is then used to remove the nitride.

Figure 5B:
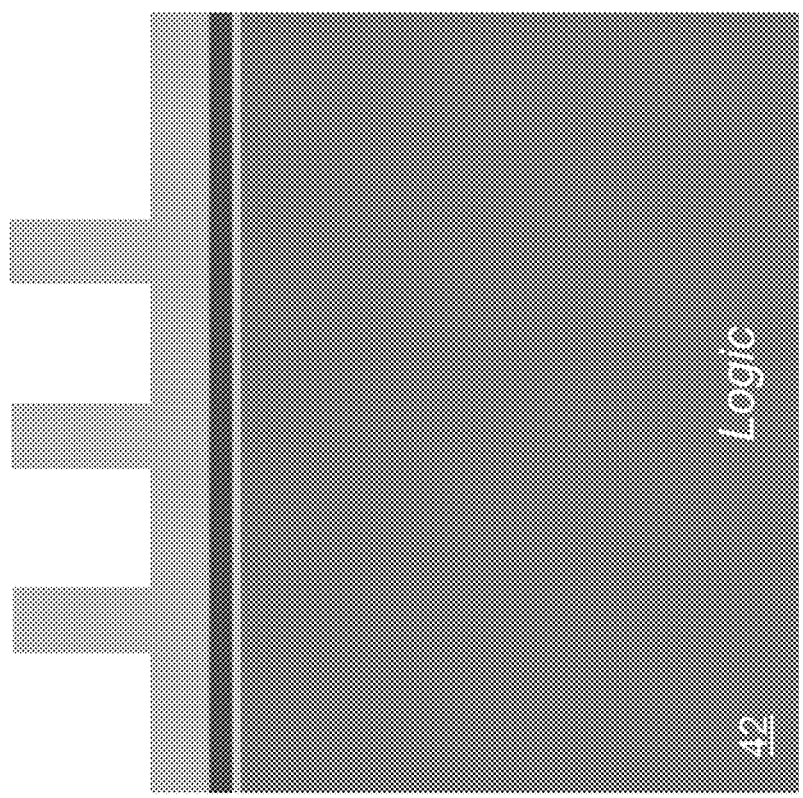
Figure 5A:
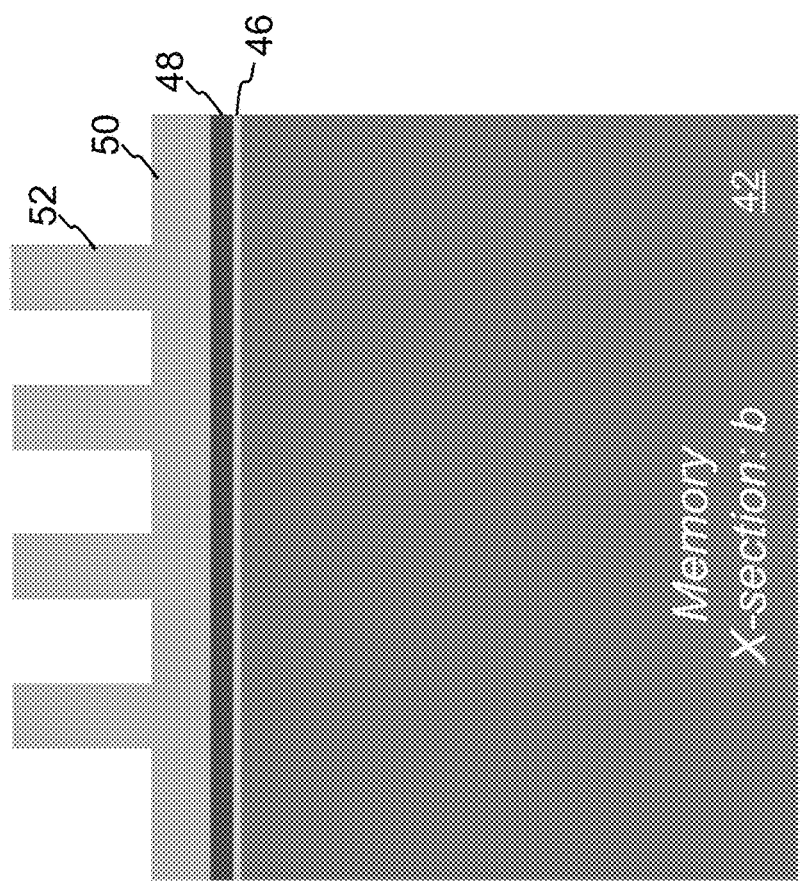
Figure 6B:
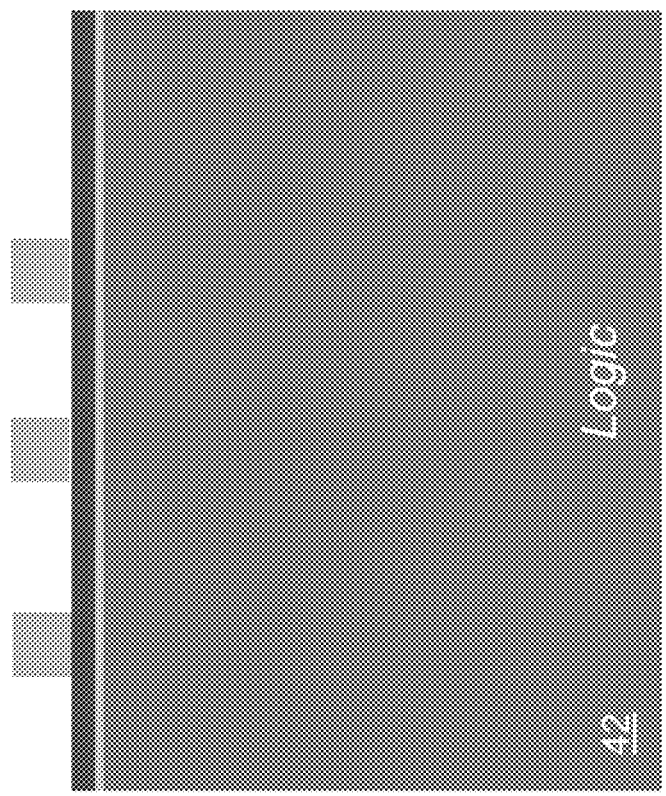
Figure 6A:
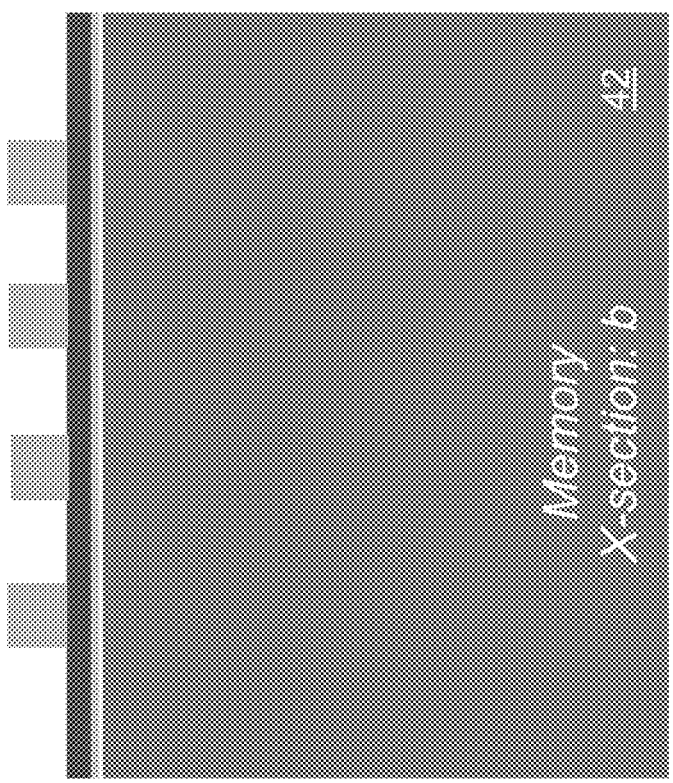

Fins are then formed in the substrate upper surface. Specifically, crossing fins are formed in the memory area, while parallel fins are formed in the logic areas. A silicon dioxide (oxide) layer 46 is formed on the upper surface in all four areas (Memory, HV, Logic Core and Logic IO) of the substrate 42. A silicon nitride (nitride) layer 48 is formed on oxide layer 46. A hard mask material (e.g. amorphous carbon) 50 is formed on the nitride layer 48. Photoresist 52 is formed on the hard mask material and patterned using a masking step to expose strips of the hard mask material, as shown in FIGS. 5A and 5B. An etch is performed to remove the exposed portions of hard mask material, leaving strips of hard mask material, as shown in FIGS. 6A and 6B (after photoresist removal).

Figure 7B:
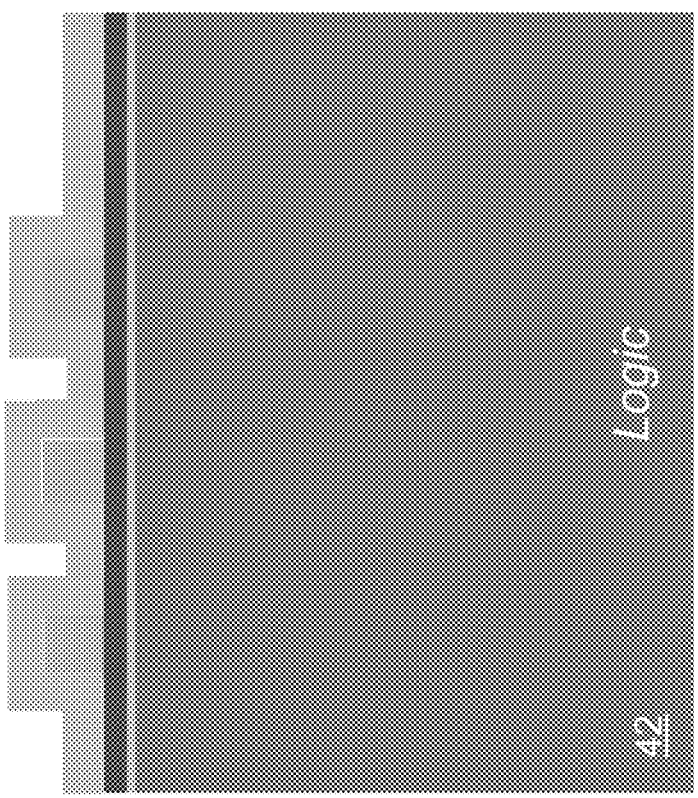
Figure 7A:
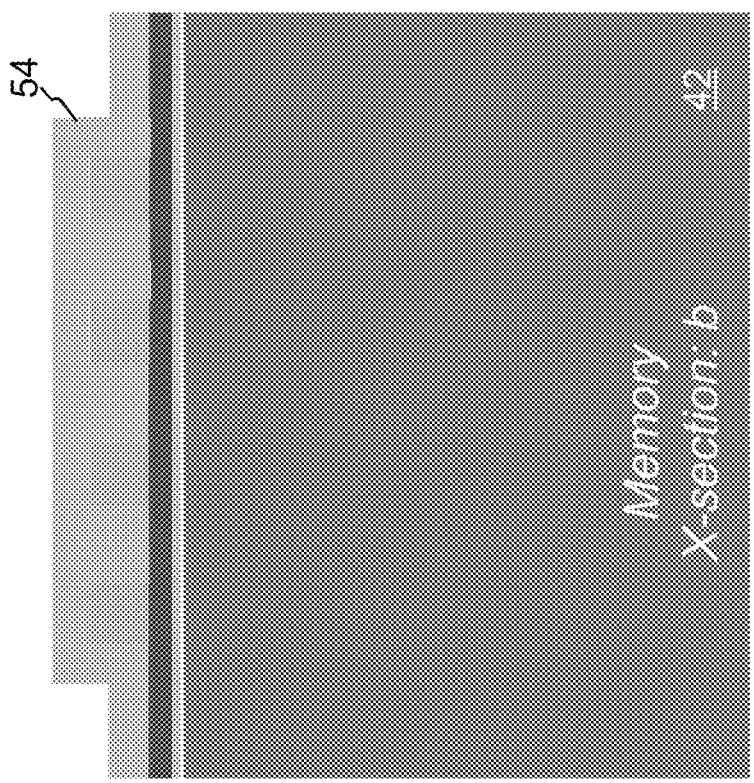
Figure 8B:
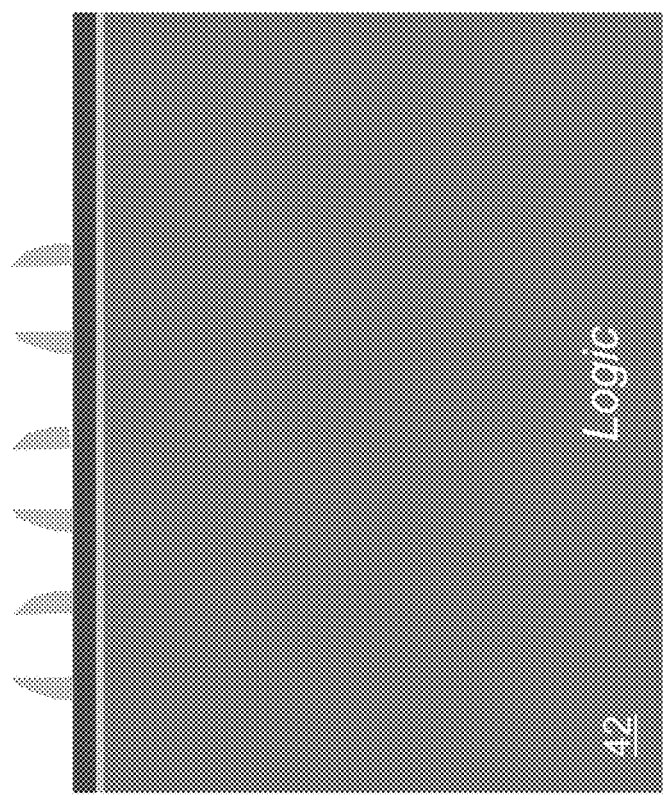
Figure 8A:
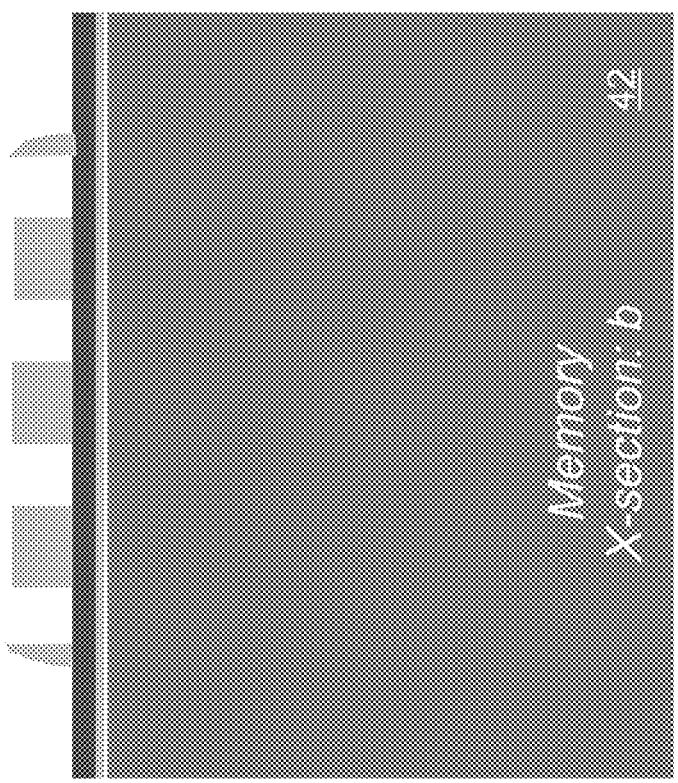
Figure 9C:
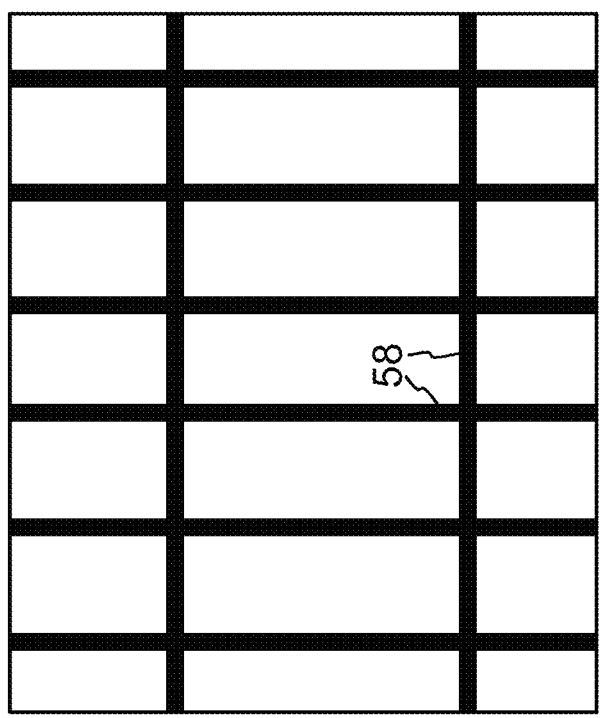
FIG. 9C is a top view of the memory area illustrating the vertically and horizontally extending fins of the substrate.

An oxide layer 54 is formed over the structure. This layer is conformal in the logic areas because the spacing between strips of hard mask material is greater than that in the memory area (in which the layer fills the space between hard mask material strips), as shown in FIGS. 7A and 7B. An anisotropic oxide etch follows, which leaves spacers on vertical sidewalls of hard mask strips. A carbon wet strip etch is used to remove the carbon hard mask material, as shown in FIGS. 8A and 8B. The spacing between two neighboring patterns in FIG. 6A in the memory area is preferably less than or equal to two times thickness of oxide layer 54 in order to form the merged spacers as shown in FIG. 8A. Photoresist is formed over the structures and patterned to leave strips of photoresist covering alternating oxide spacers/blocks in the Memory Area and possibly some of the oxide spacers in the logic area. An oxide etch is then used to remove those oxide spacers left exposed by photoresist. After photoresist removal, one or more etches are then performed to remove those portions of nitride 48, oxide 46 and upper portions of substrate 42 that are not underneath the oxide spacers, which results in the formation of trenches 56 that extend into the substrate, leaving thin fin structures 58 of the substrate 42 between adjacent trenches 56. Fins 58 extend in both the vertical/column and horizontal/row directions in the memory area. The resulting structures are shown in FIGS. 9A-9B (after removal of the oxide spacers). FIG. 9C shows a top view of the memory area, where fins 58 extend in the row and column directions in a grid pattern (i.e., the vertically extending fins which have lengths extending in the column direction intersect with the horizontally extending fins which have lengths extending in the row direction in a grid like manner). In the memory area, the final width of each fin 58 can be approximately 10-50 nm.

Figure 10B:
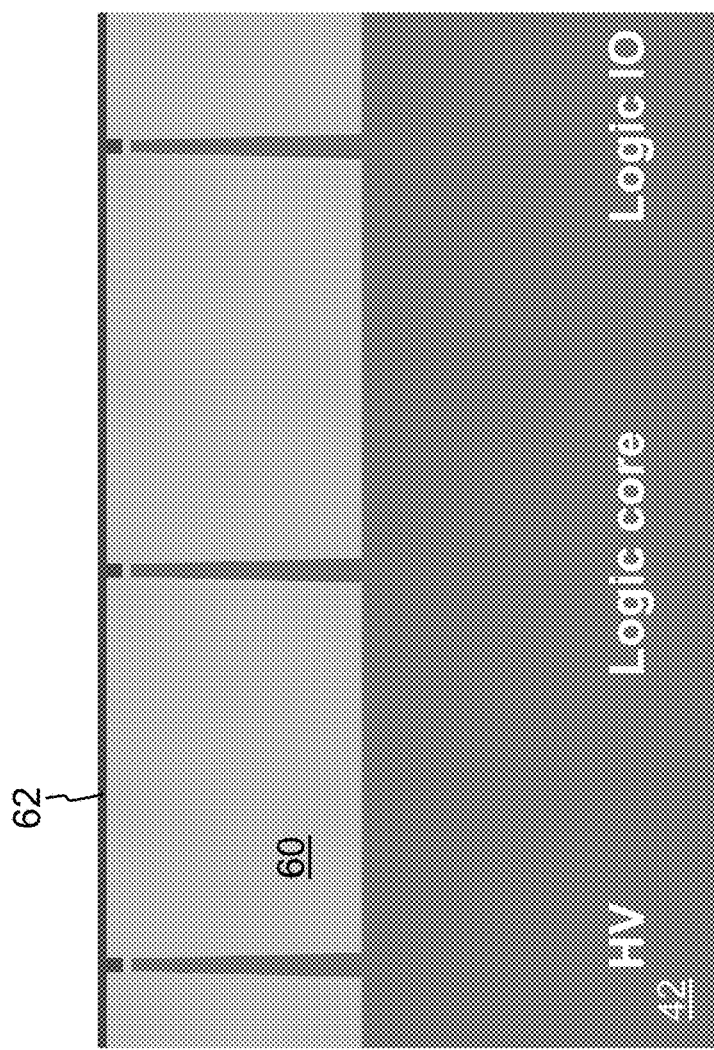
Figure 10A:
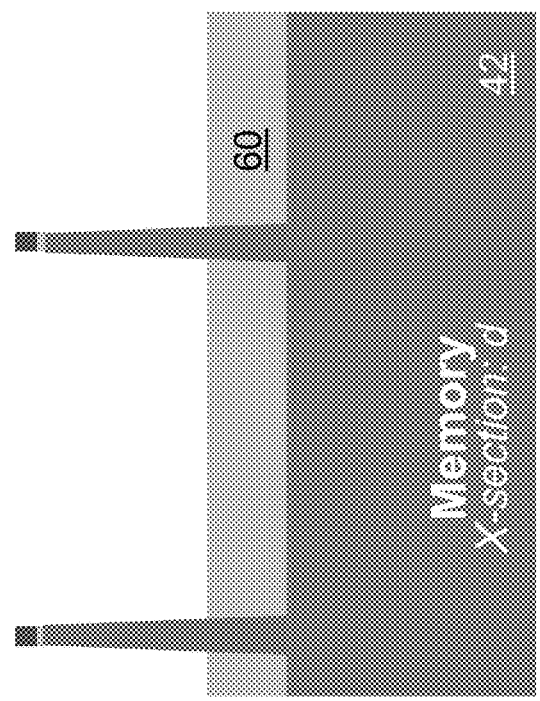
Figure 11A:
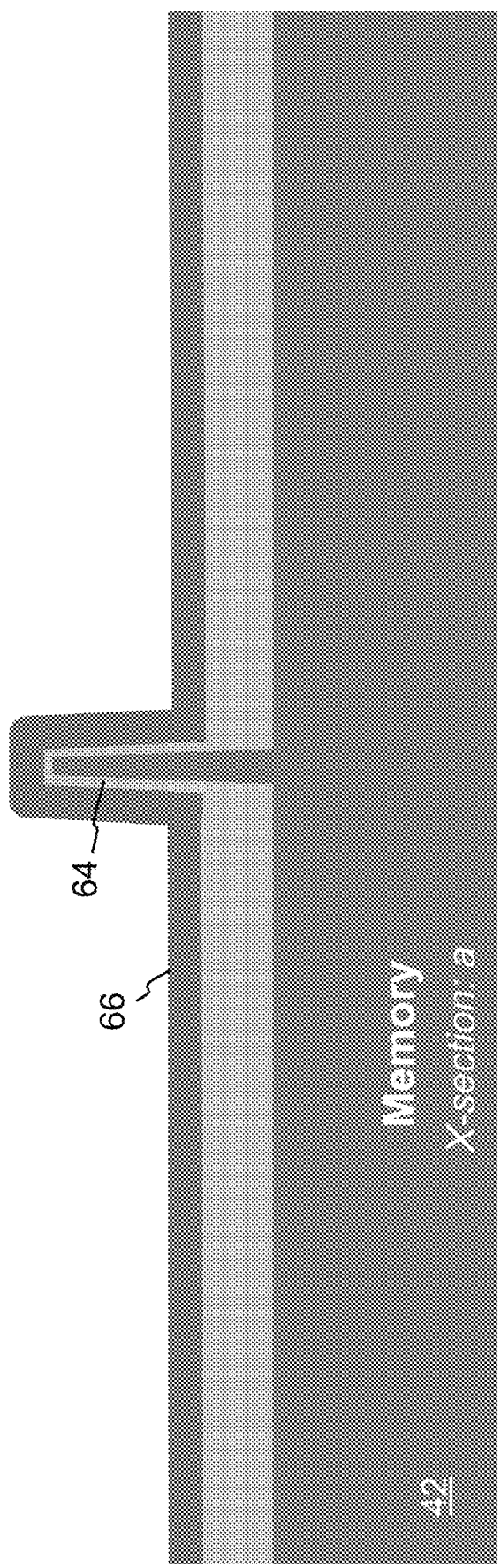
Figure 11B:
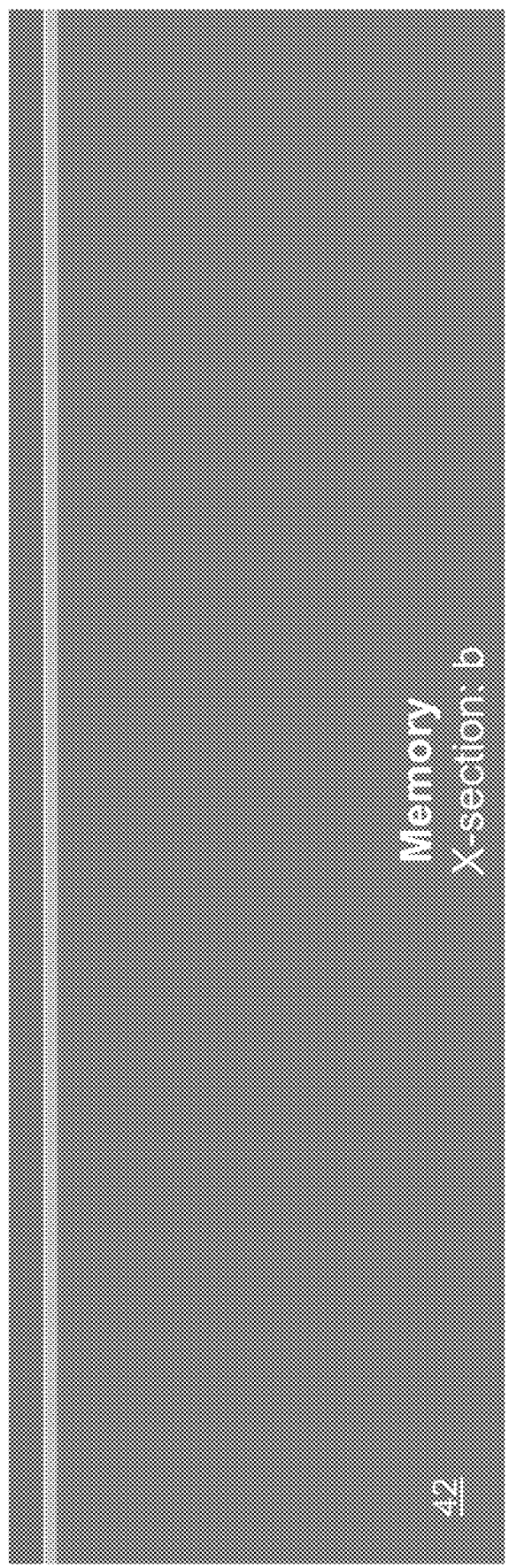
Figure 12A:
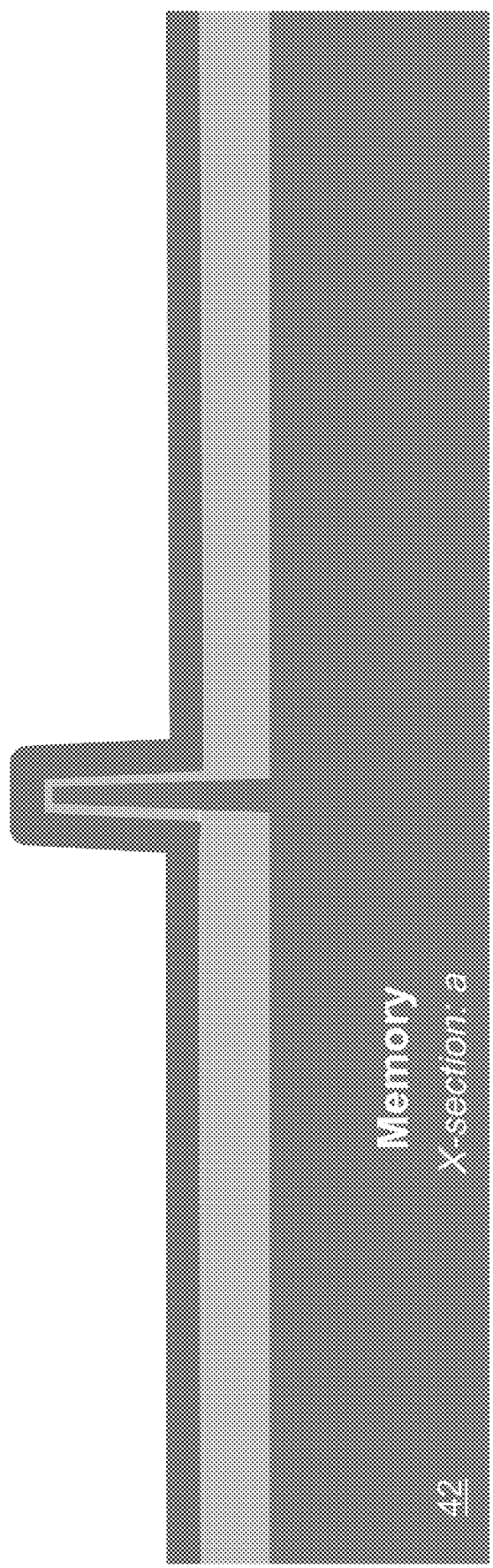
Figure 12B:
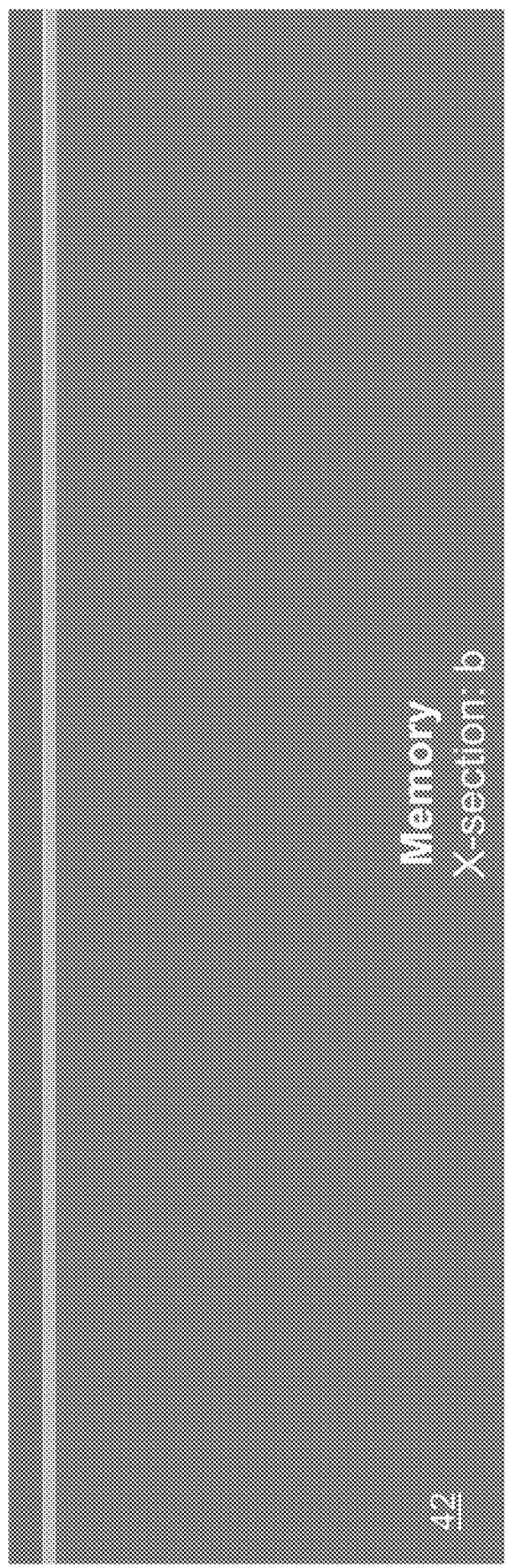
Figure 12C:
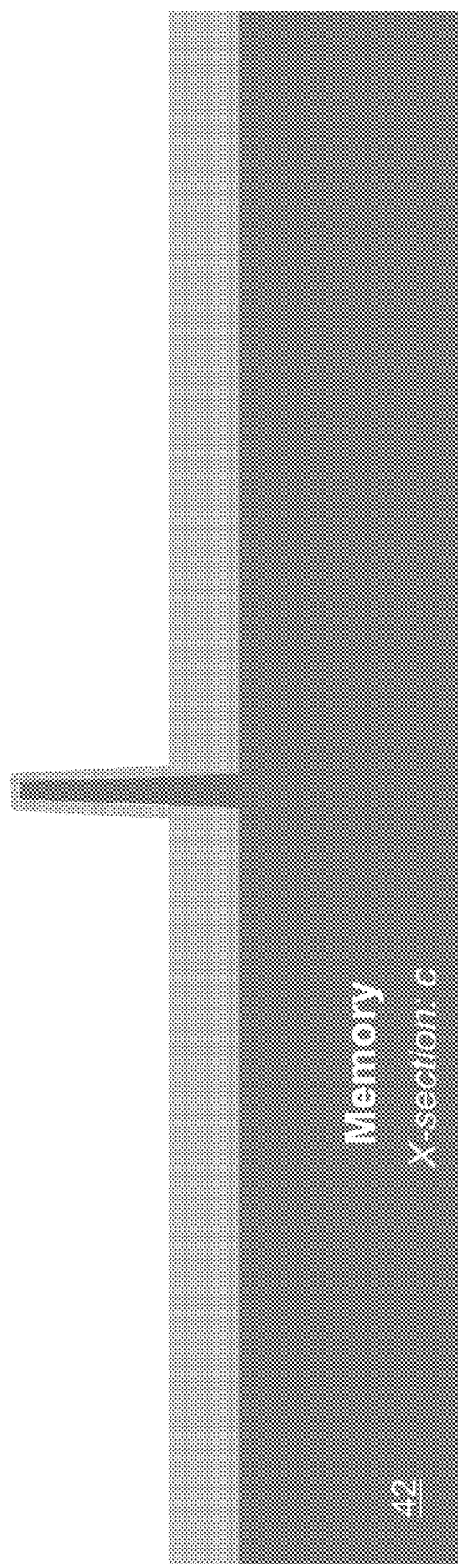
Figure 13A:
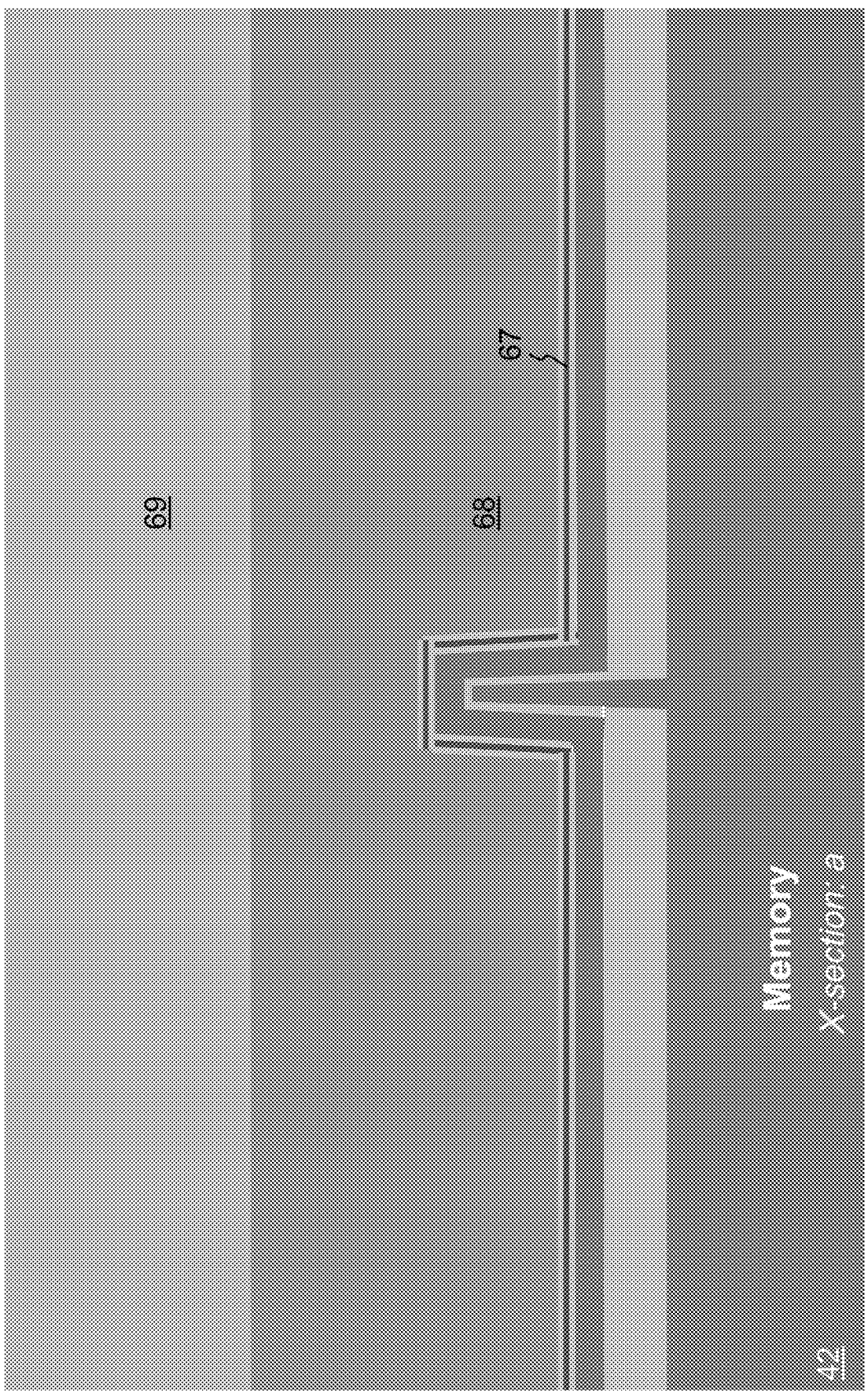
Figure 13B:
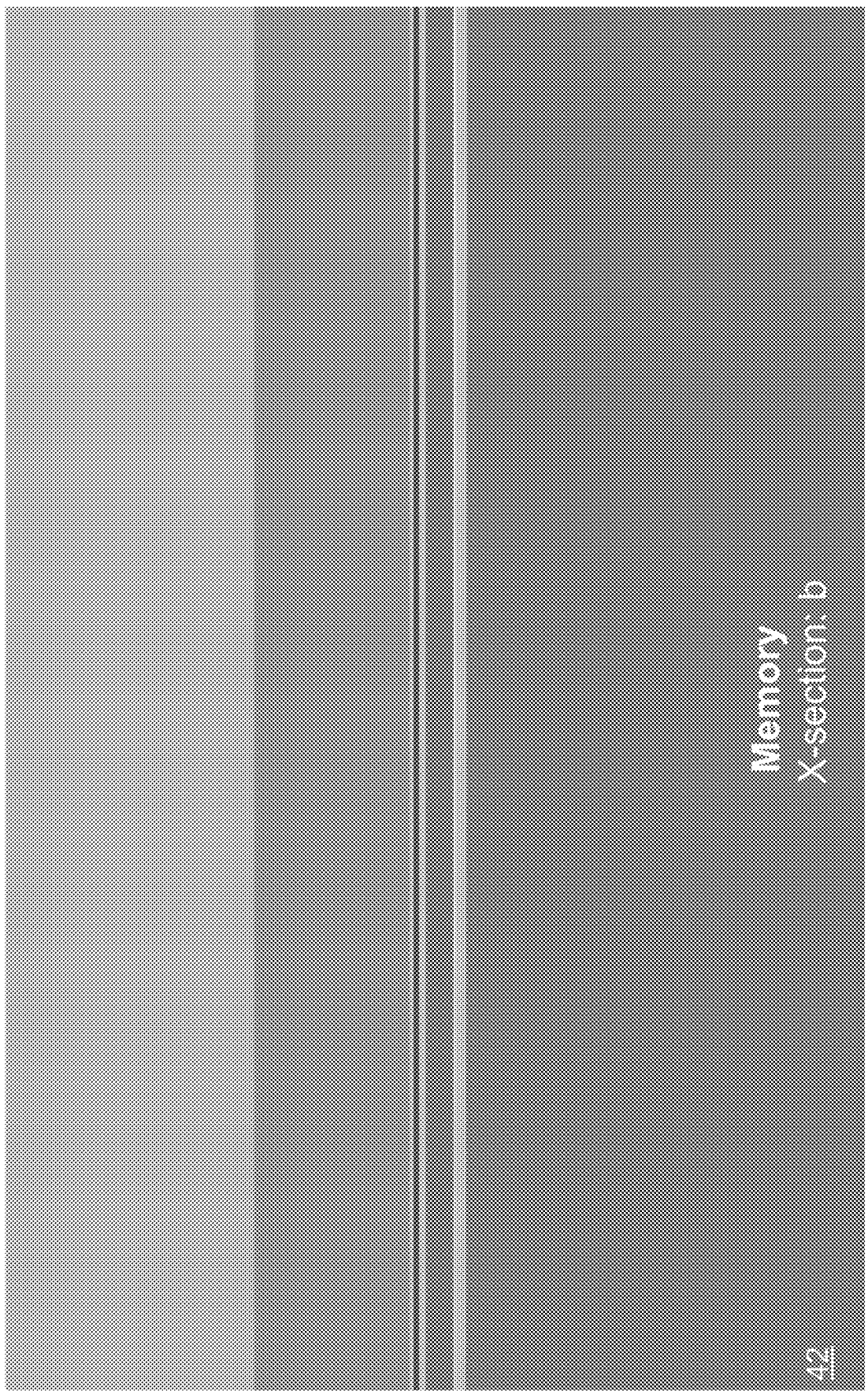
Figure 13C:
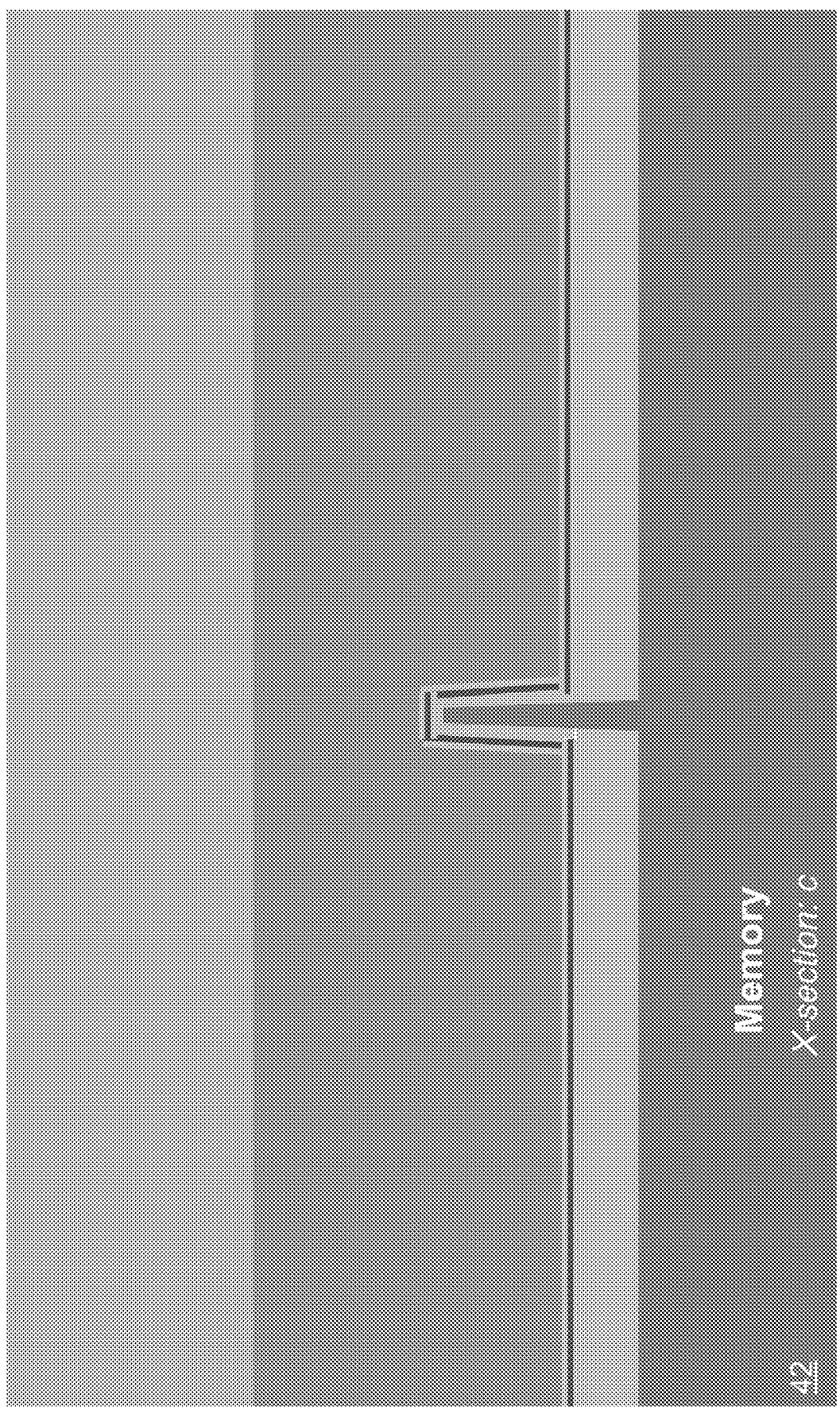
Figure 13E:
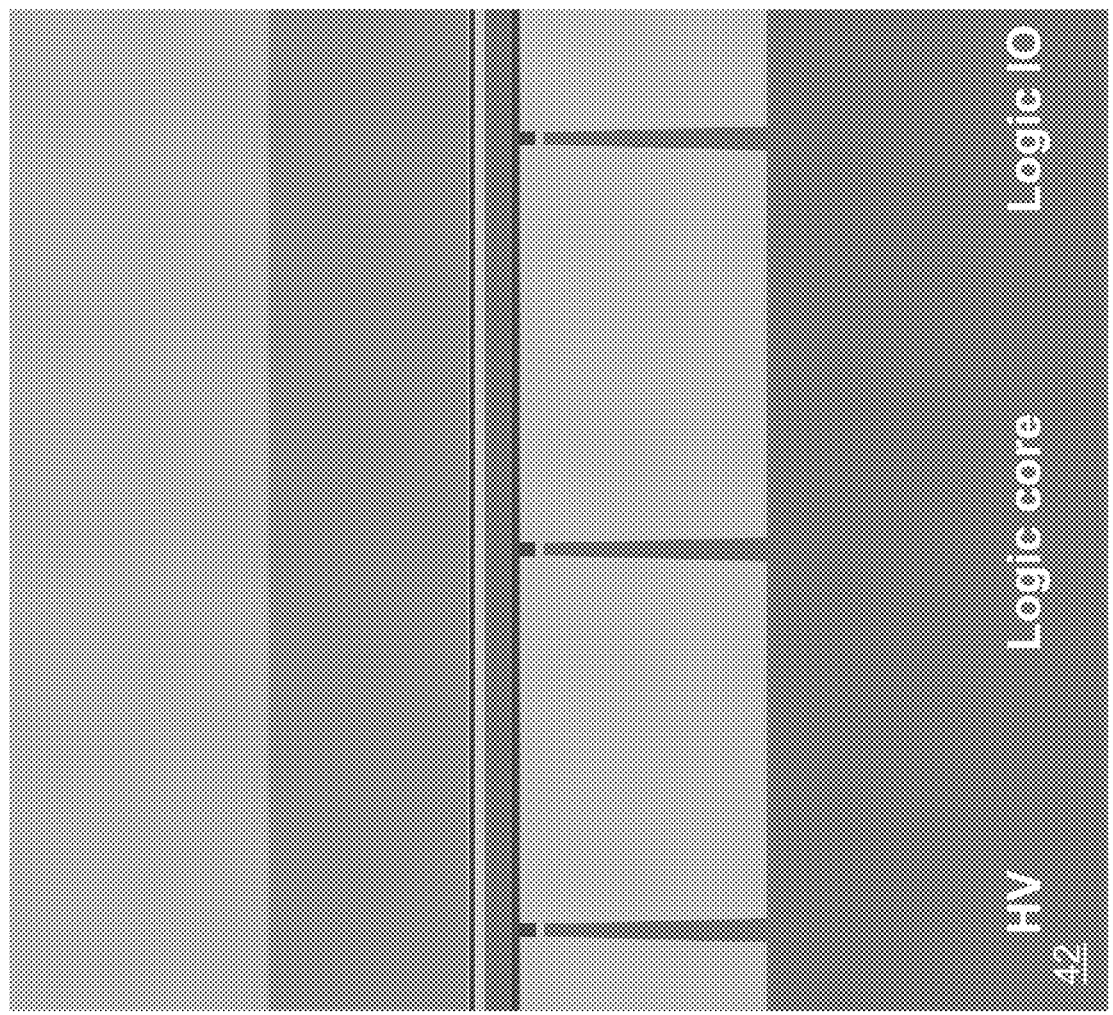
Figure 13D:
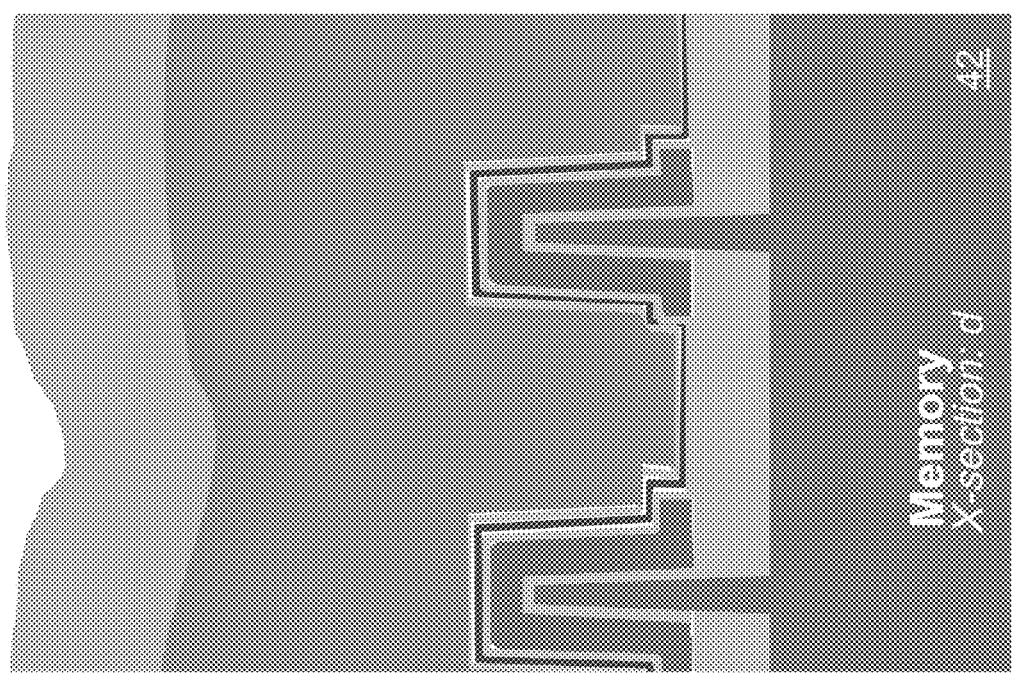
Figure 14A:
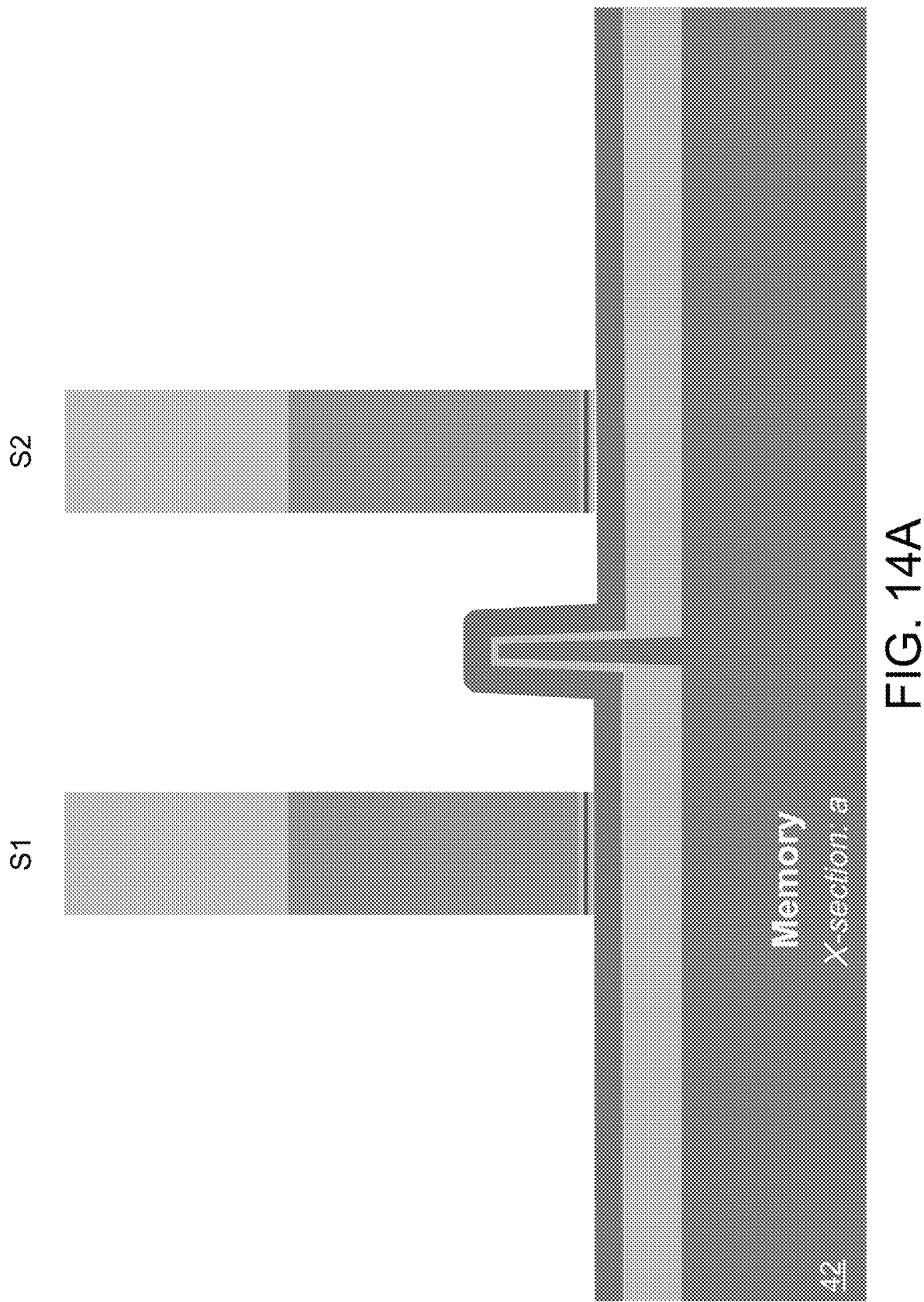
Figure 14B:
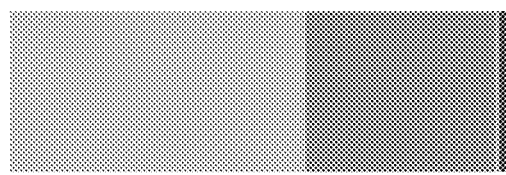
Figure 14B:
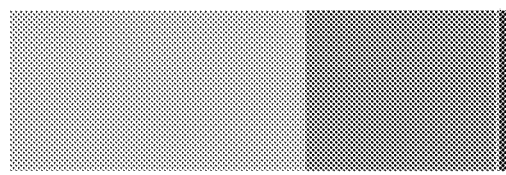
Figure 14B:
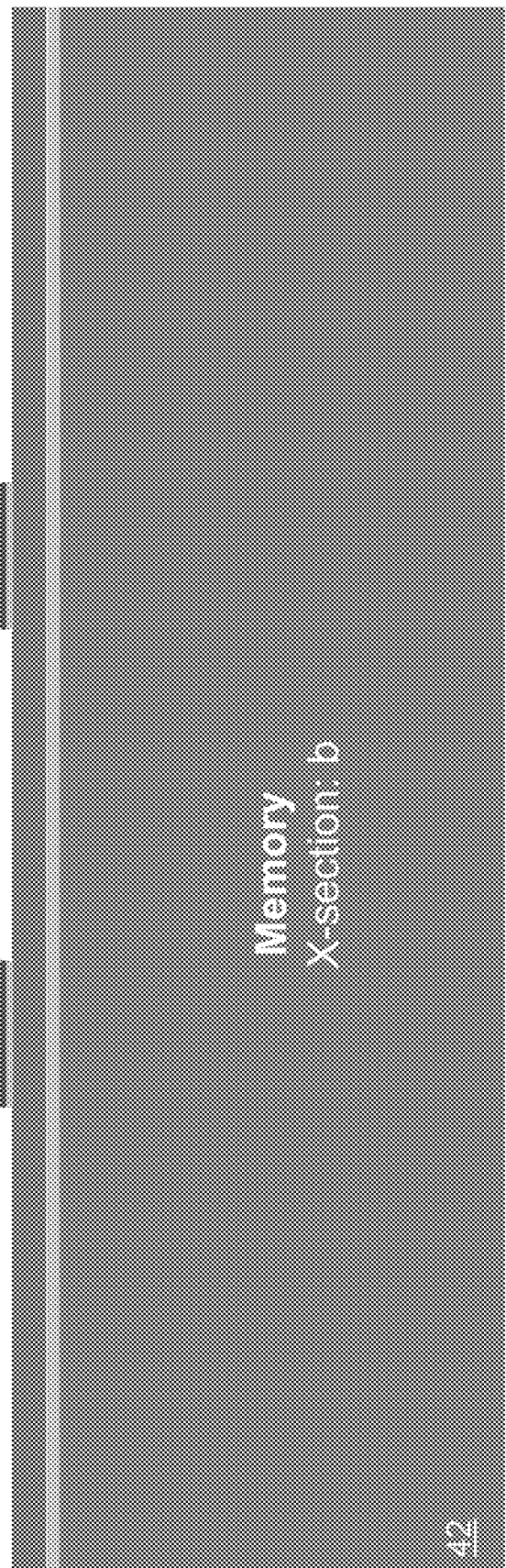
Figure 14C:
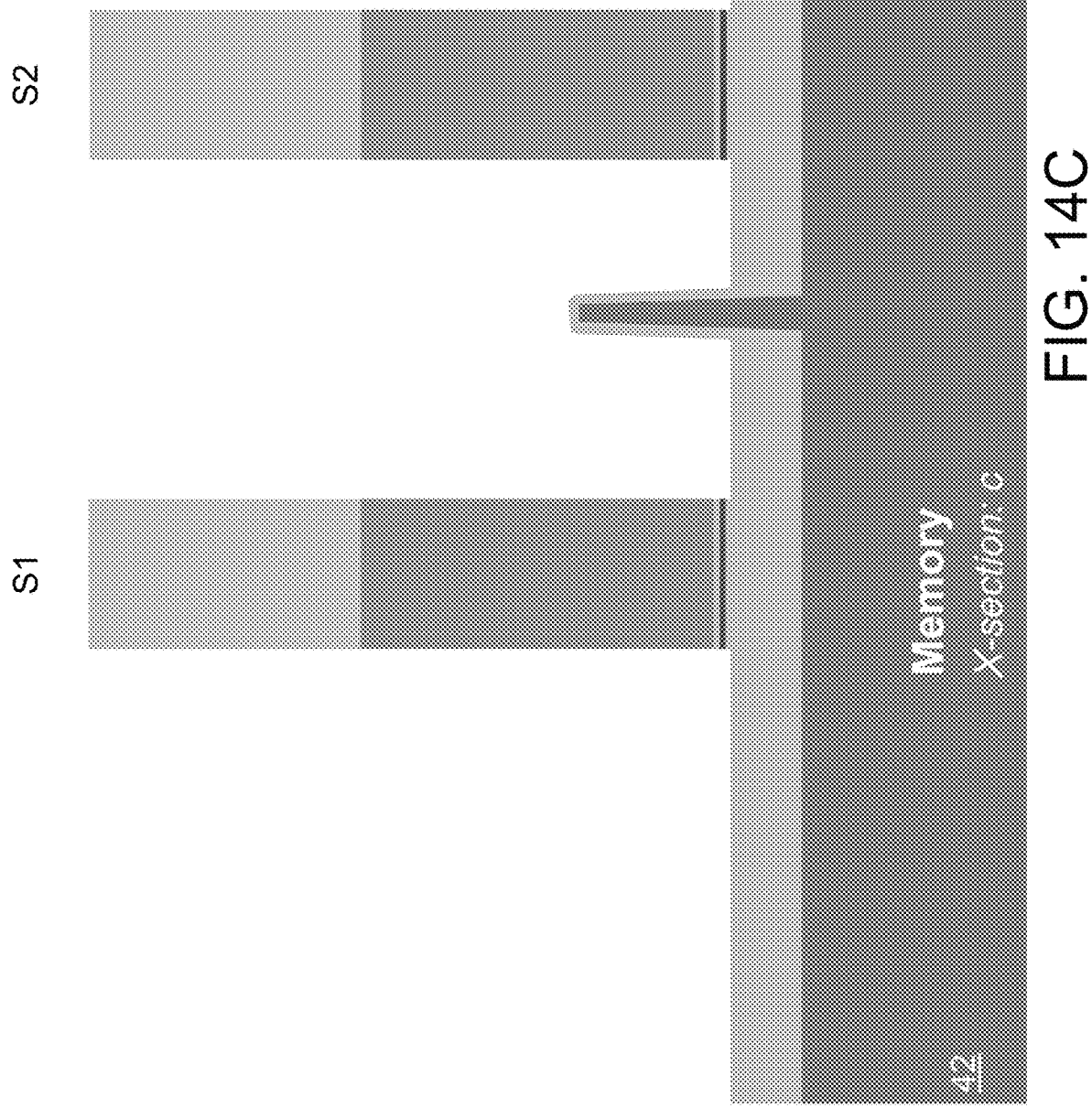
Figure 14E:
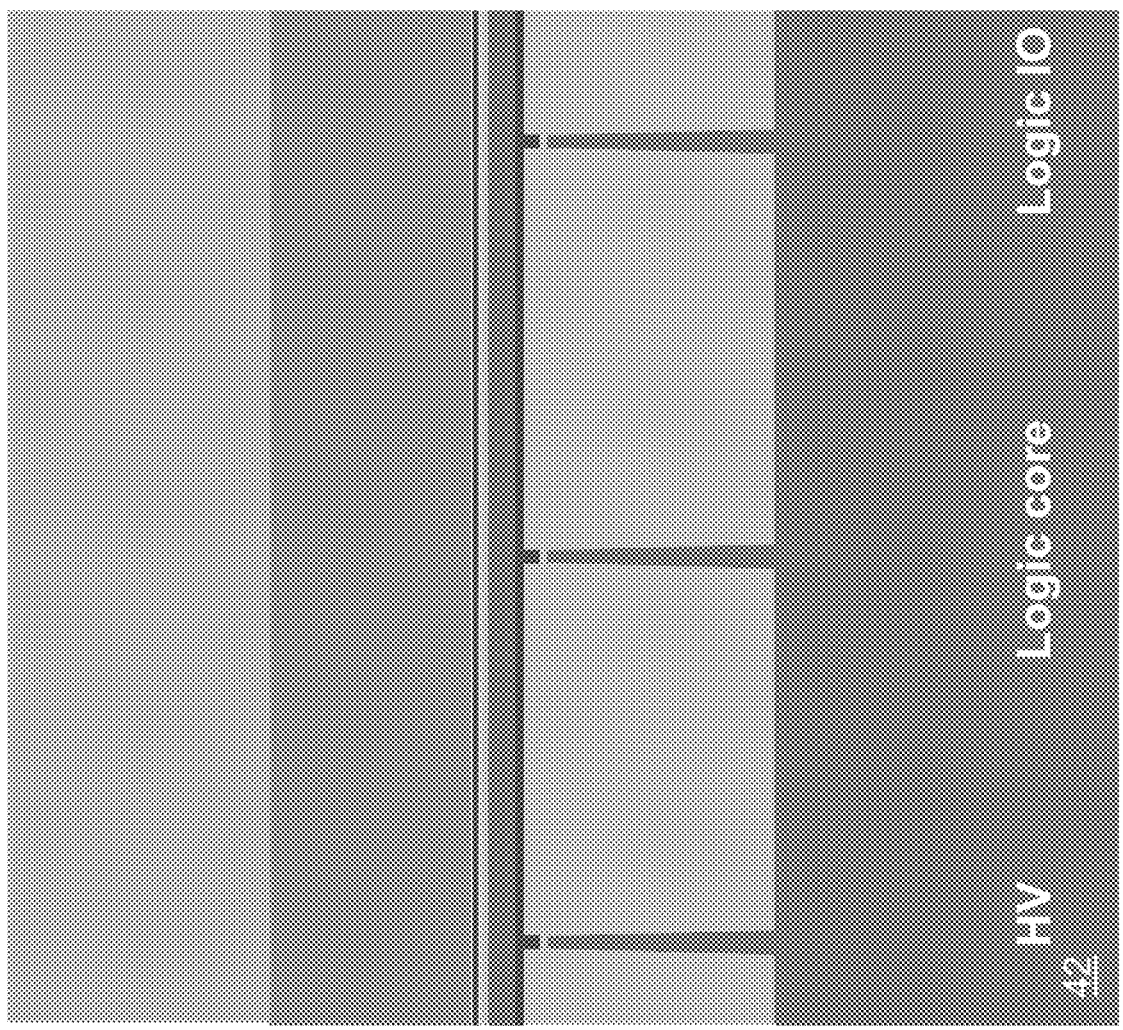
Figure 14D:
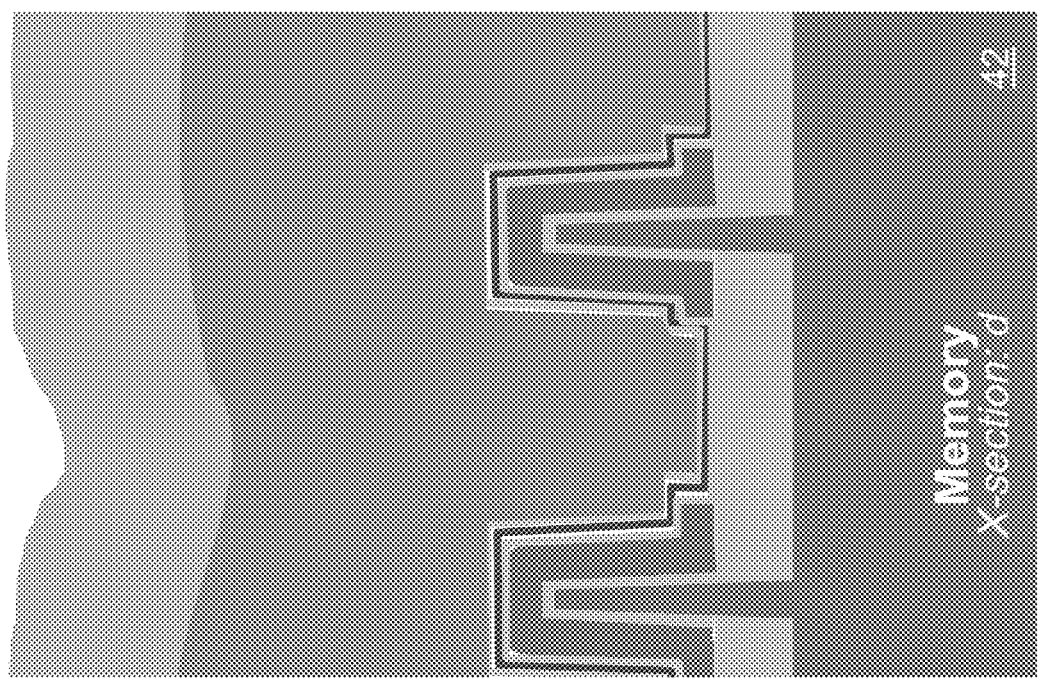
Figure 15A:
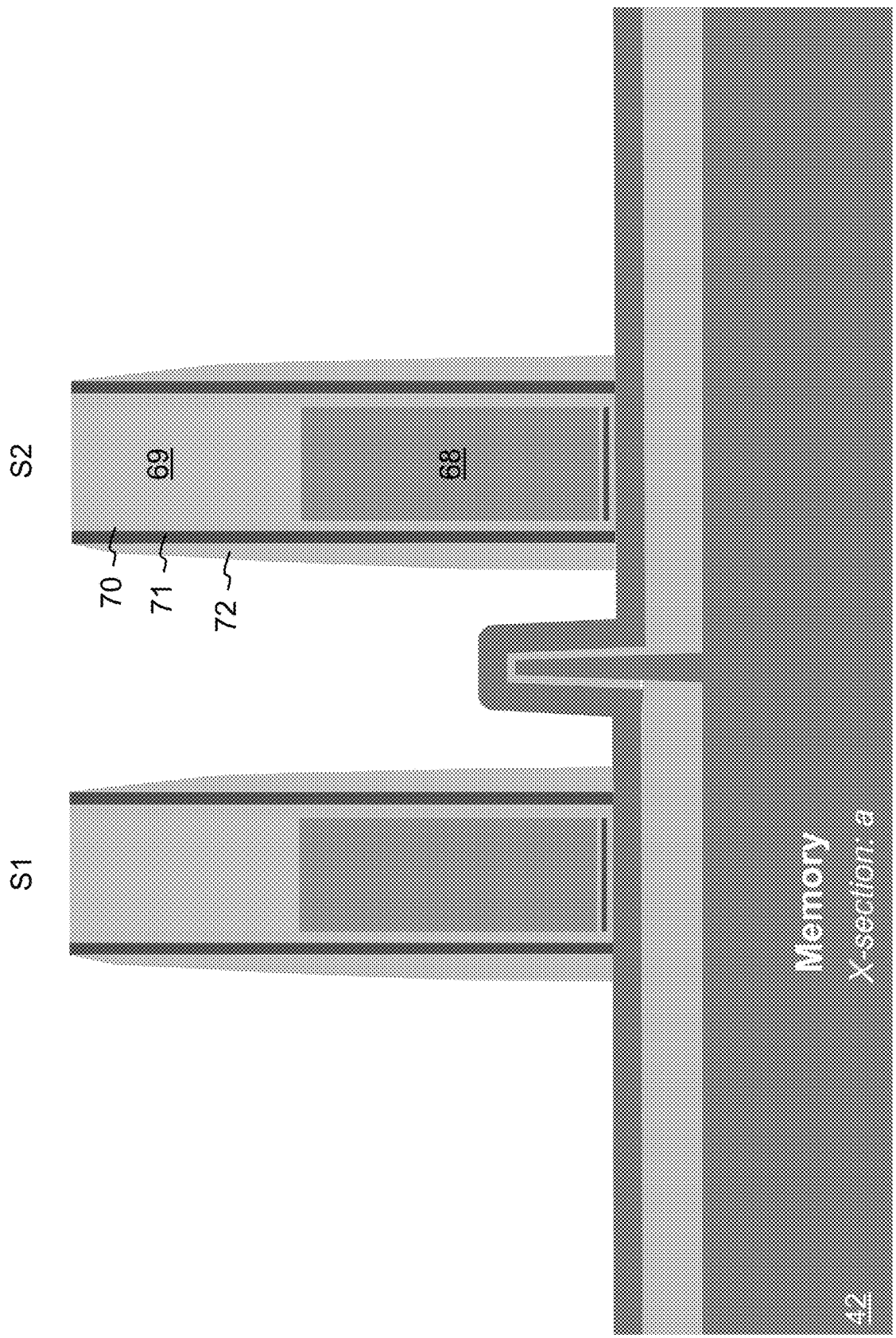
Figure 15B:
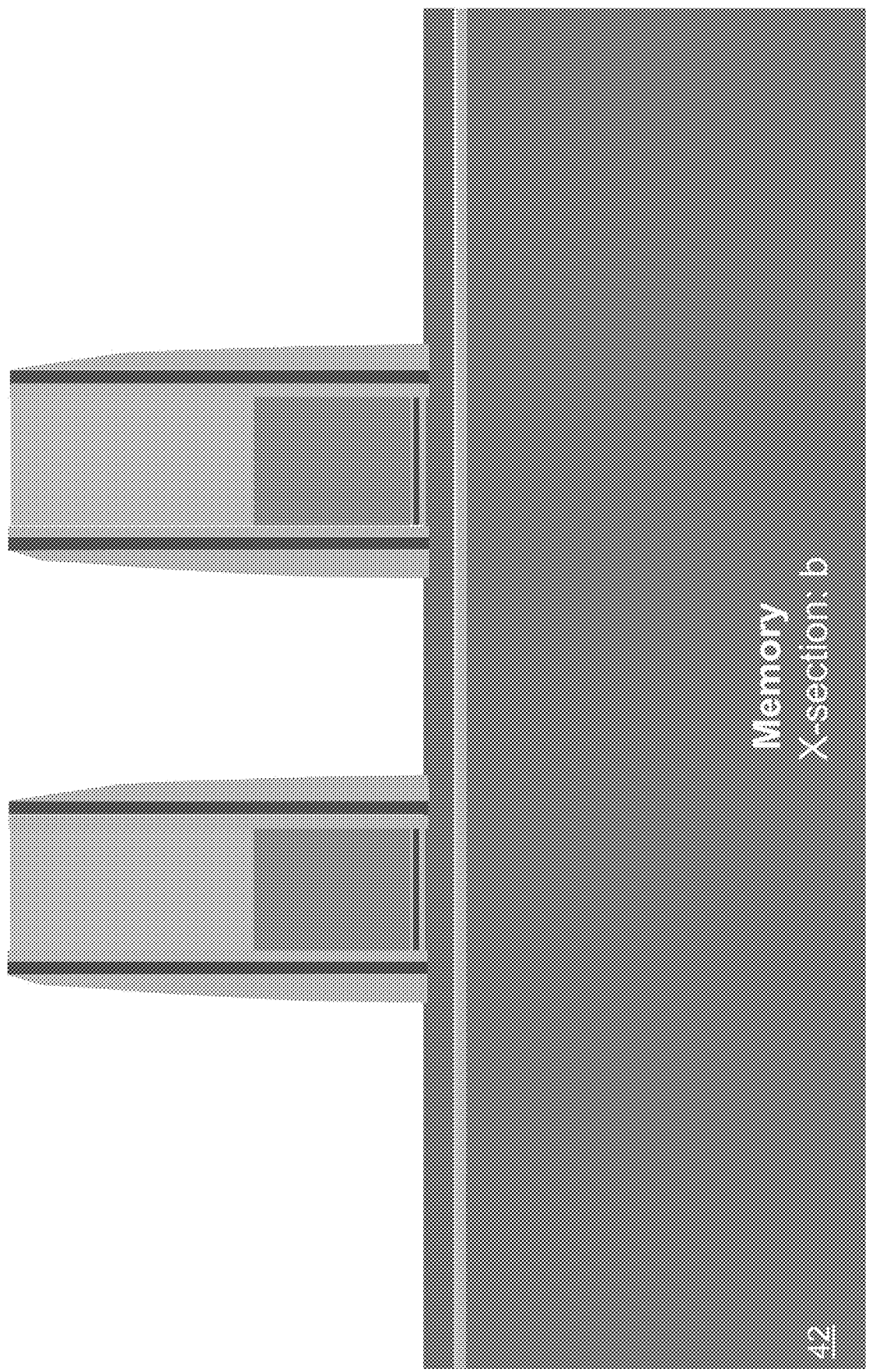
Figure 15C:
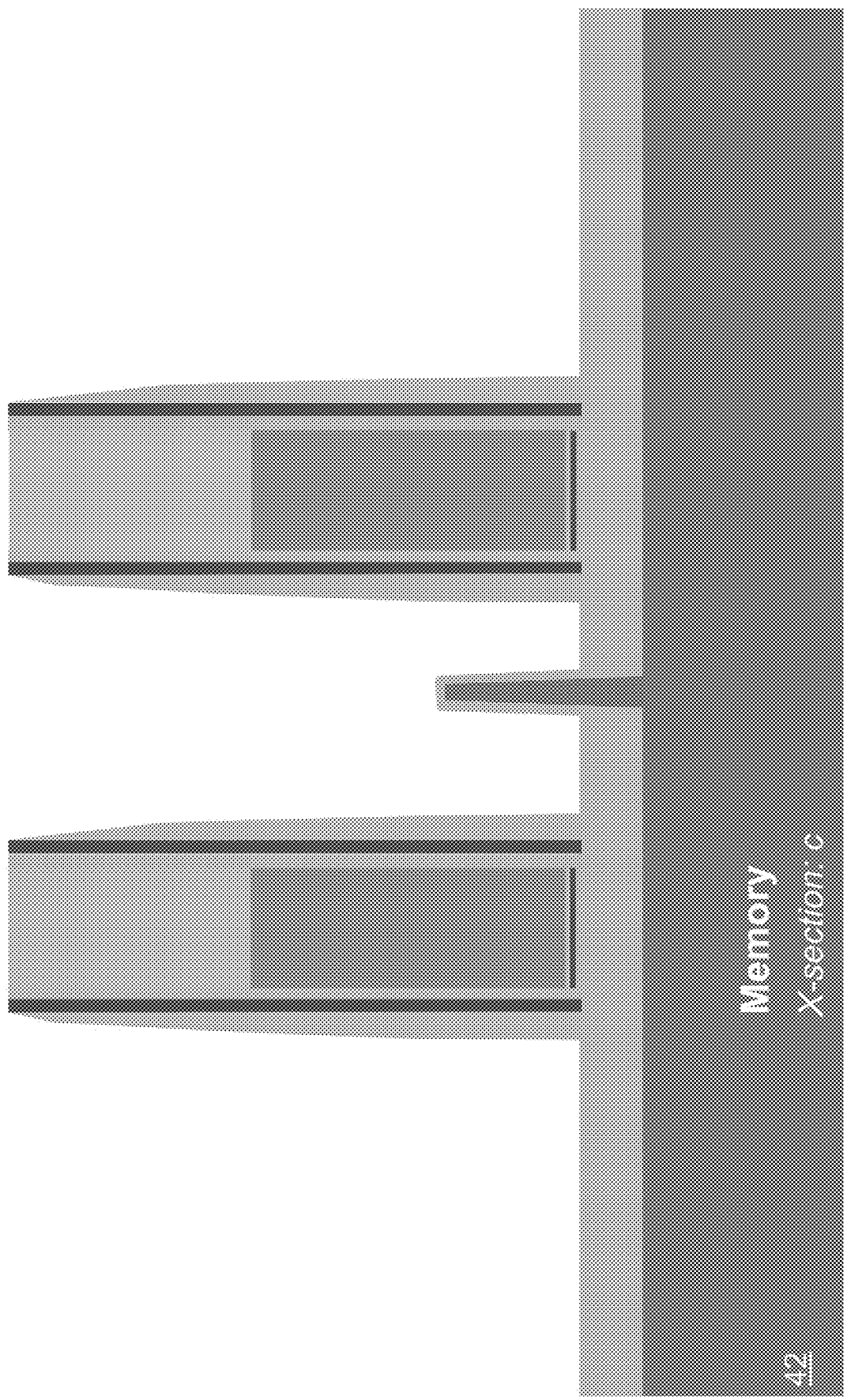
Figure 15E:
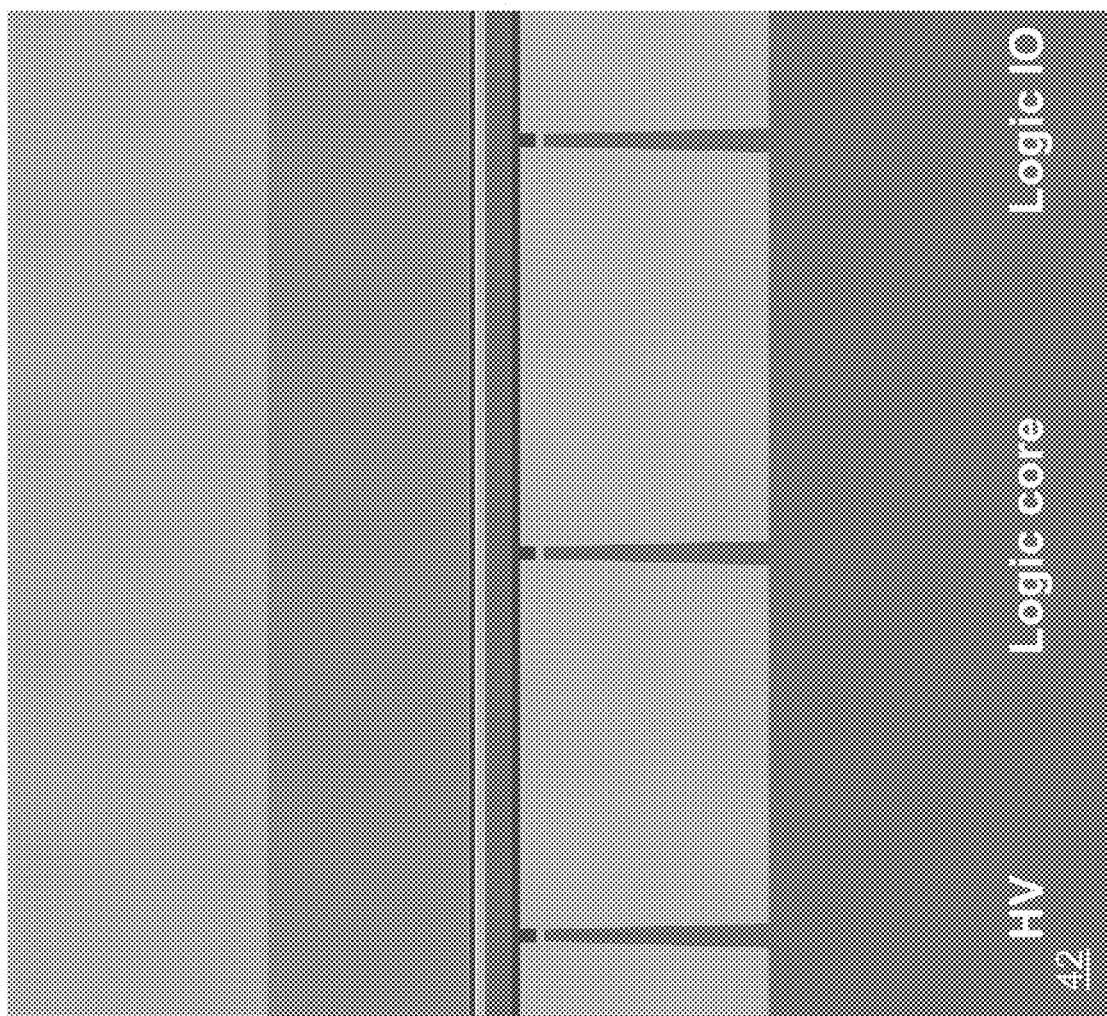
Figure 15D:
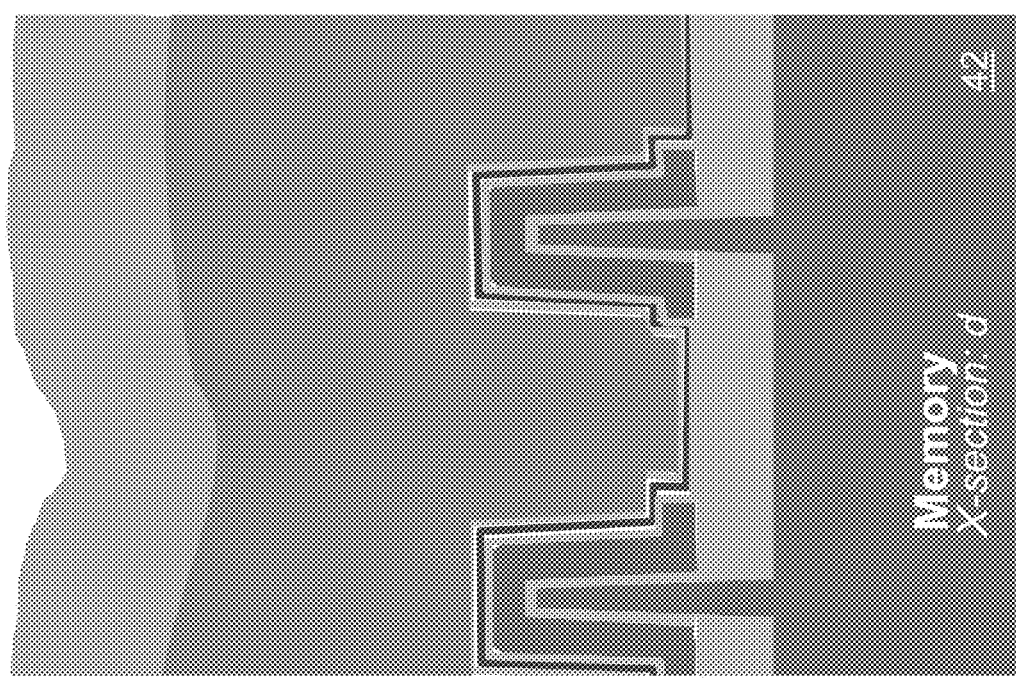
Figure 16A:
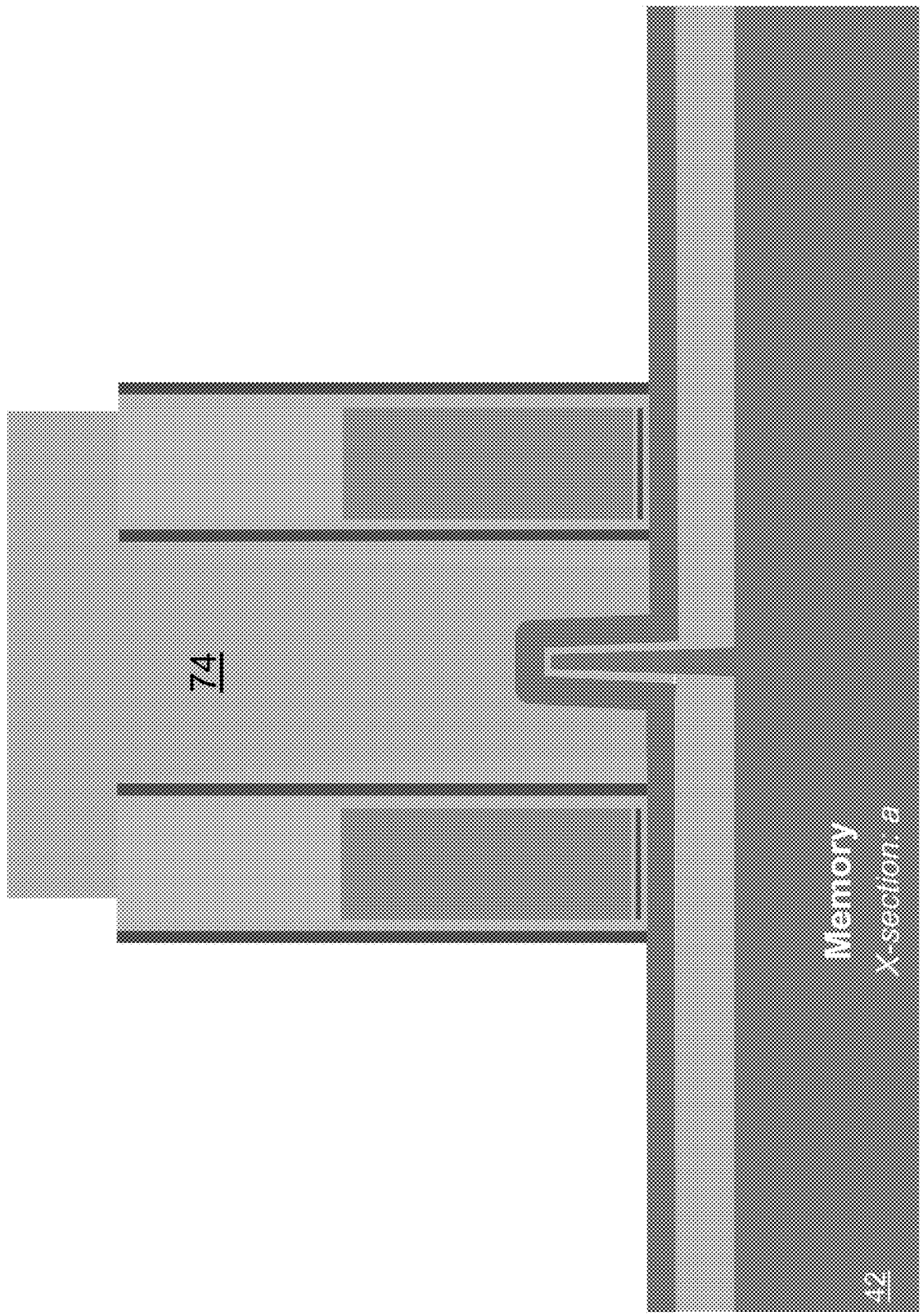
Figure 16B:
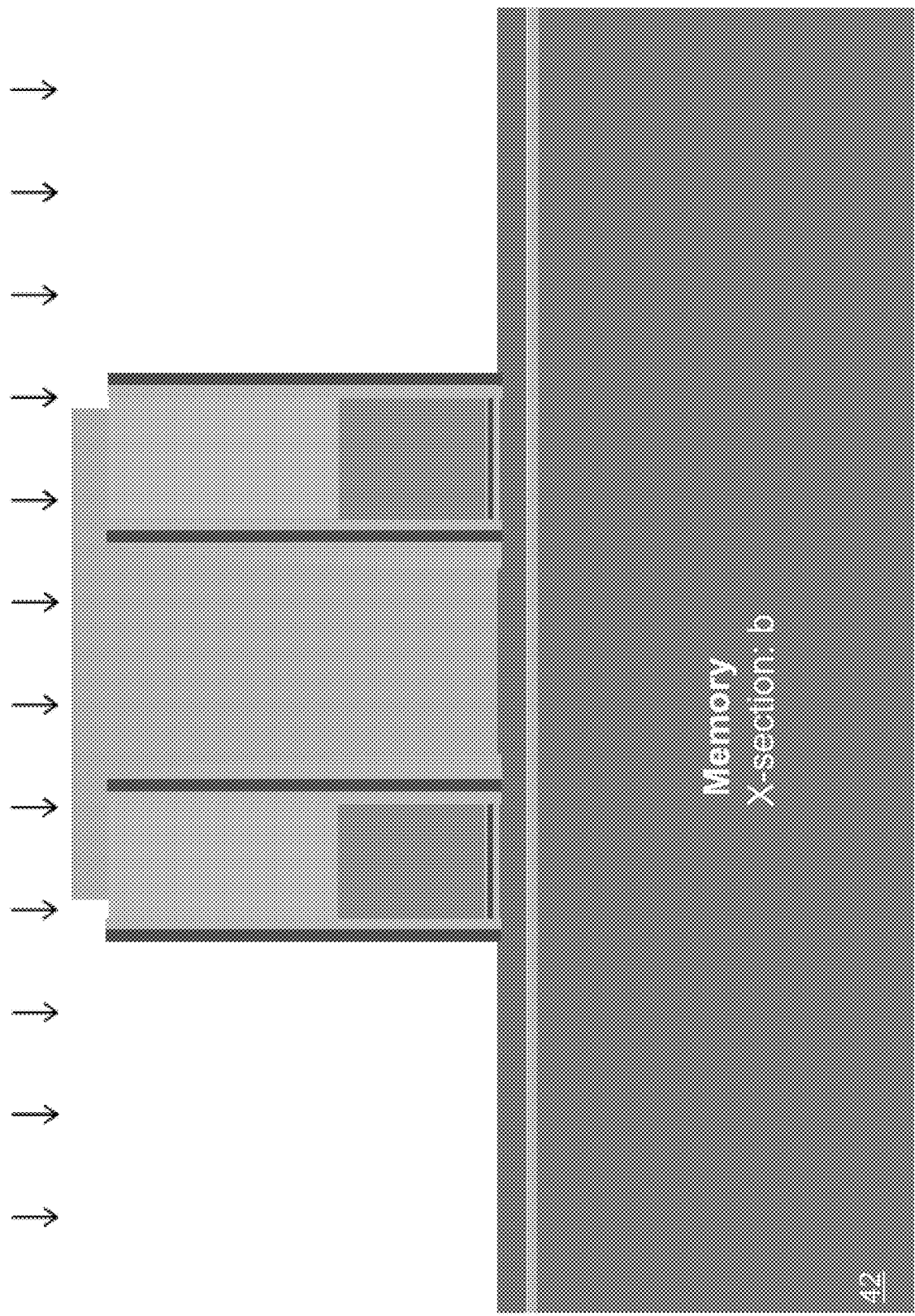
Figure 16C:
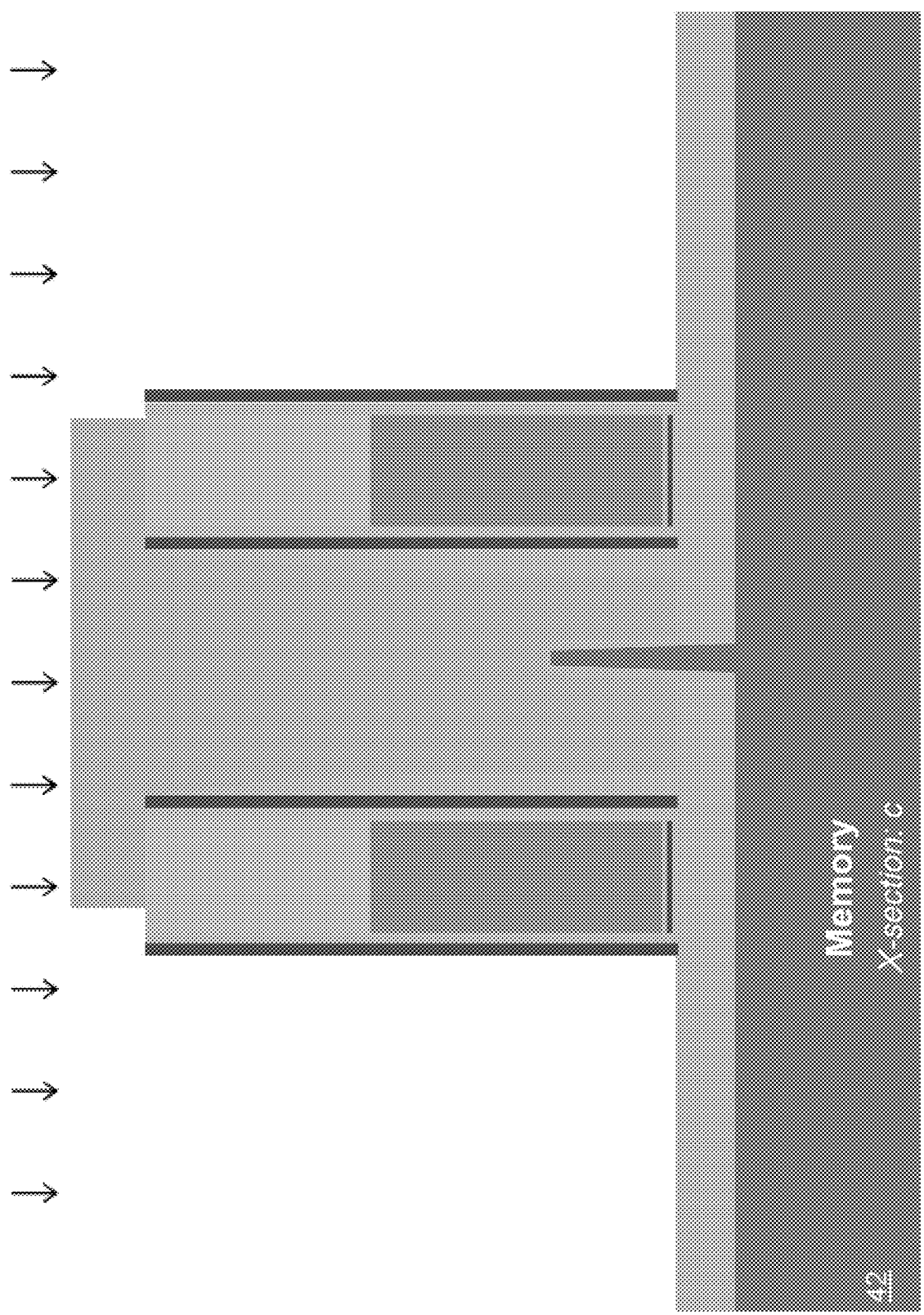
Figure 16E:
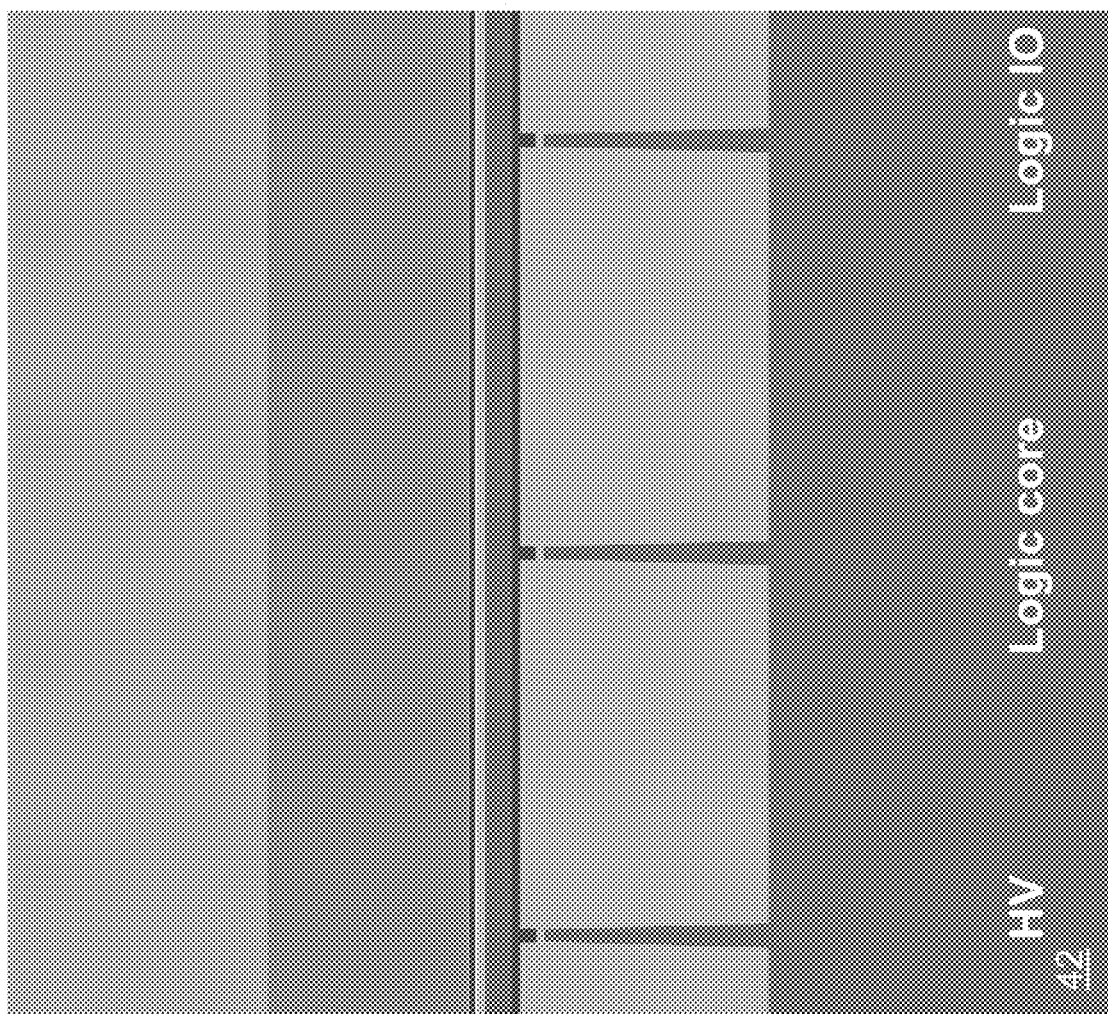
Figure 16D:
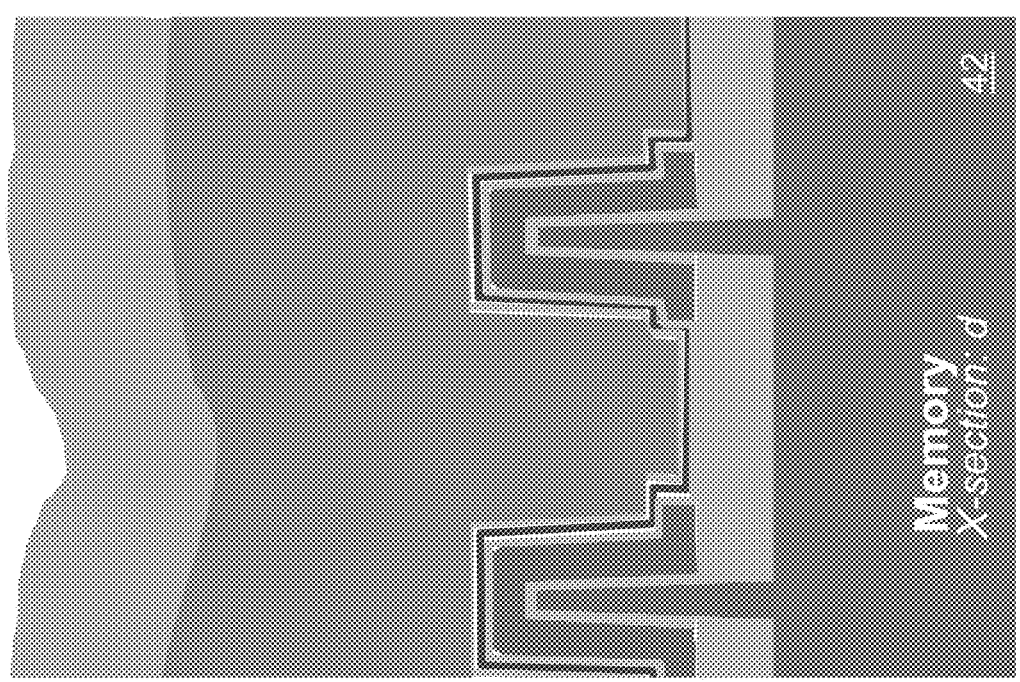
Figure 17B:
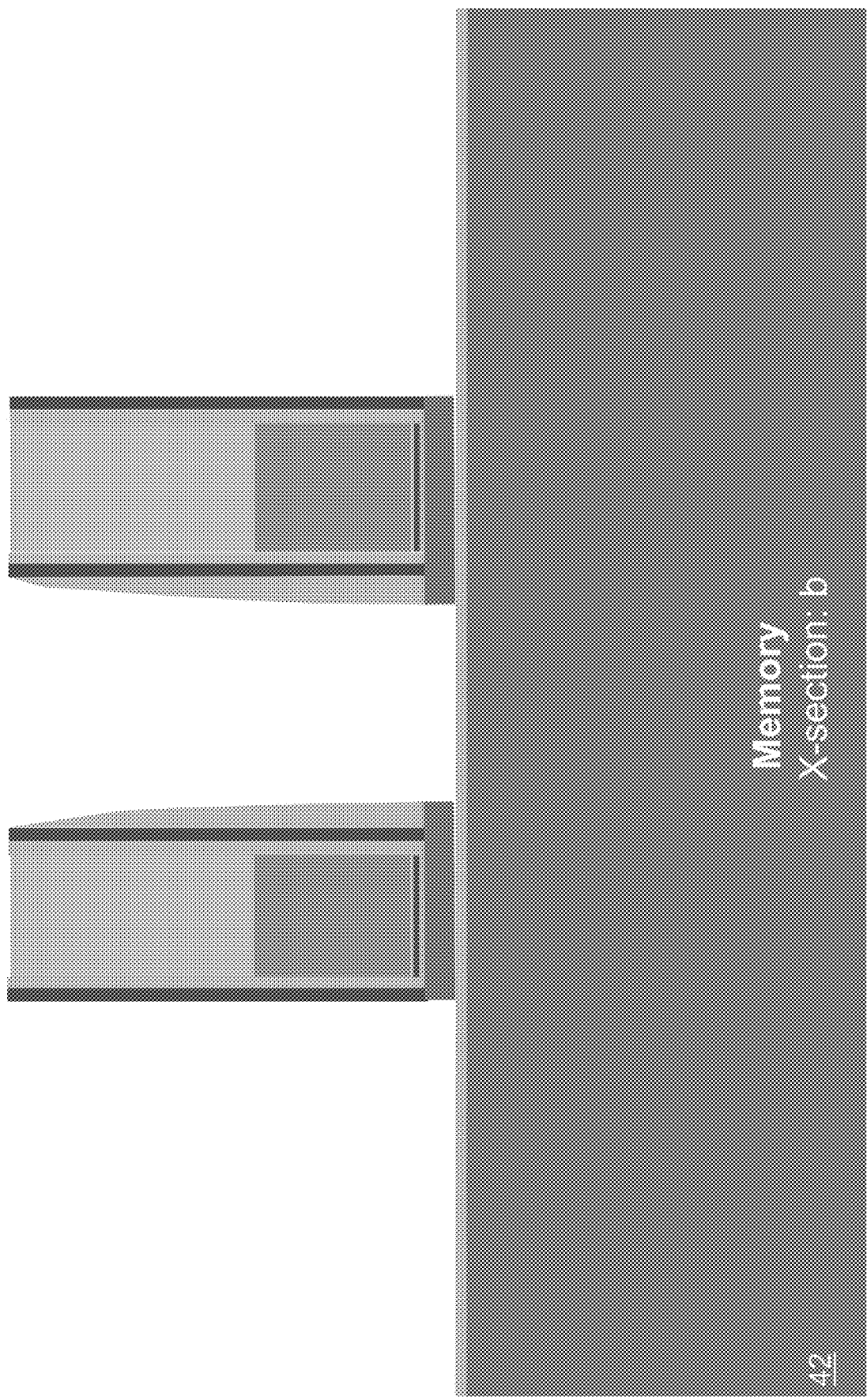
Figure 17C:
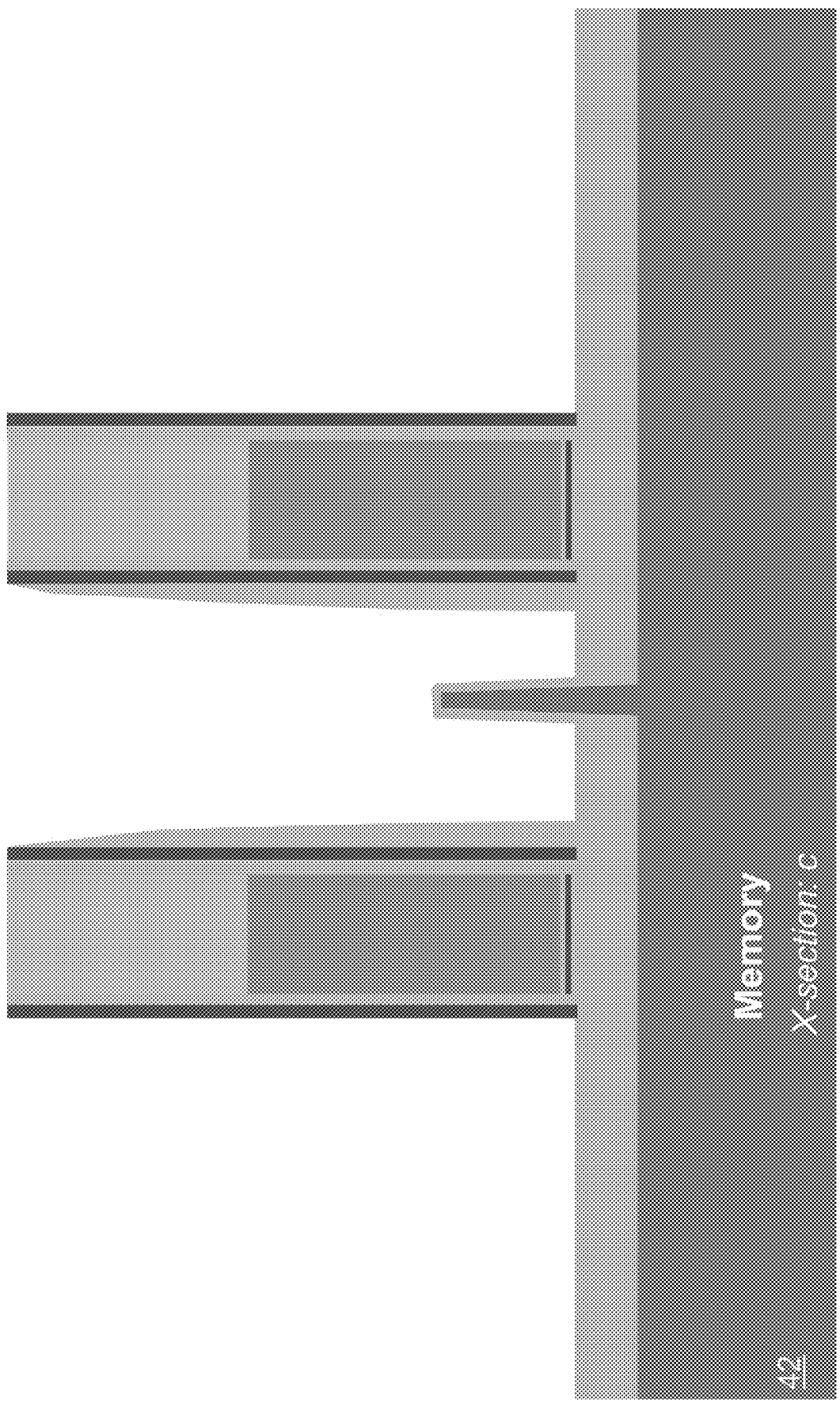
Figure 17E:
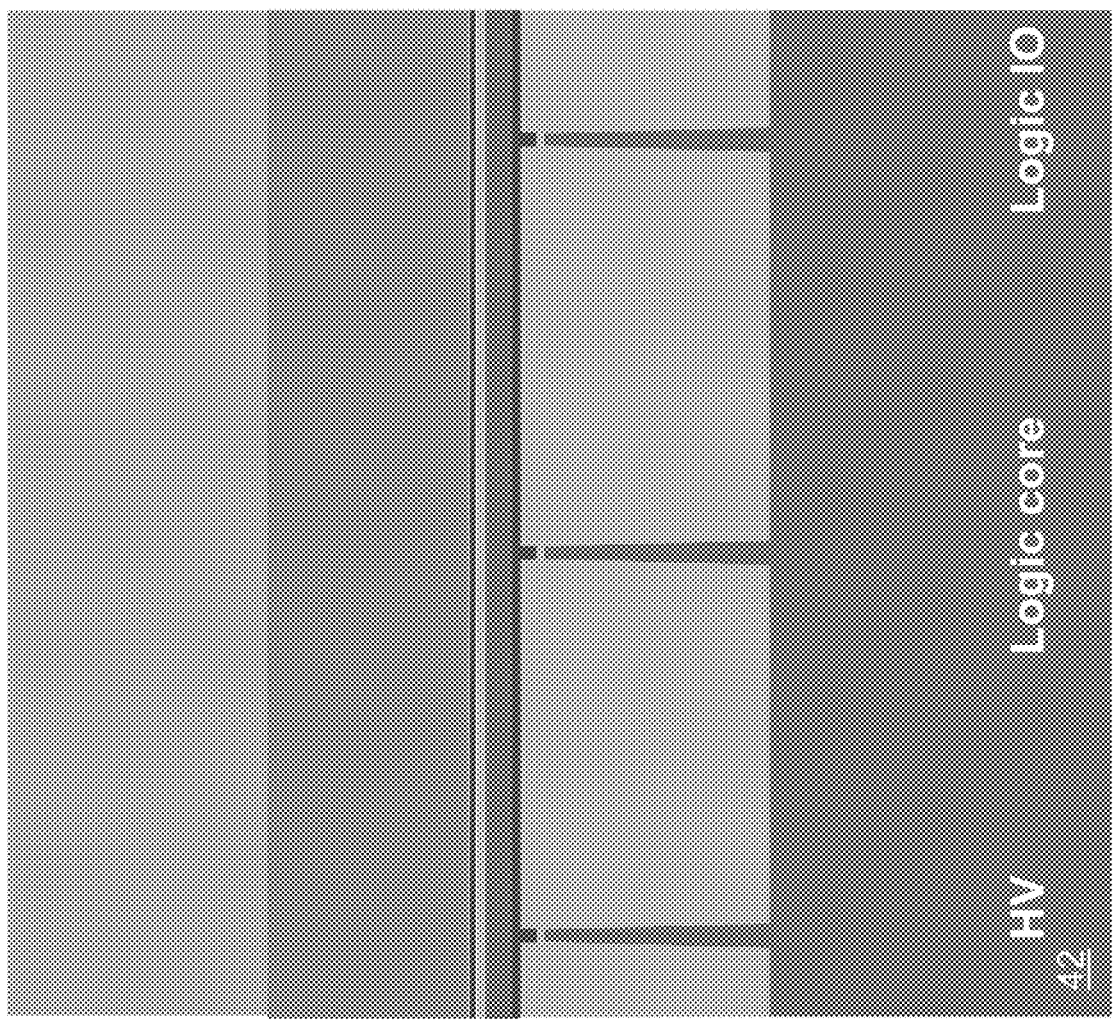
Figure 17D:
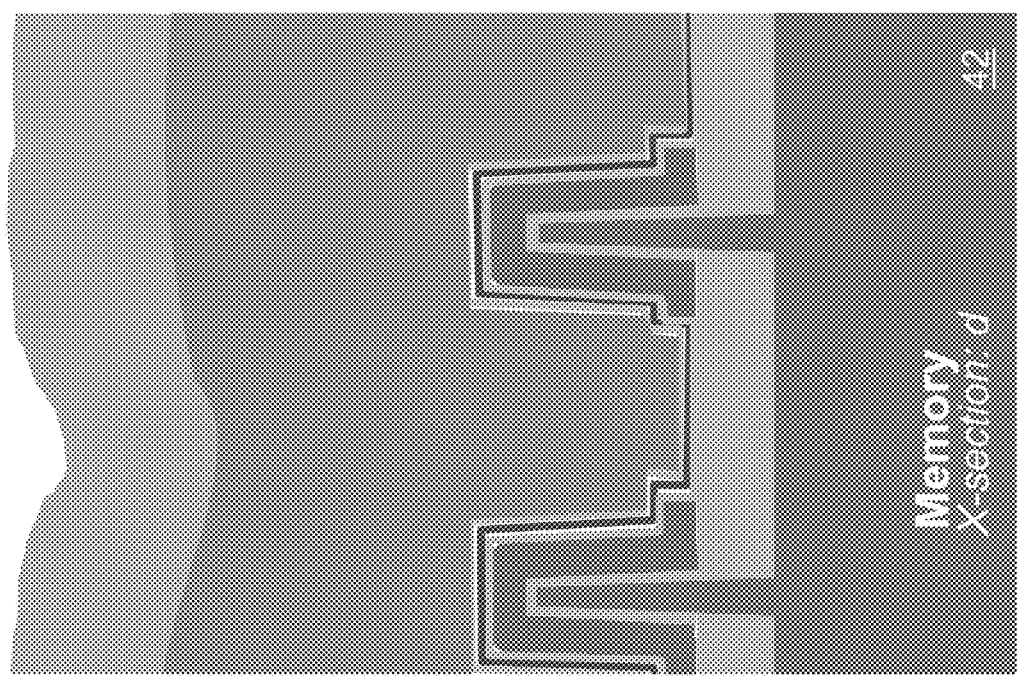
Figure 18A:
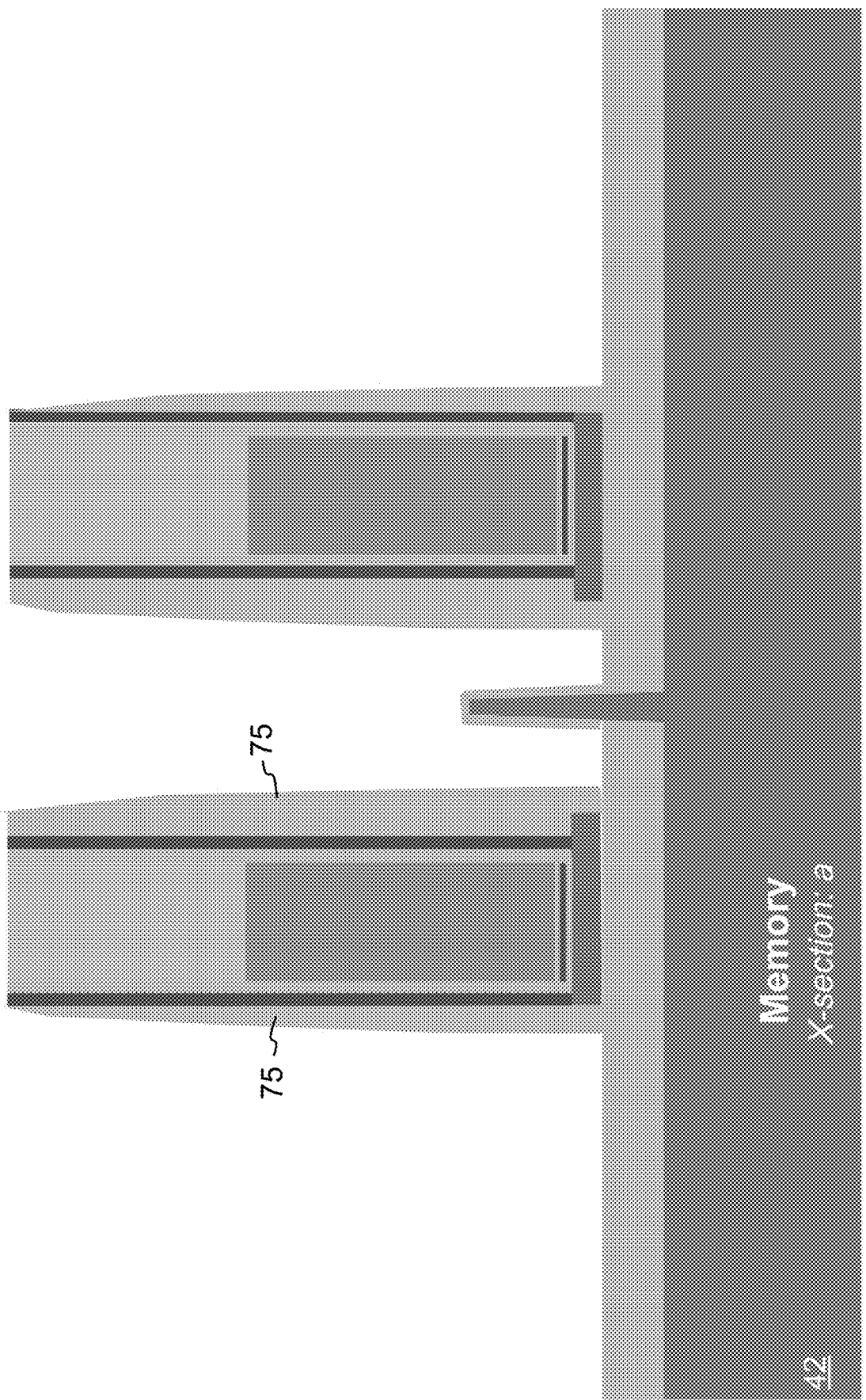
Figure 18B:
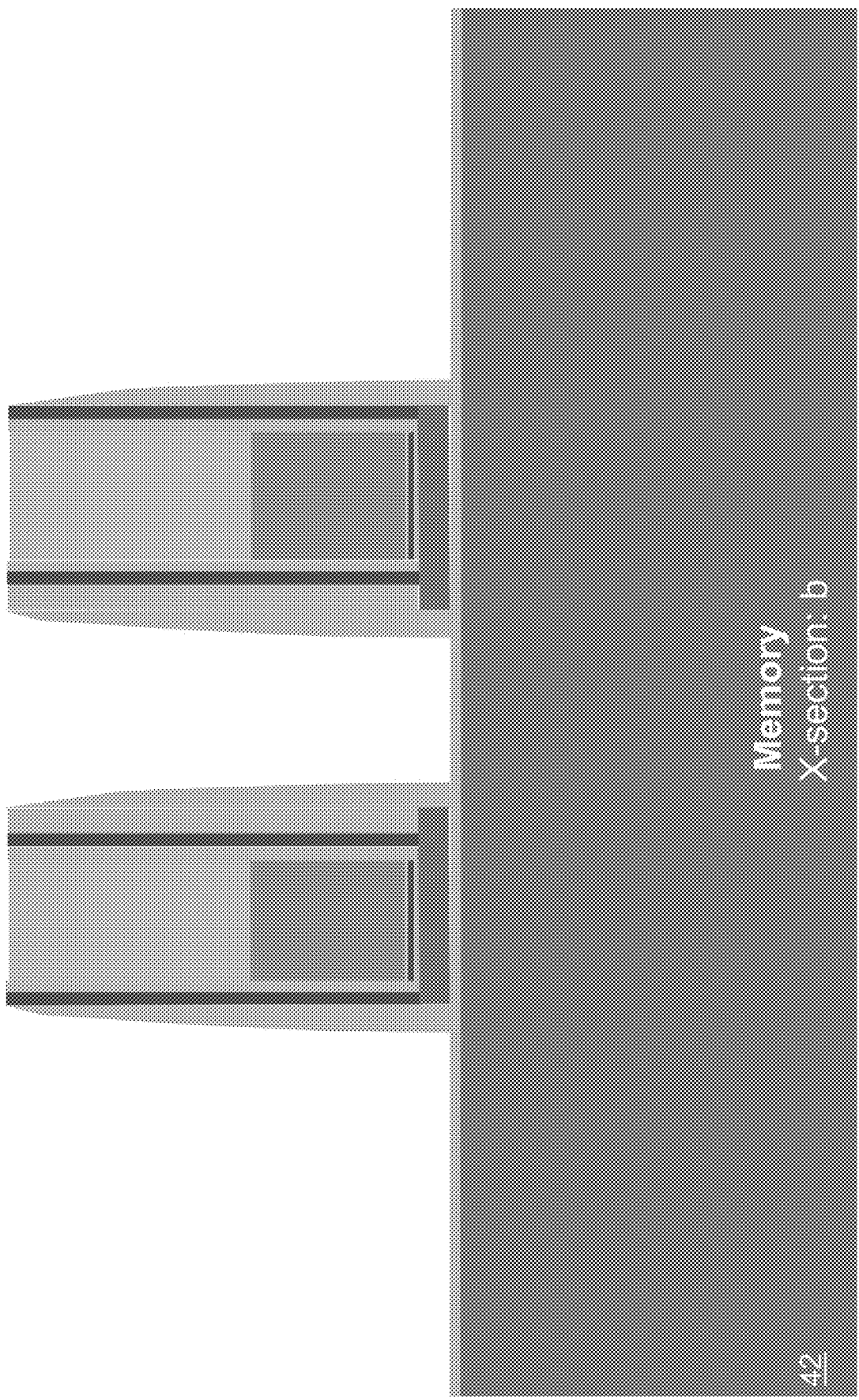
Figure 18C:
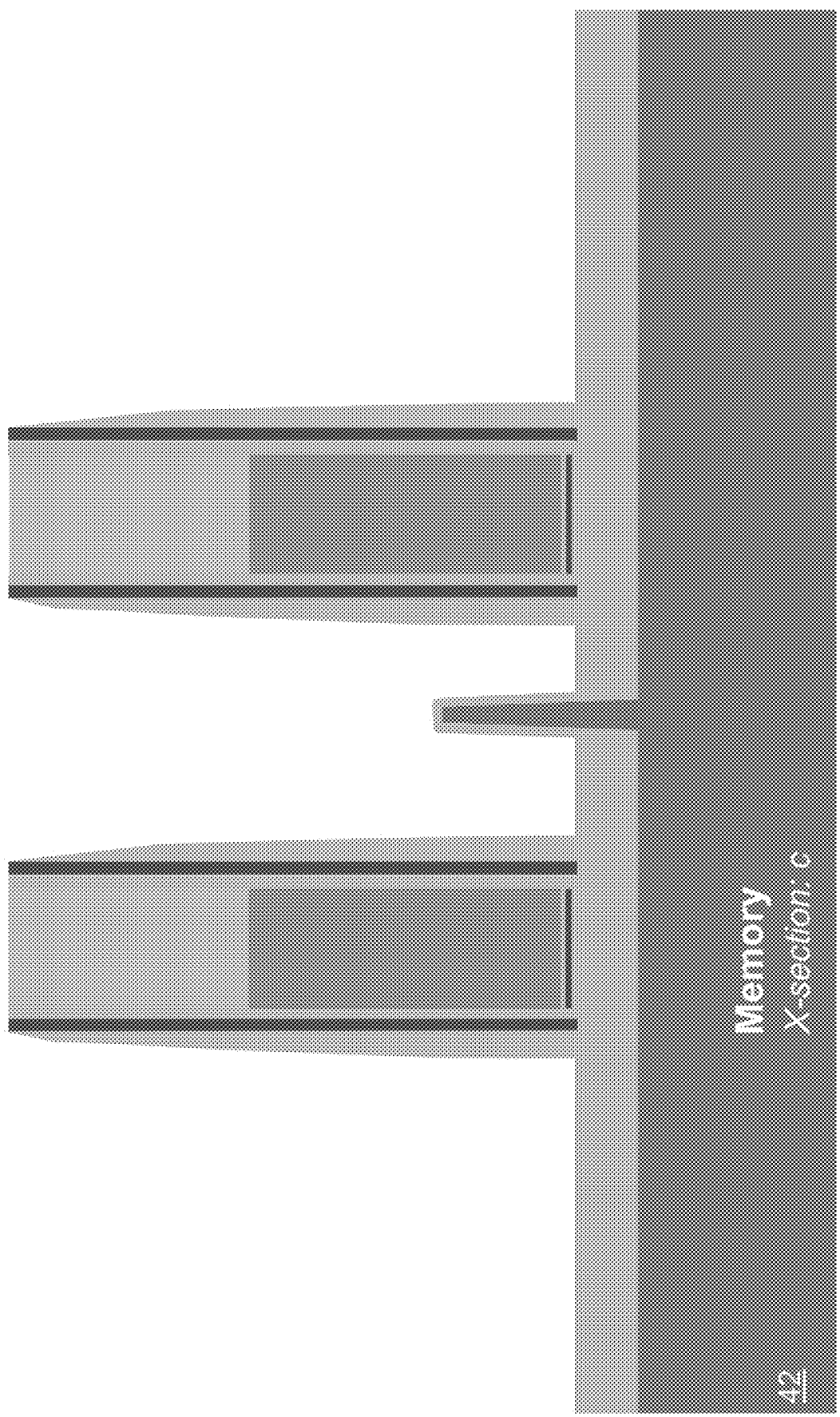
Figure 18E:
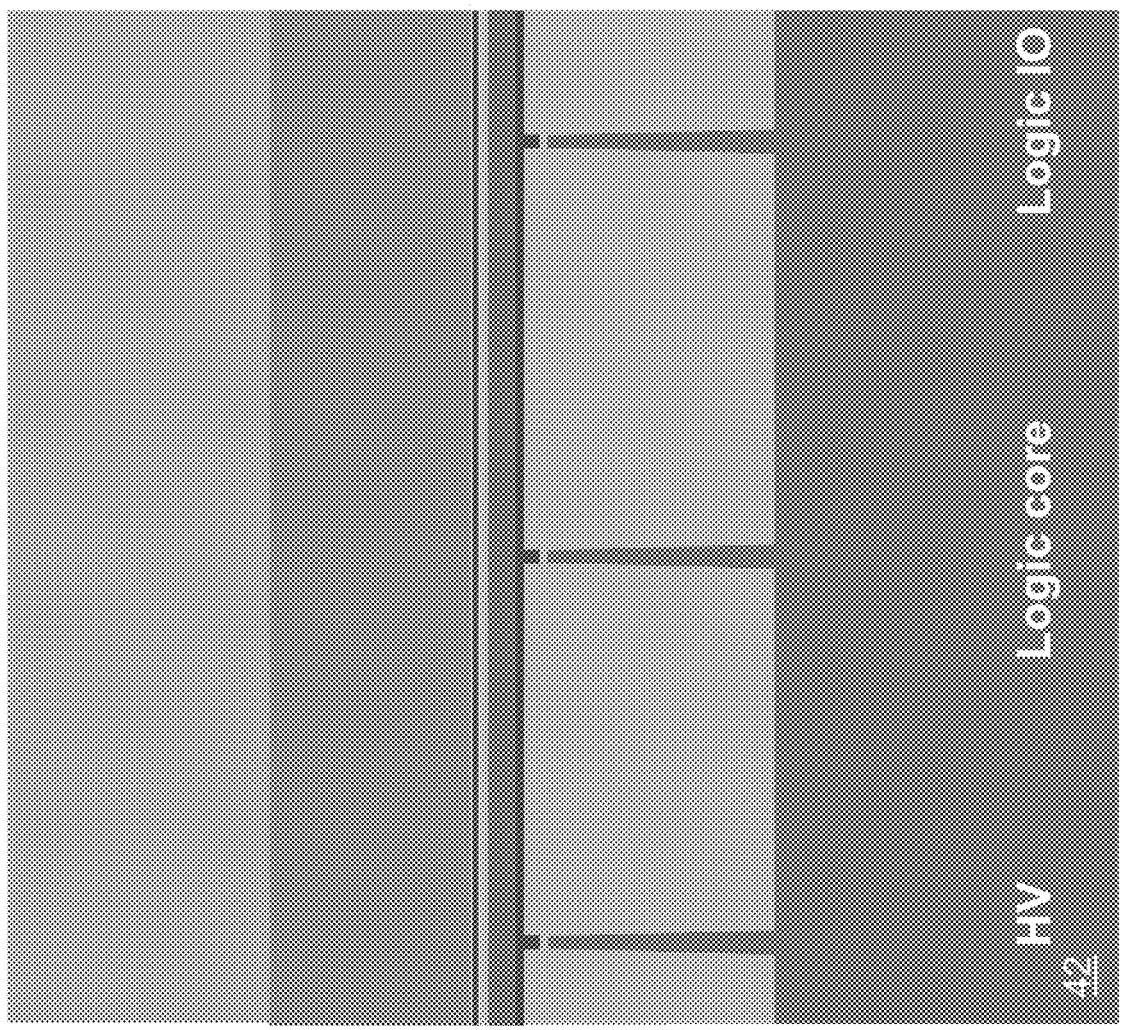
Figure 18D:
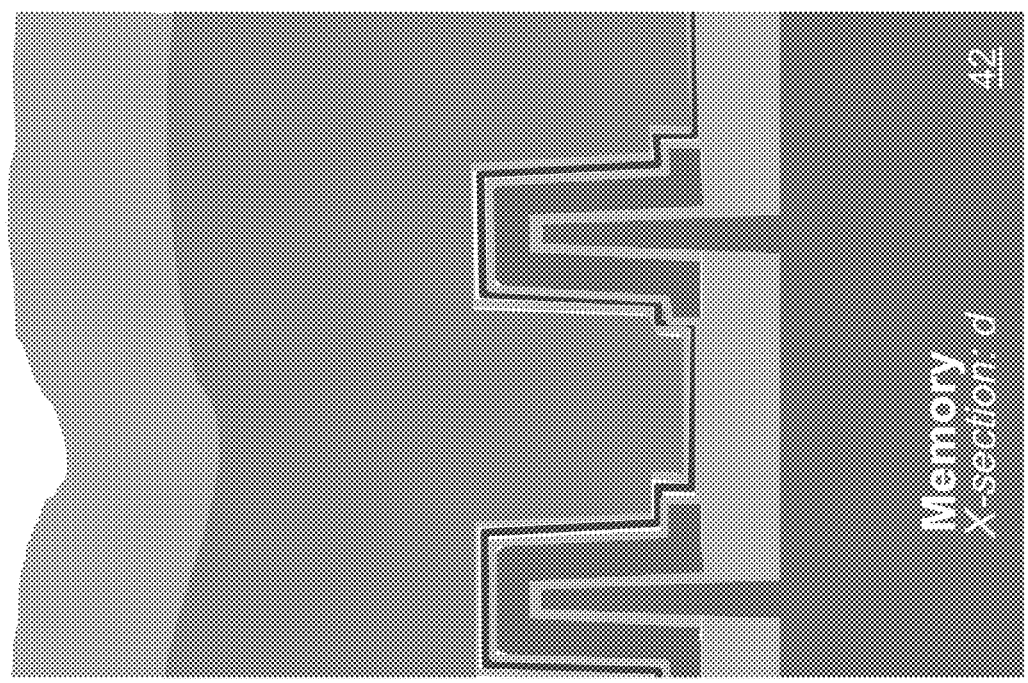
Figure 19A:
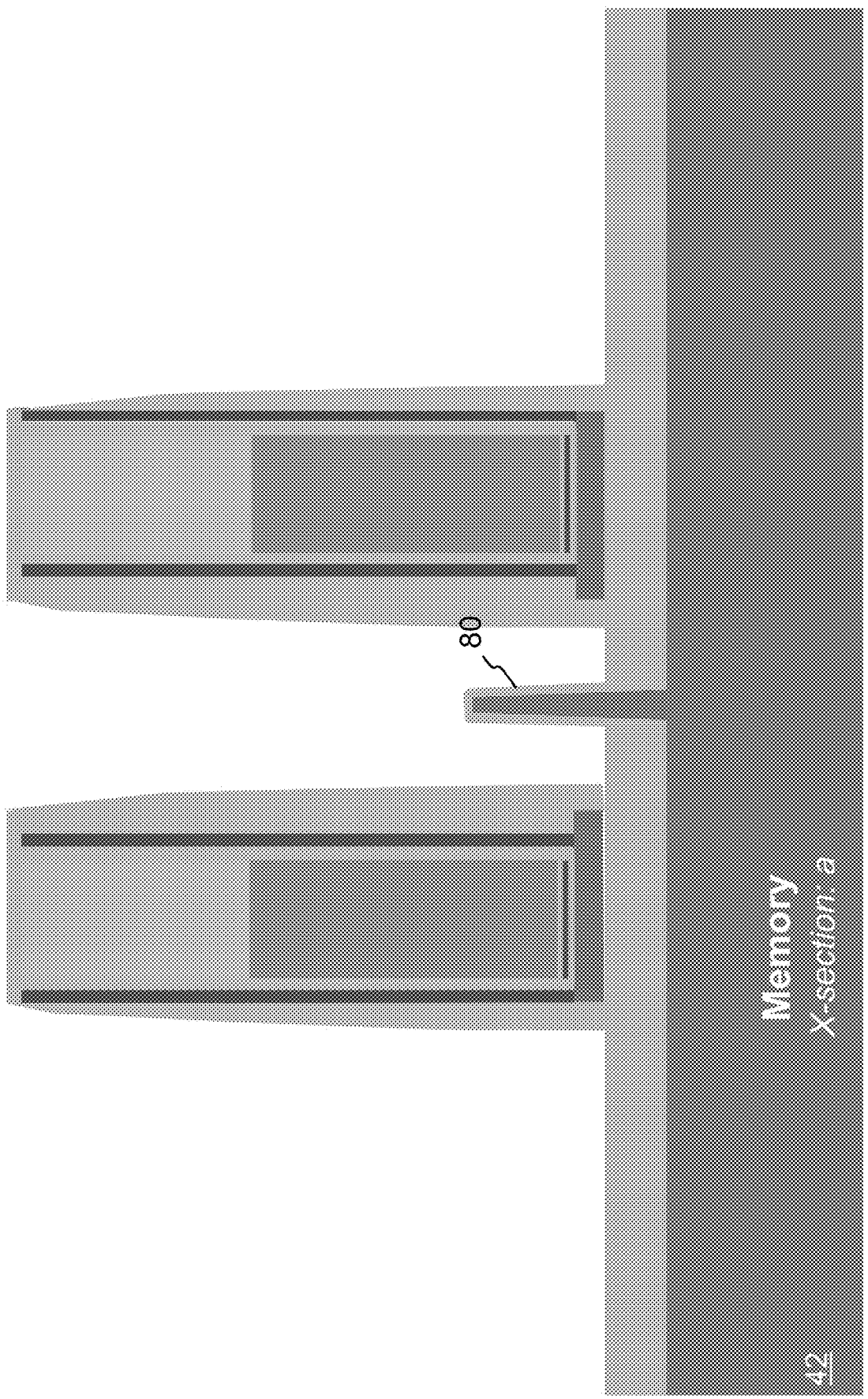
Figure 19B:
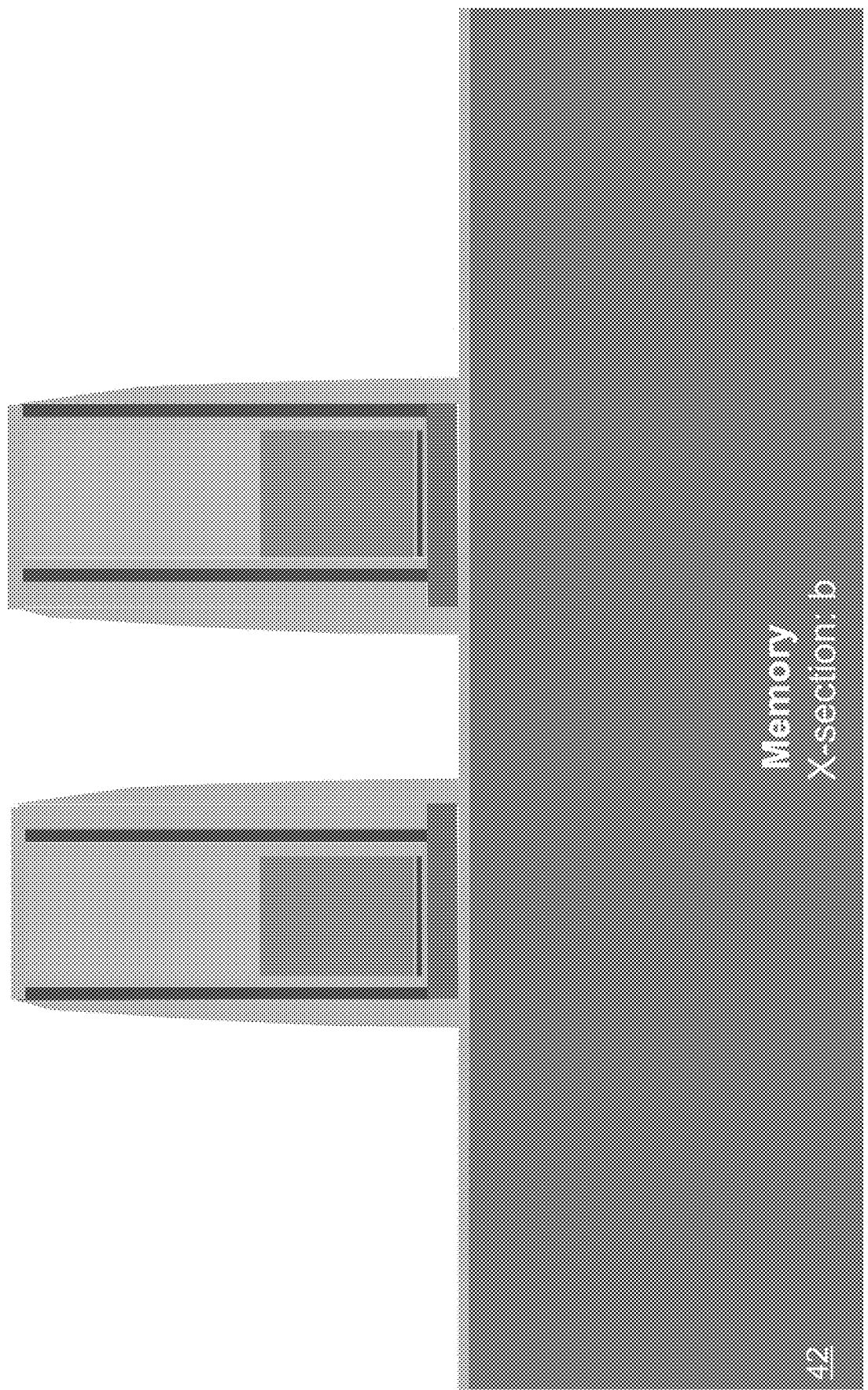
Figure 19C:
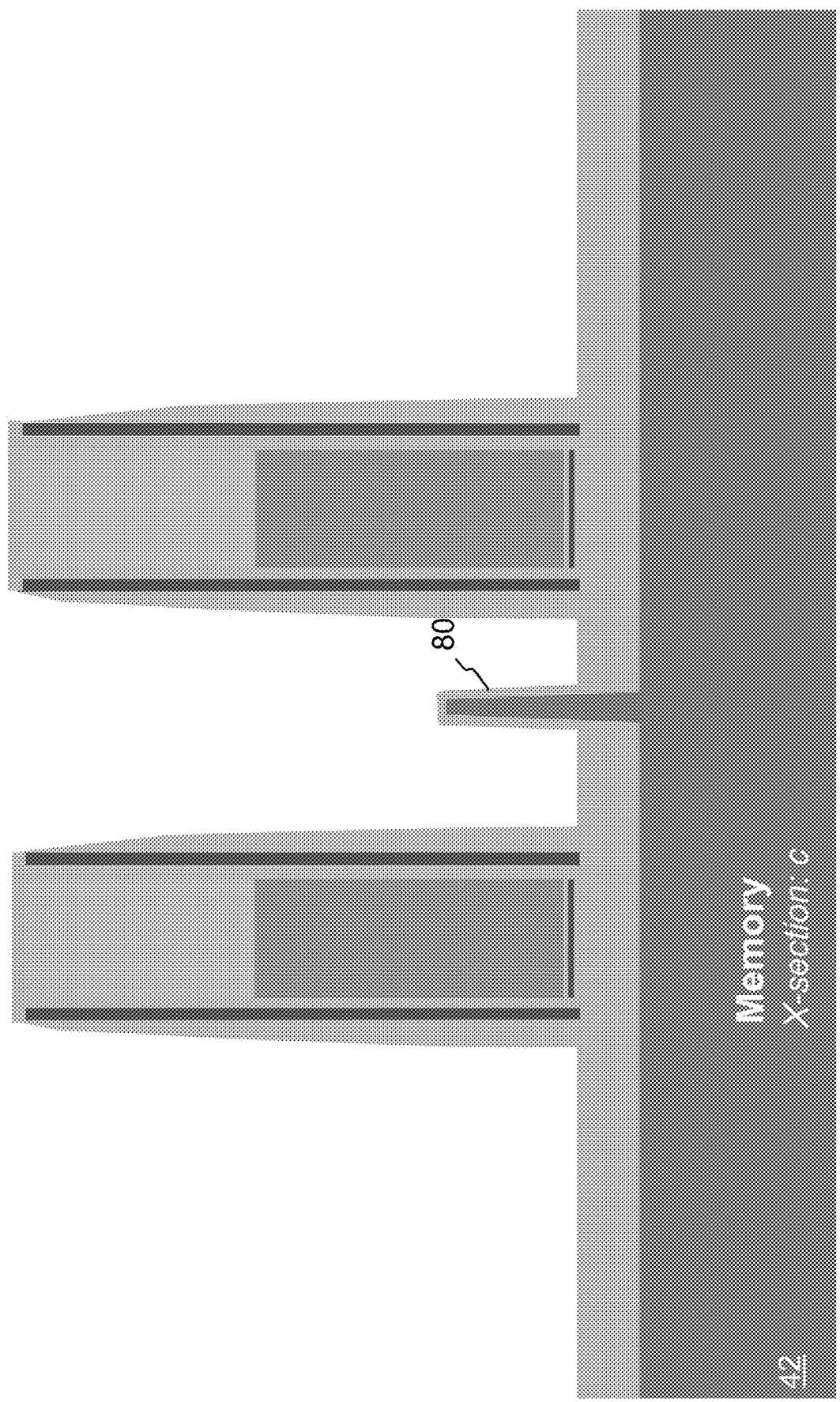
Figure 20A:
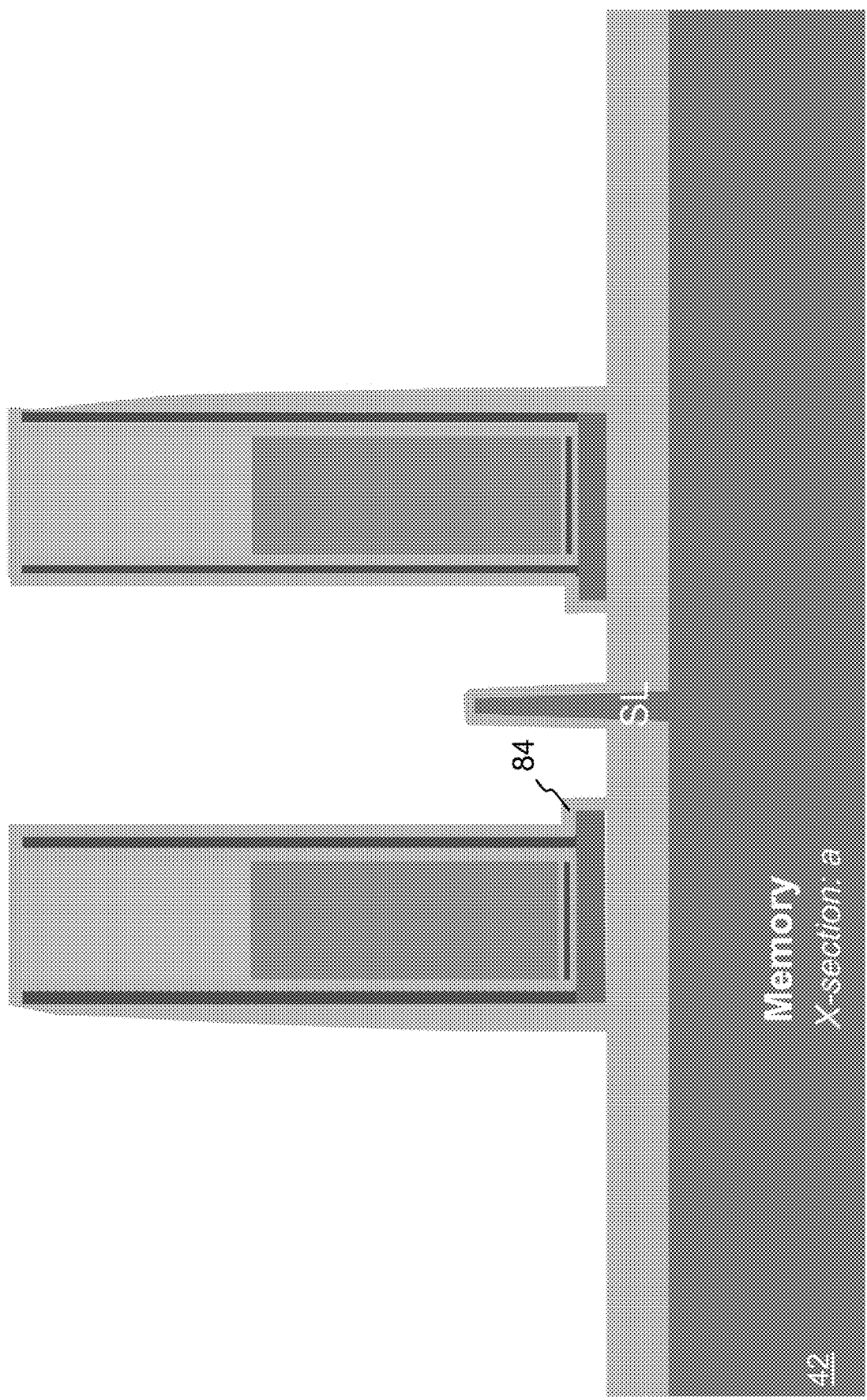
Figure 20B:
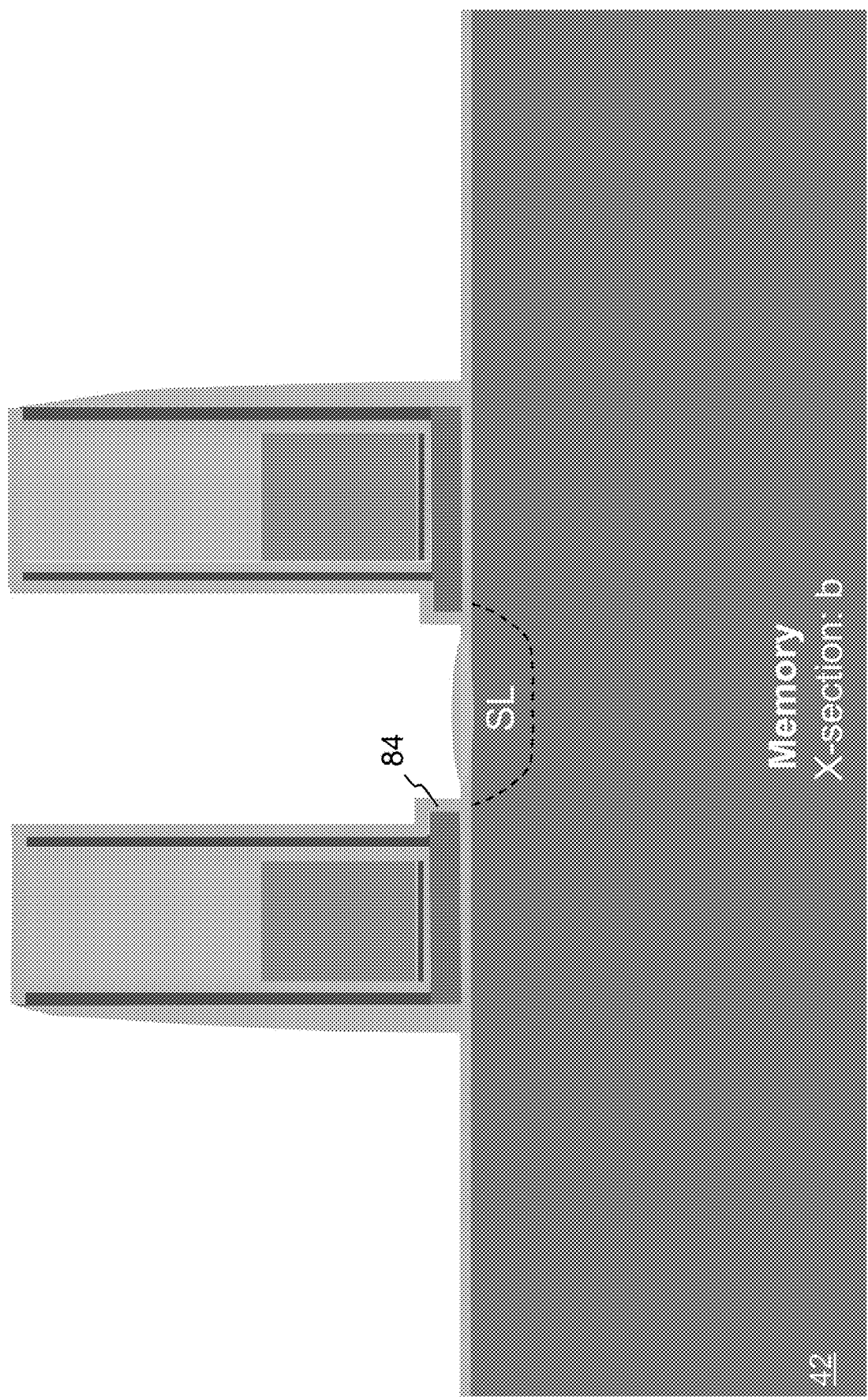
Figure 20C:
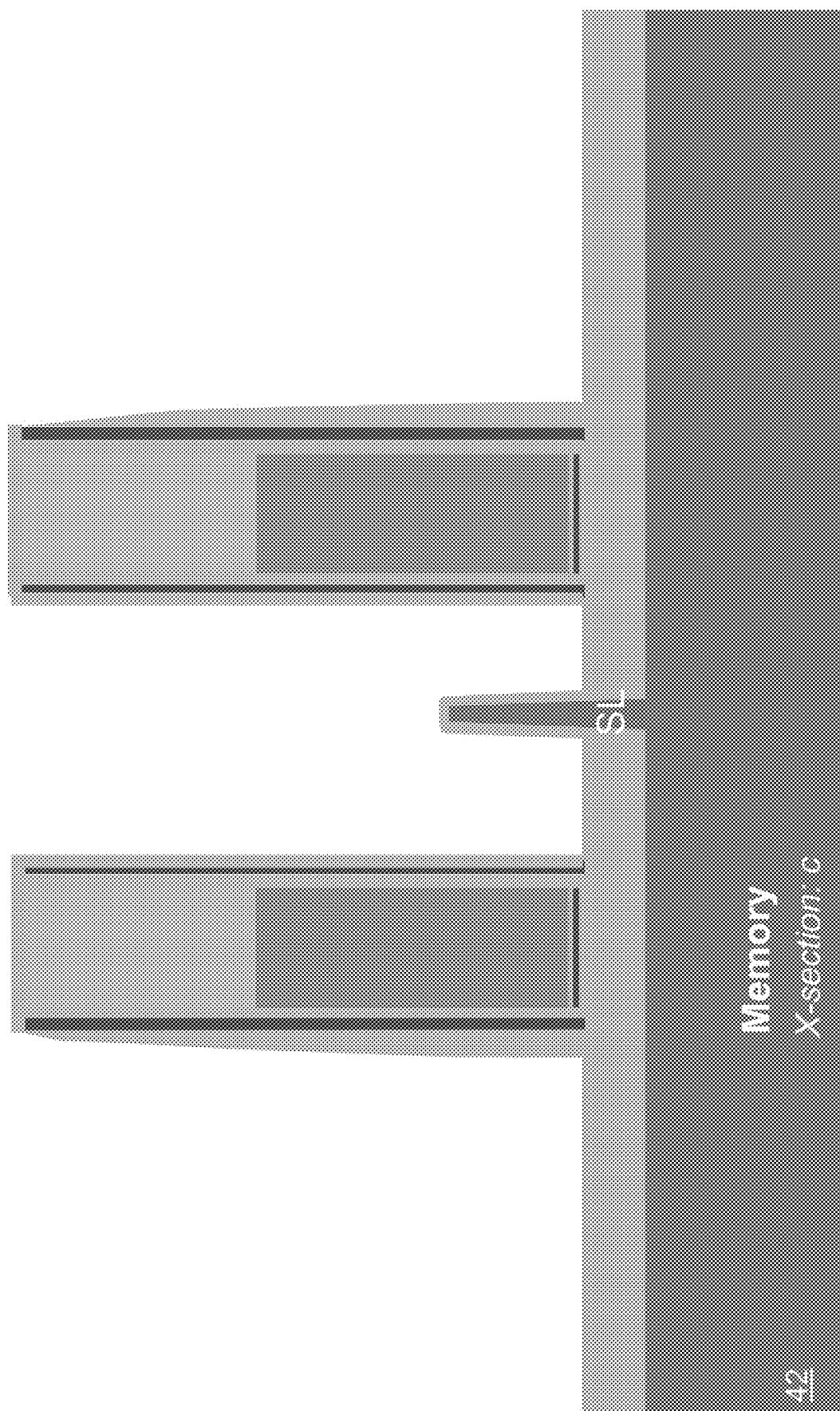

While FIG. 9B only shows one fin 58 in each of the HV, Logic Core and Logic IO Areas, and FIG. 9A only shows two fins 58 in the Memory Area, many multiple fins are formed in each area. While not shown, the spacing between fins will vary based on the area. For example, the distance between adjacent fins in the Logic Core Area preferably is approximately half of the distance that separates adjacent fins in the Memory Area. Insulation material 60 (e.g., oxide) is formed over the structures (including filling trenches 56 with oxide 60), followed by oxide planarization (e.g., CMP) to remove any portion of oxide 60 above the tops of nitride 48. A hard mask layer (e.g., nitride) 62 is formed over the Logic Areas but not over the Memory Area. An oxide etch is then used to recess (i.e., remove the upper portions of) oxide 60 in the Memory Area. The resulting structures are shown in FIGS. 10A and 10B.

The nitride 48 and oxide 46 on the tops of fins 56 in the Memory Area are removed (using photo resist to protect nitride layer 62 in the Logic Areas). A layer of oxide 64 is then formed on the two side surfaces and the top surface of each fin 58 in the Memory Area (e.g., by oxidation). A conformal layer of polysilicon (poly) 66 is then formed on the structures (including on oxide 64), as shown in FIGS. 11A-11D. In-situ doping of the poly layer 60 is then performed. A masking step and poly etch are performed to remove selected portions of poly layer 66 in the bottom of trenches 56 in the Memory Area (between fins 58), as shown in FIGS. 12A-12E. An insulation layer 67 (e.g., ONO, with oxide-nitride-oxide sublayers) is formed on the structures. A thick layer of polysilicon 68 is then formed on ONO layer 67 (which can be subjected to in-situ doping). A hardmask layer 69 (e.g., amorphous carbon) is then formed on poly layer 68. The resulting structures are shown in FIGS. 13A-13E.

A masking step and one or more etches are performed to remove selected portions of the hardmask layer 69, poly layer 68, and ONO layer 67 along the tops of the fins 58 in the Memory Area, leaving pairs of gate stacks S1 and S2 on the top surface of each fin 58 in the Memory Area, as shown in FIGS. 14A-14E. An HTO deposition and anneal are performed to form oxide layer 70 along the sides of the gate stacks S1 and S2. A nitride deposition and etch are performed to form nitride layer 71 along oxide layer 70. A sacrificial oxide spacer 72 is formed along the nitride layer 71 by oxide deposition and etch. The resulting structures are shown in FIGS. 15A-15E.

Photo resist 74 is formed between each of the gate stack pairs S1 and S2 using a masking step. A WLVT implant is then performed, followed by an oxide etch that removes oxide spacers 72 on the outer sides of the stack pairs S1 and S2, as shown in FIGS. 16A-16E. After photo resist removal, a poly etch is used to remove exposed portions of the floating gate poly layer 66 (from between stacks S1 and S2), as shown in FIGS. 17A-17E. Oxide spacers 75 are then formed along the sides of stacks S1 and S2 by oxide deposition and etch, as shown in FIGS. 18A-18E. Photo resist is selectively formed on portions of the Memory Area using masking step, followed by etches to remove hard mask 69, poly layers 68 and 66, and ONO layer 67 from the Logic Areas and selected portions of the Memory Area. After photo resist removal, a masking step is used to cover the structures with photo resist except for the HV Area, which is subjected to oxide and nitride etches to remove nitride and oxide on the fins 58, and to recess oxide 60 on either side of the fins 58. An oxide layer 80 is then formed on the exposed fins 58 in the HV Area (e.g., RTO+HTO and anneal) and in the Memory Area, as shown in FIGS. 19A-19E.

A masking step is used to cover the structures with photo resist except for the area between each of the gate stack pairs S1 and S2. An implant is performed in the substrate between each of the gate stack pairs S1 and S2 (i.e., source line implant for forming source lines SL, i.e., source regions as shown in the b cross sections and source lines in fins 58 extending in the horizontal/row direction as shown in the a and c cross sections). An oxide etch is then used to remove the spacers 75 and 72 in that same region, followed by the formation of tunnel oxide layer 84 on the exposed surfaces of poly layer 66 and the inner sidewalls of gate stacks S1 and S2 (e.g., by wet or partial wet deposition to thicken the oxide on the substrate, followed by HTO deposition to achieve desired thickness on poly layer 66 and anneal), as shown in FIGS. 20A-20E (after photo resist removal).

Figure 21:
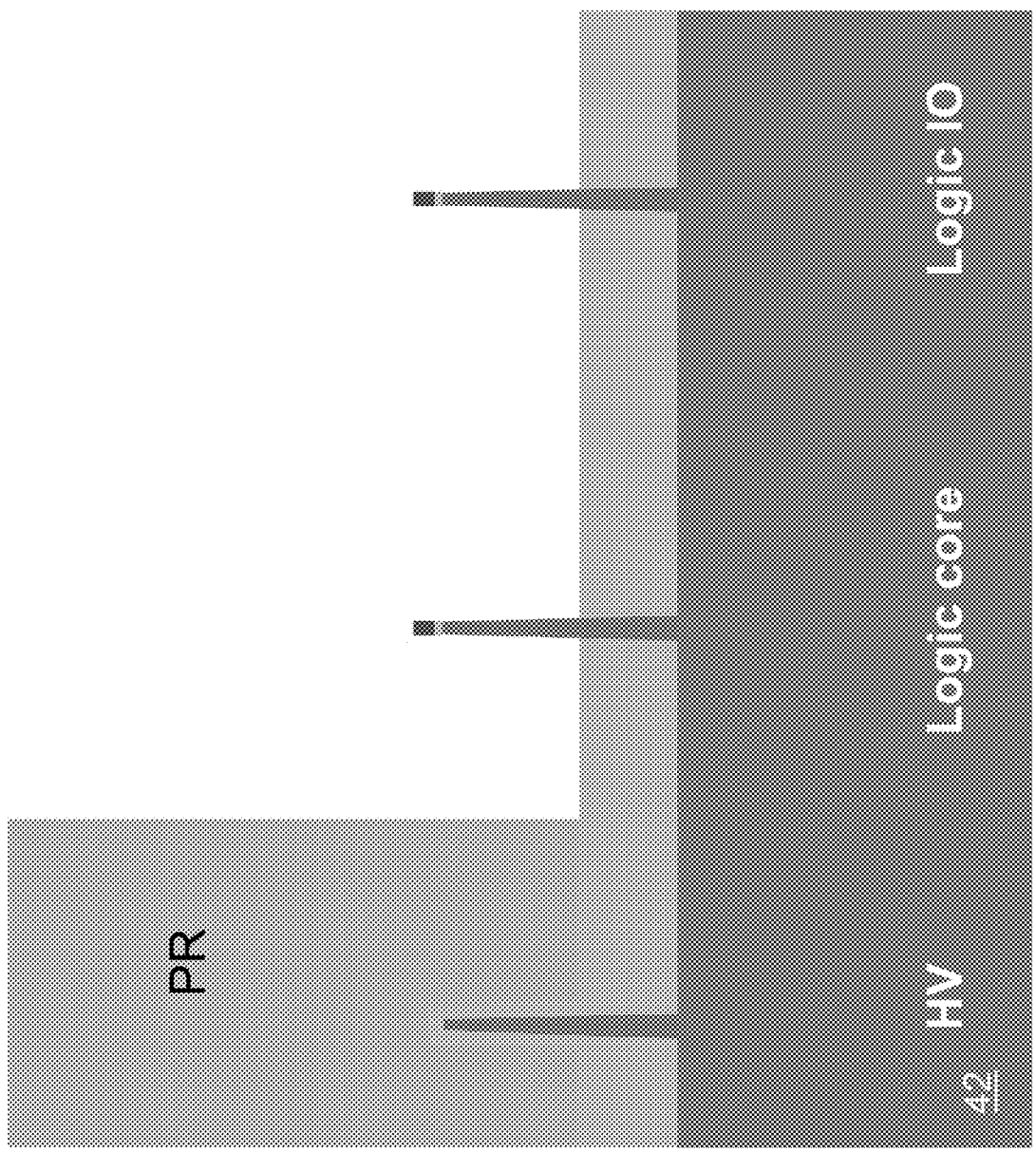
Figure 22A:
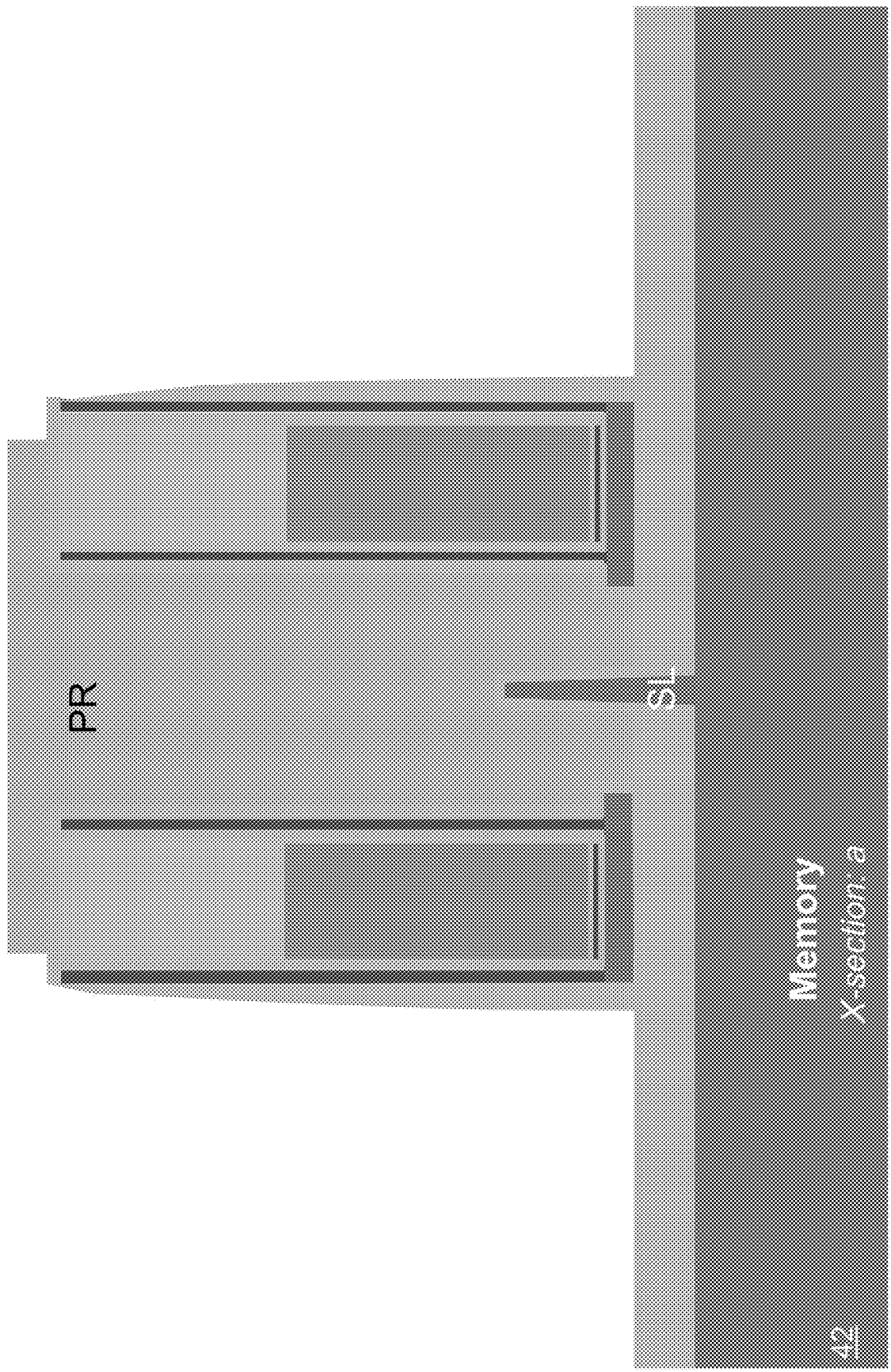
Figure 22B:
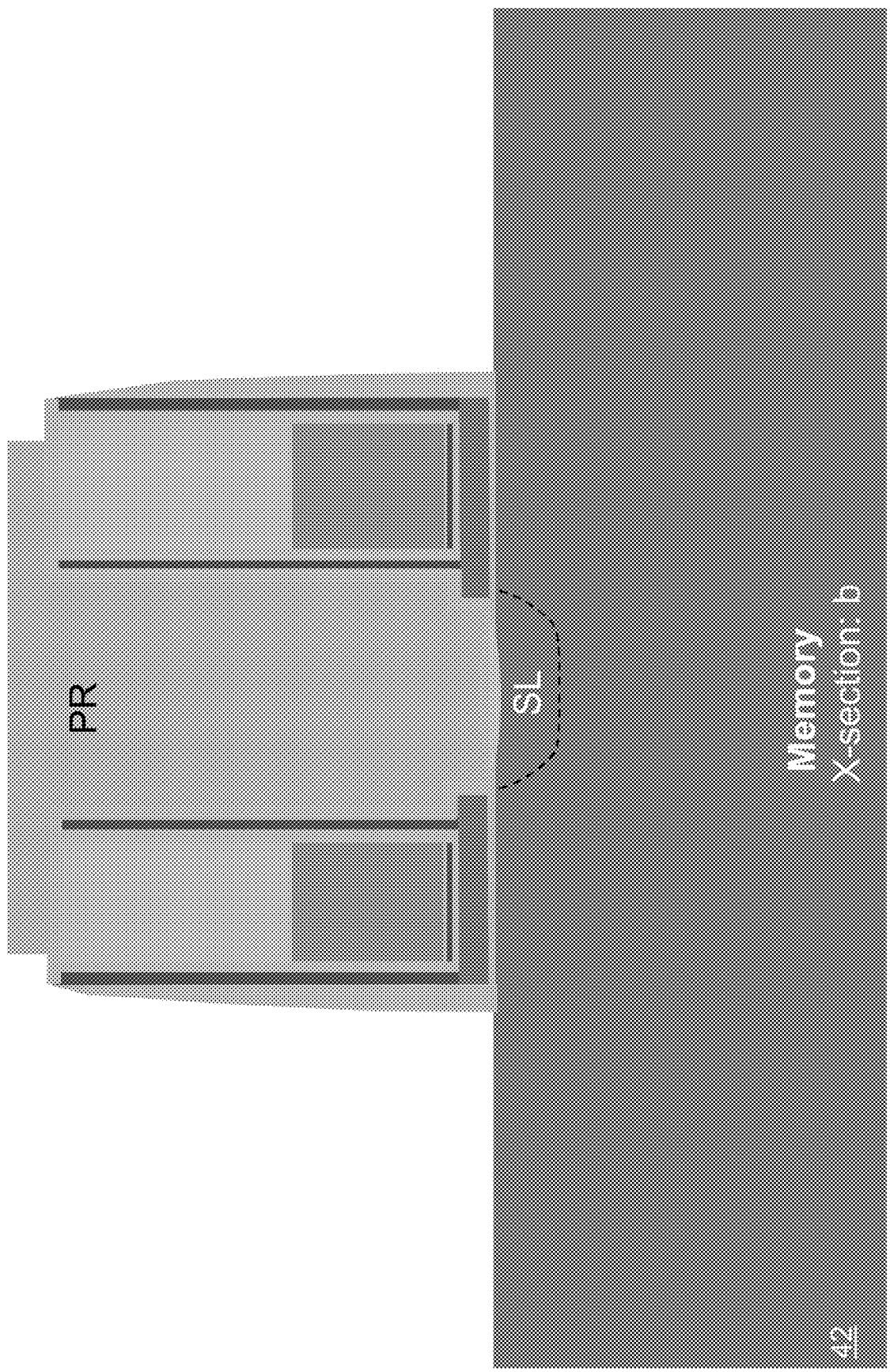
Figure 22C:
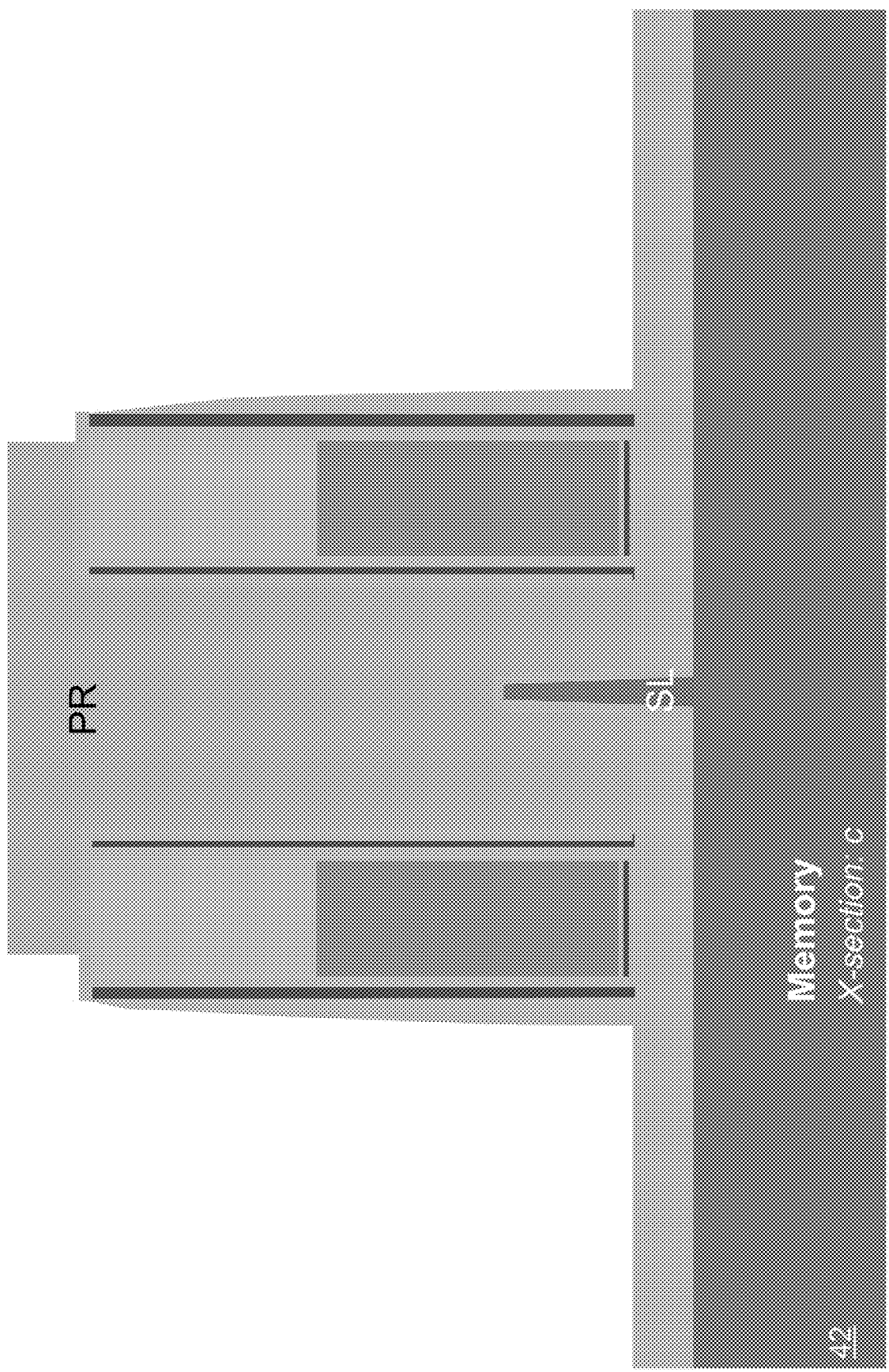
Figure 22E:
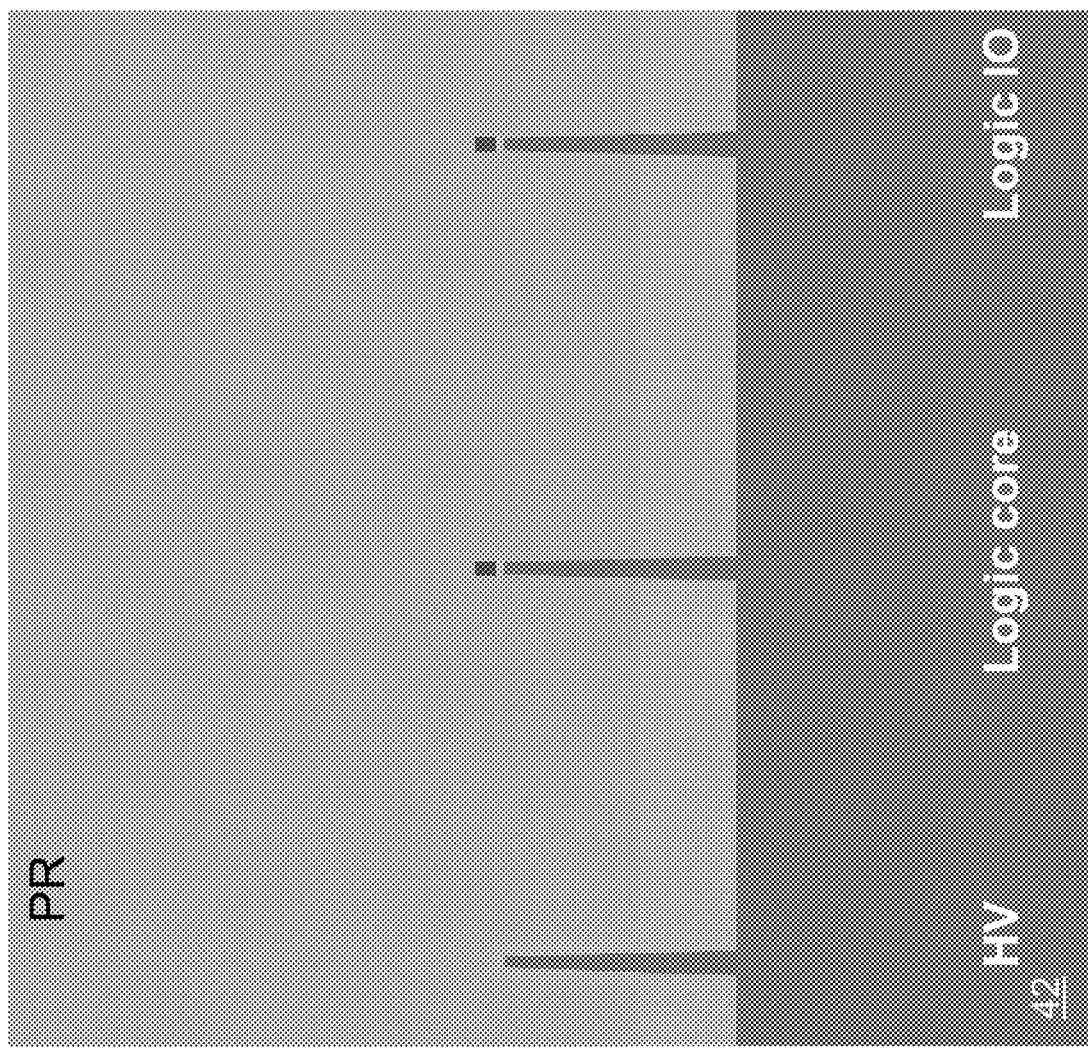
Figure 22D:
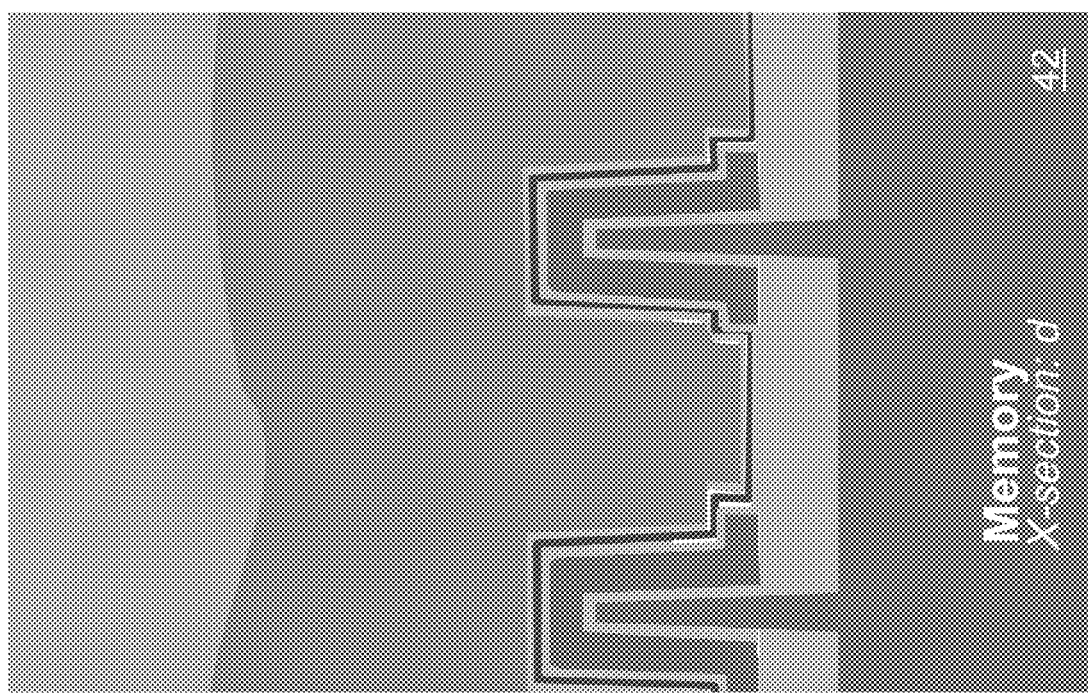
Figure 23A:
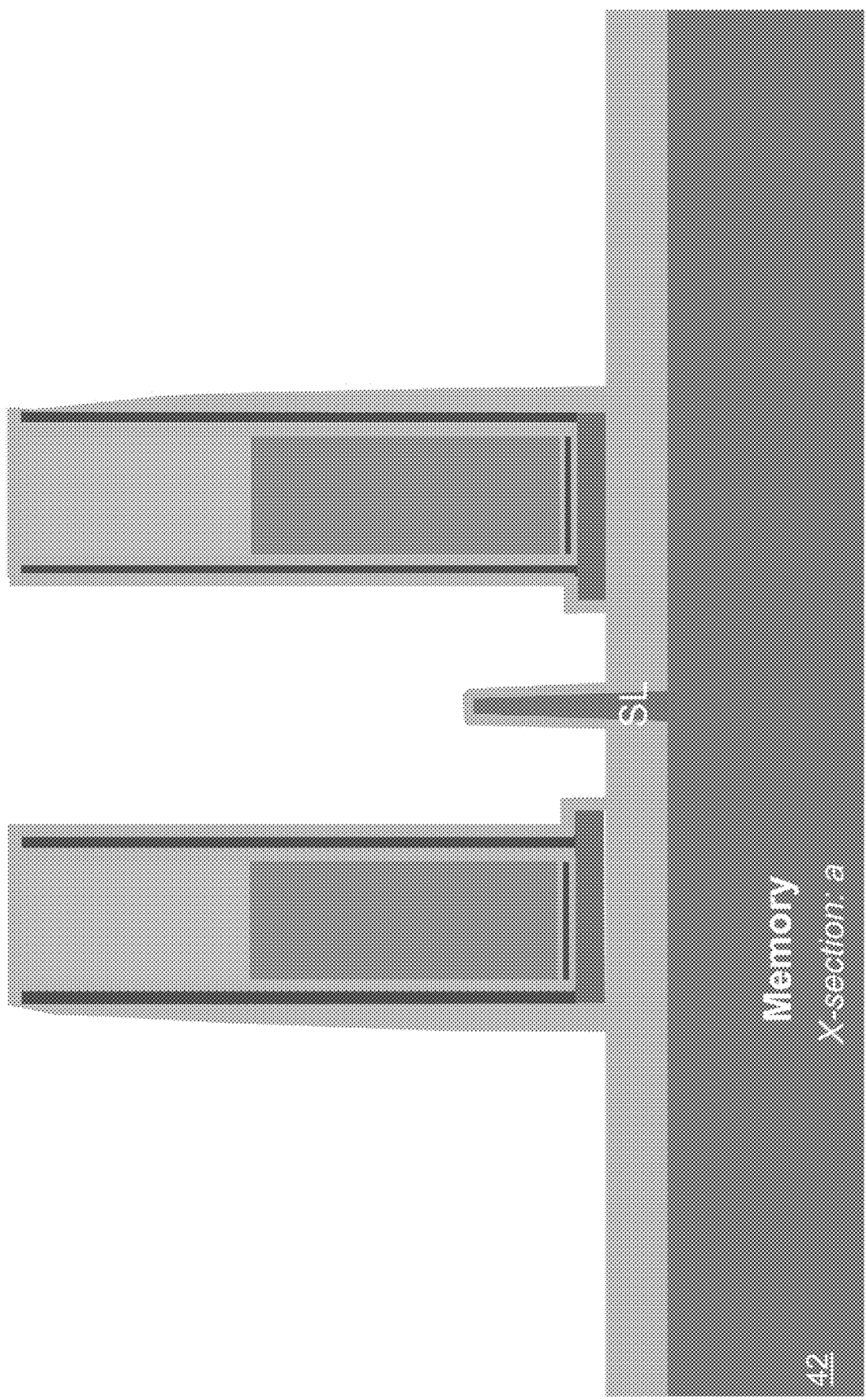
Figure 23B:
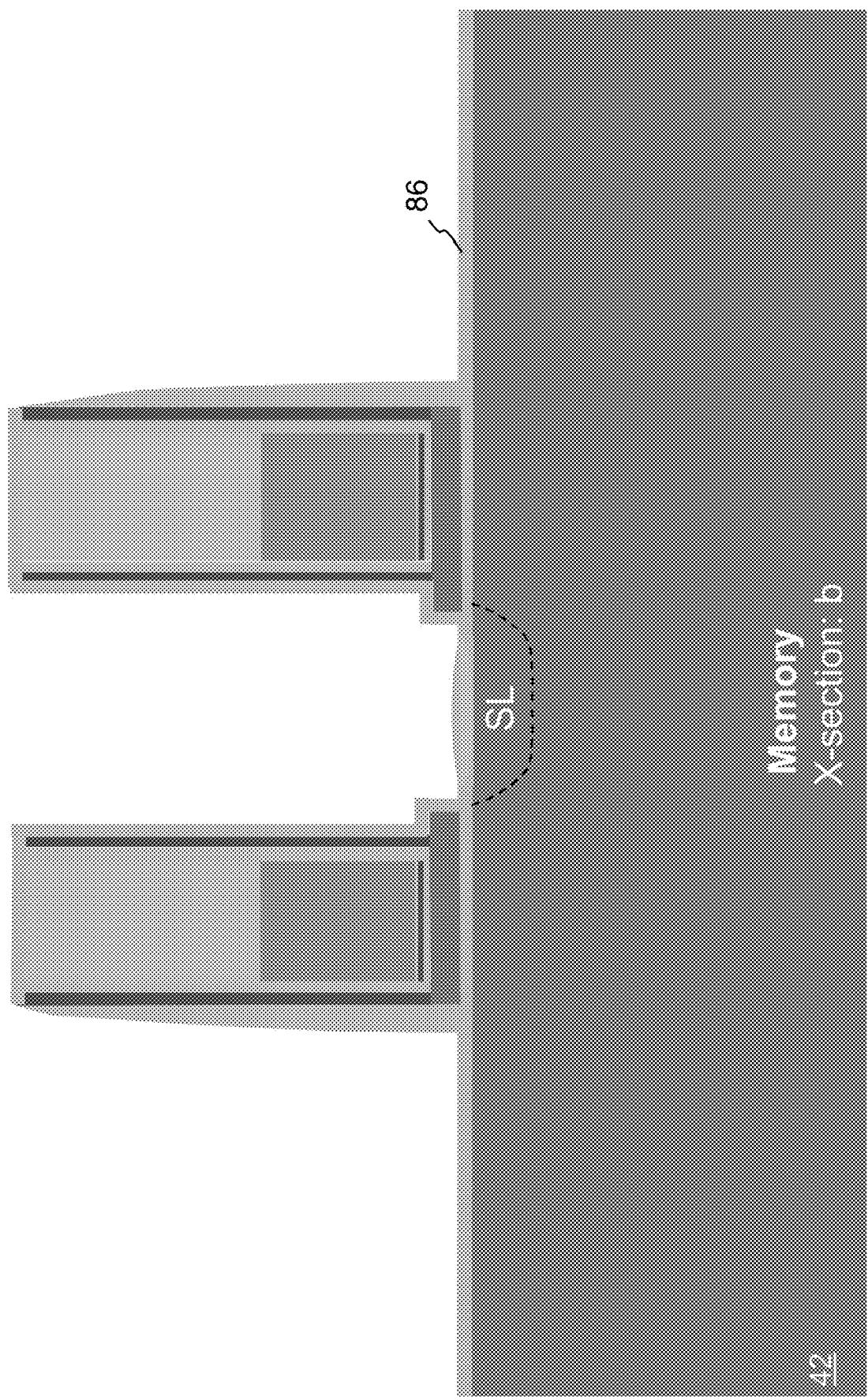
Figure 23C:
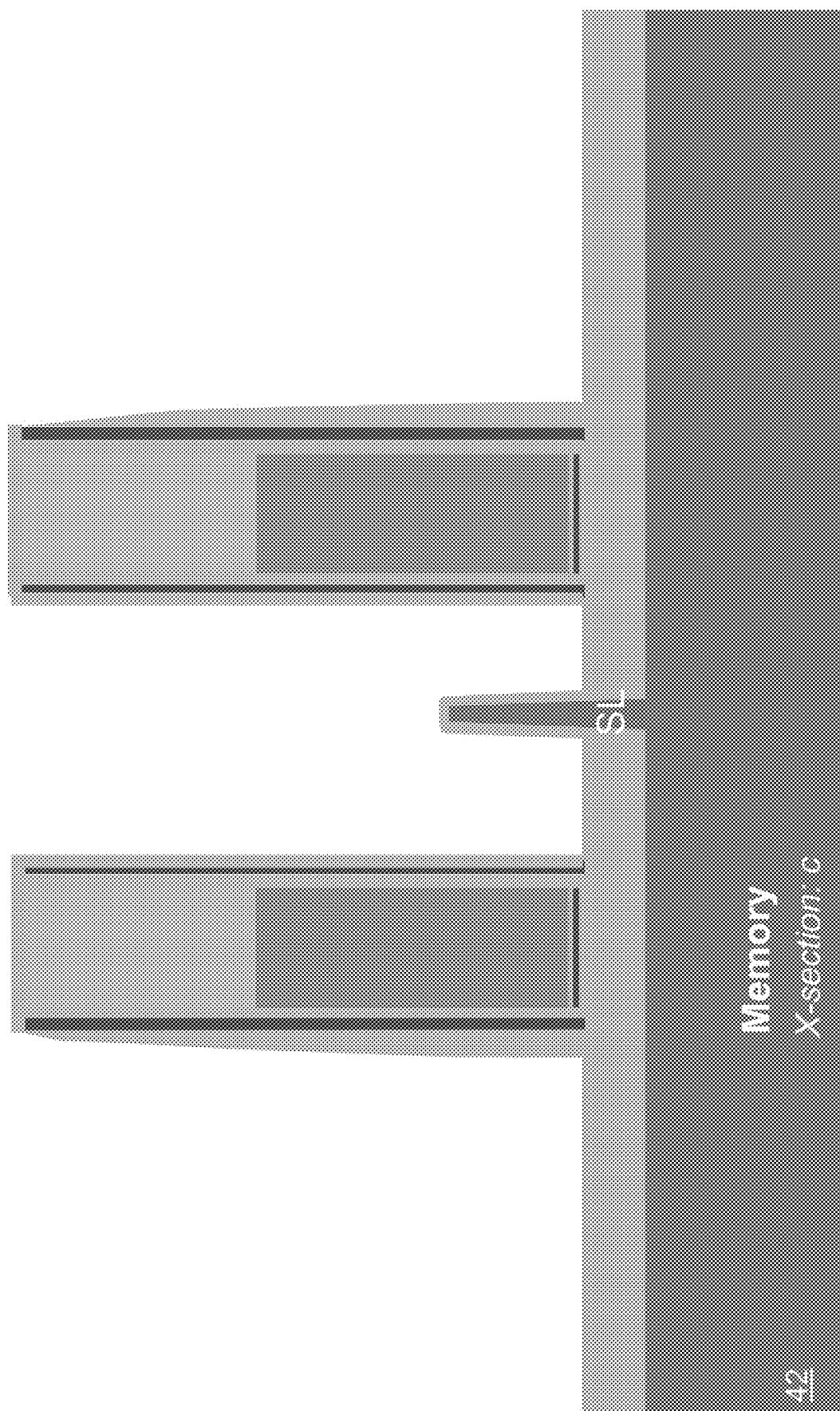
Figures 23D, 23E:
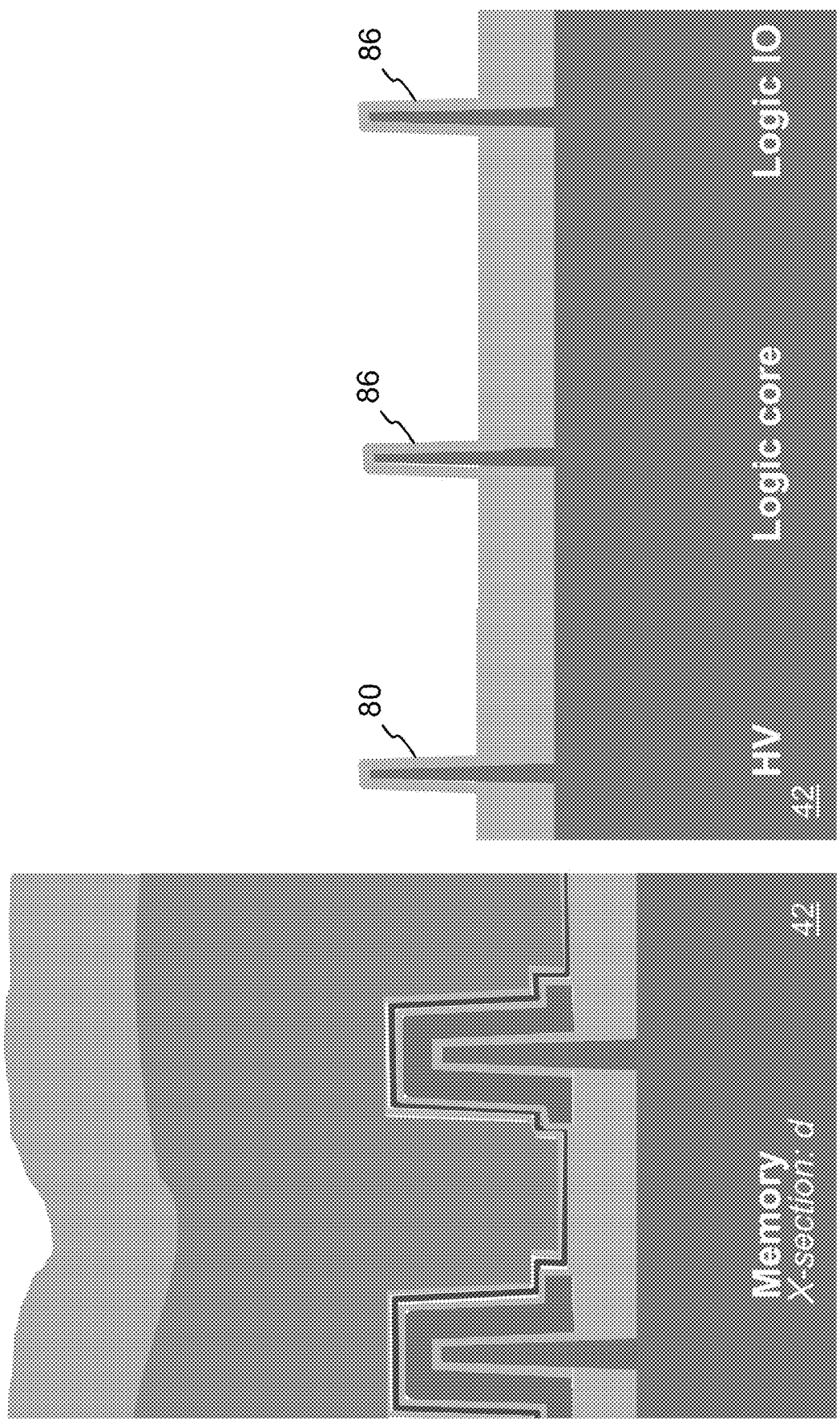
Figure 24A:
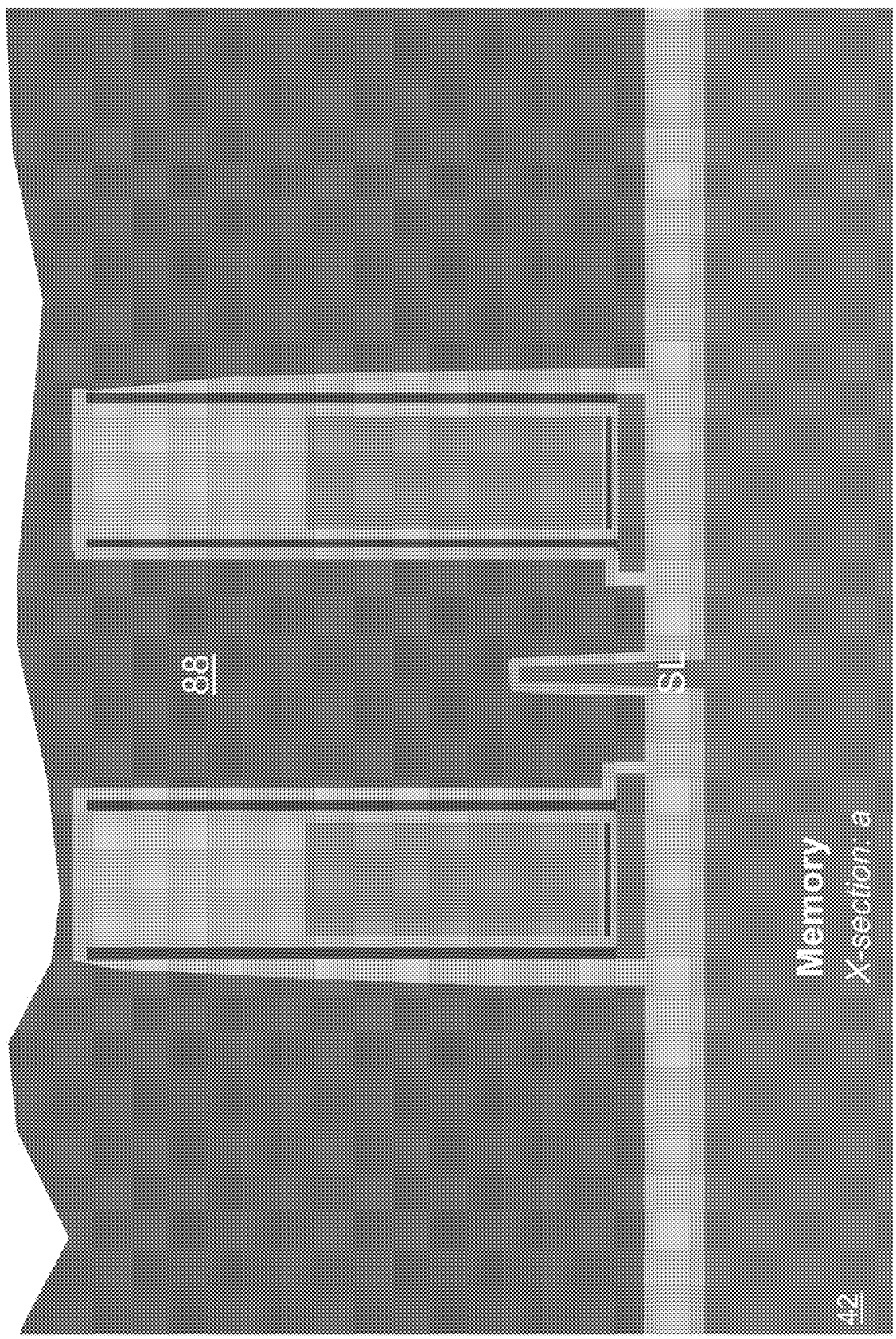
Figure 24B:
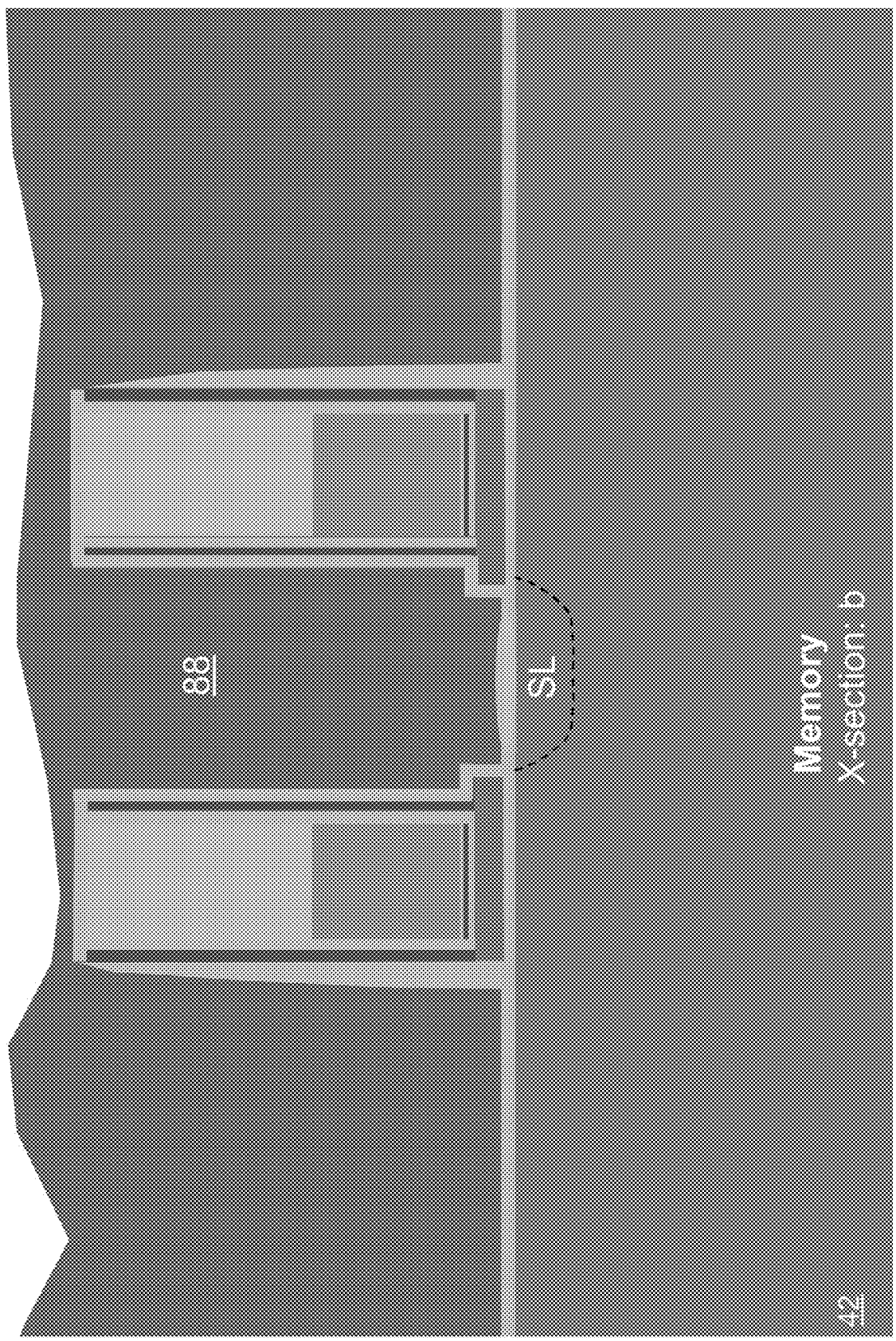
Figure 24C:
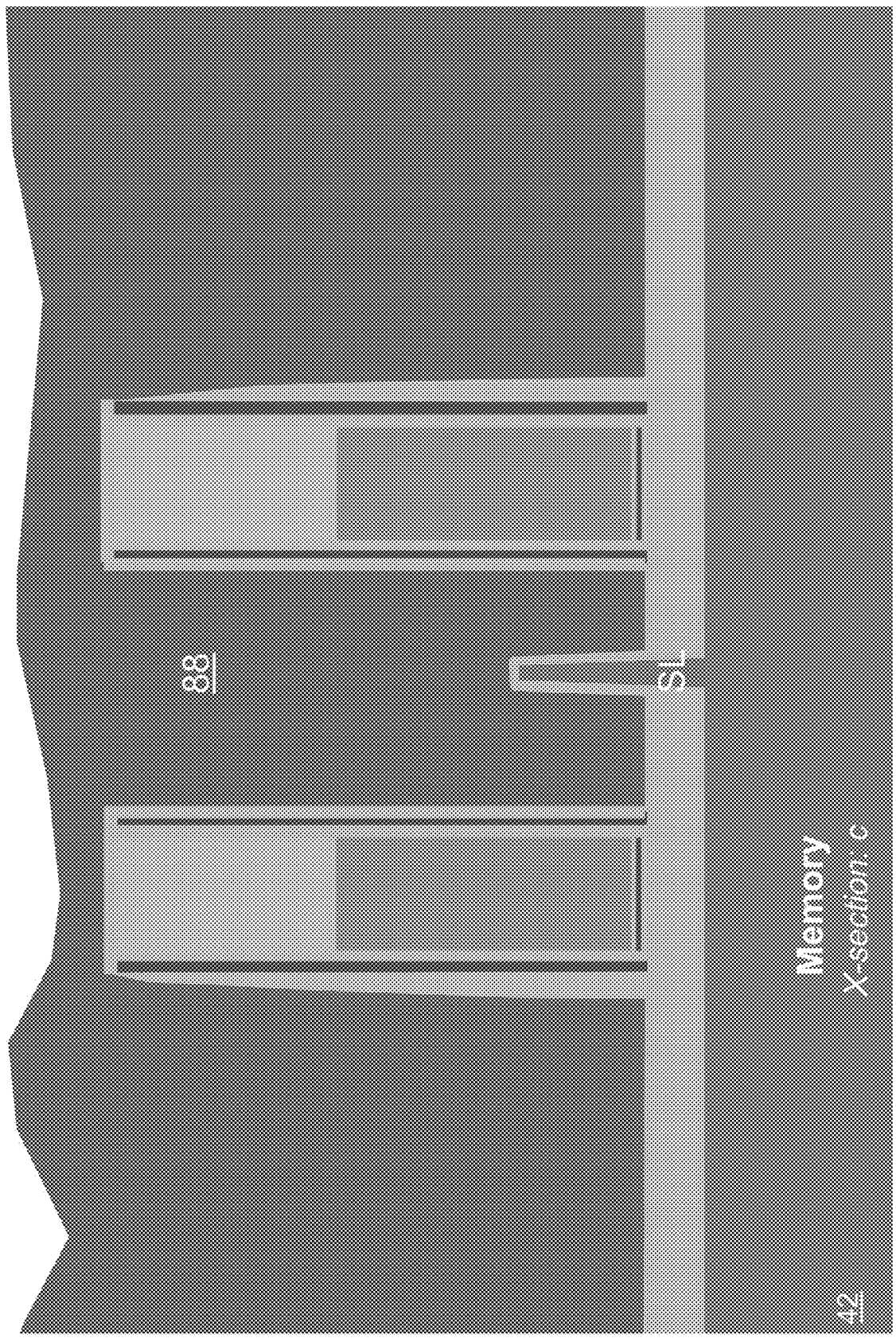
Figure 24E:
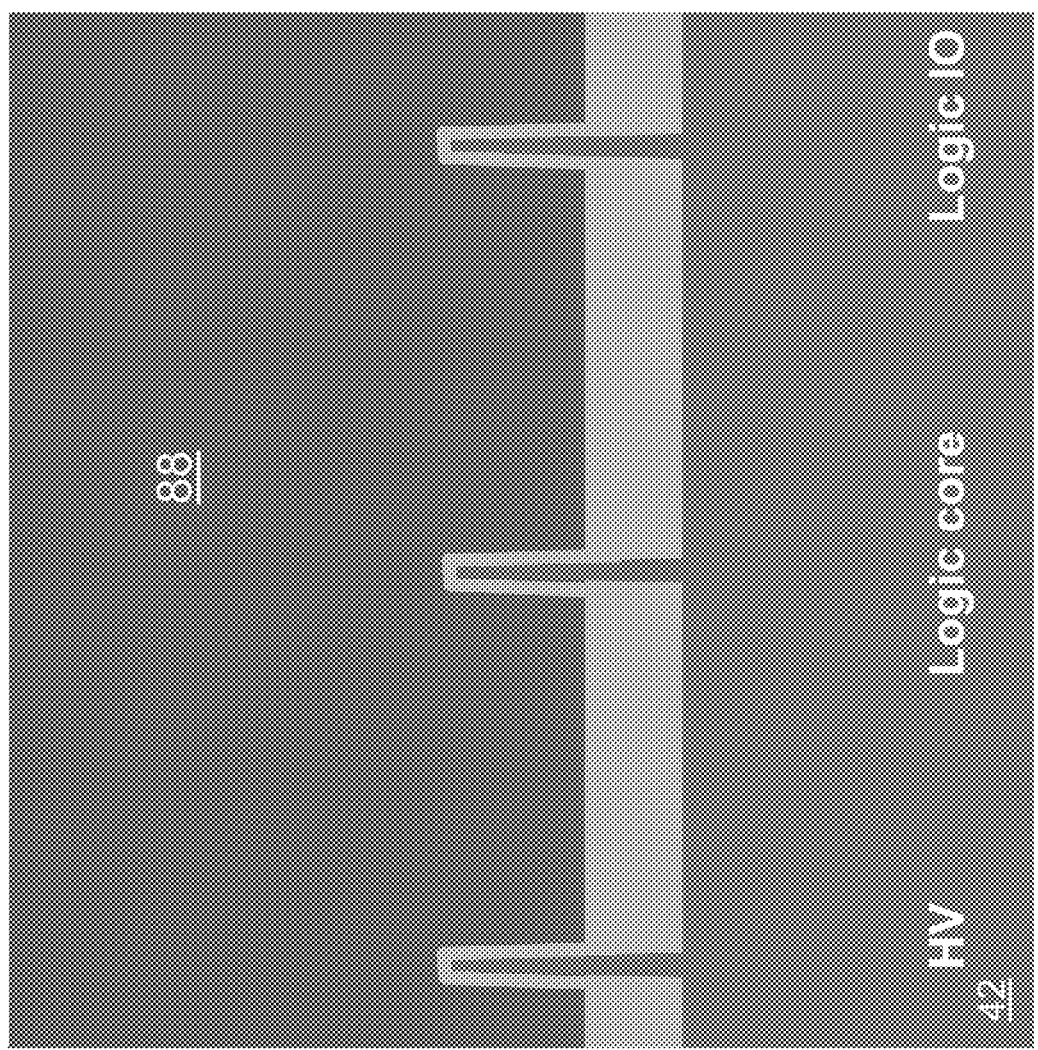
Figure 24D:
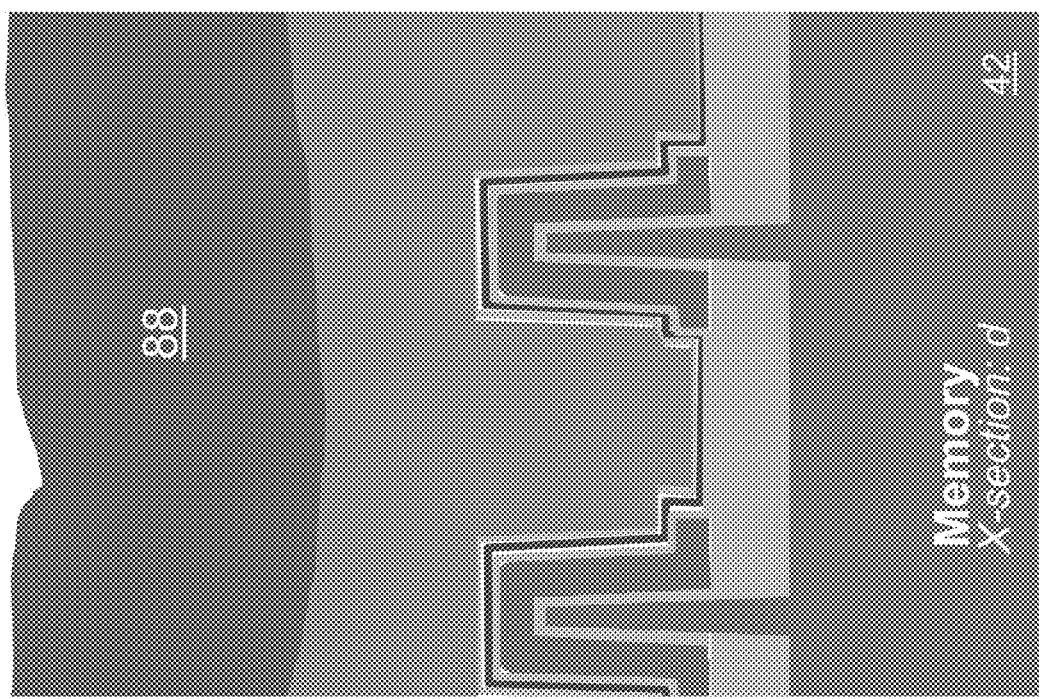
Figure 25A:
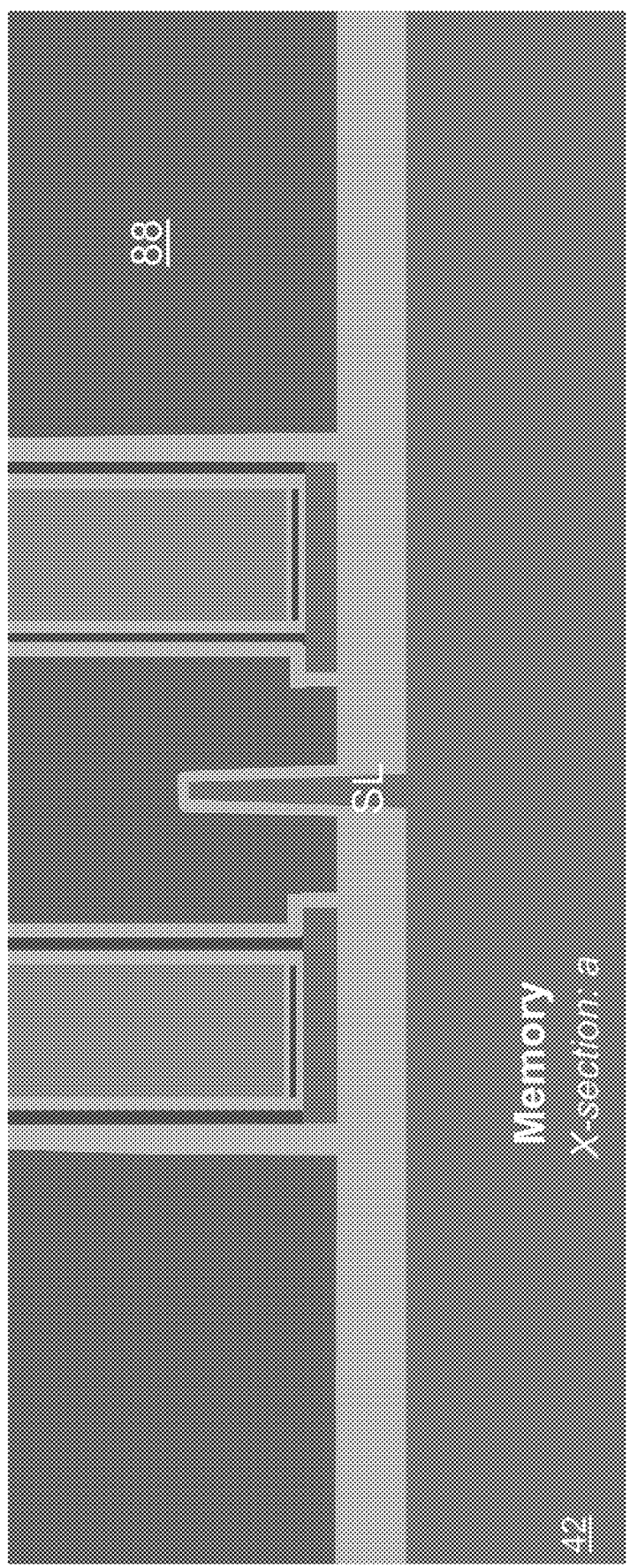
Figure 25B:
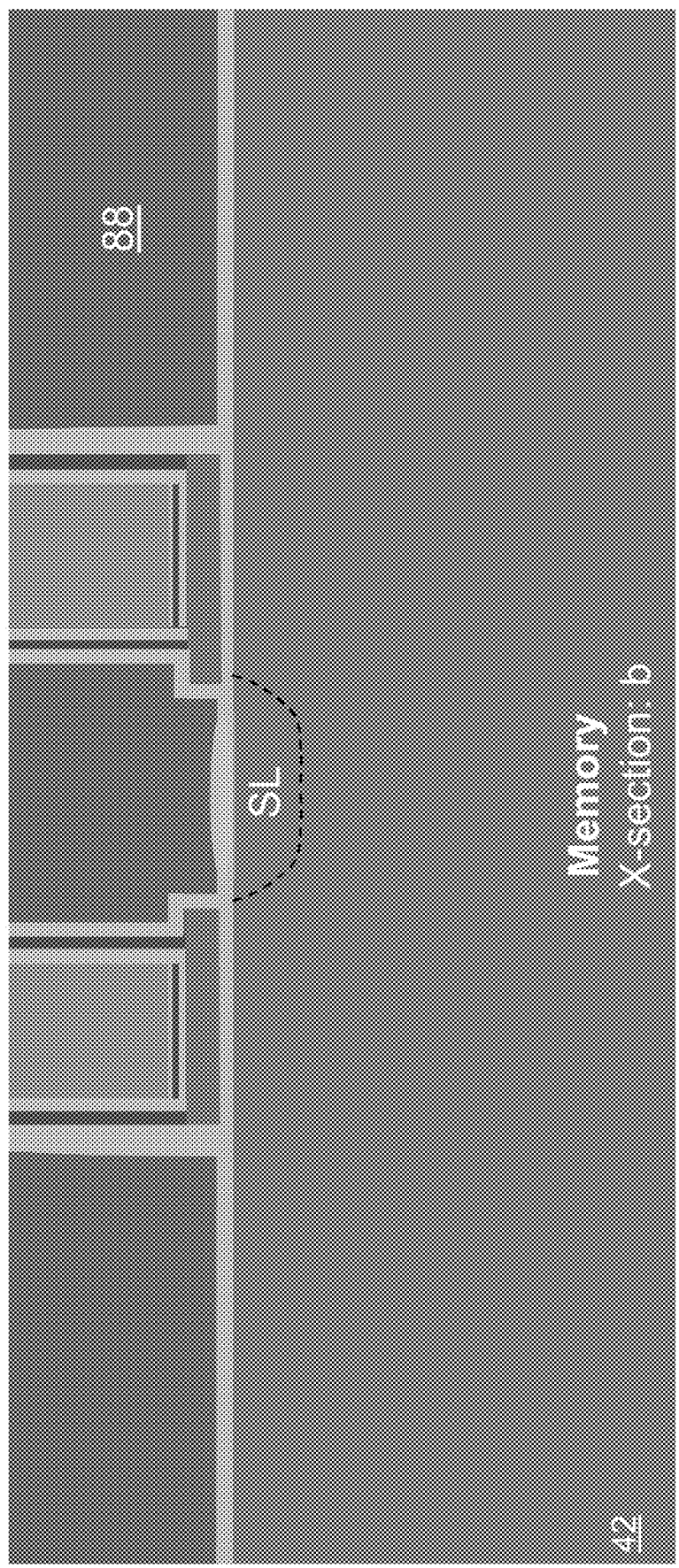
Figure 25C:
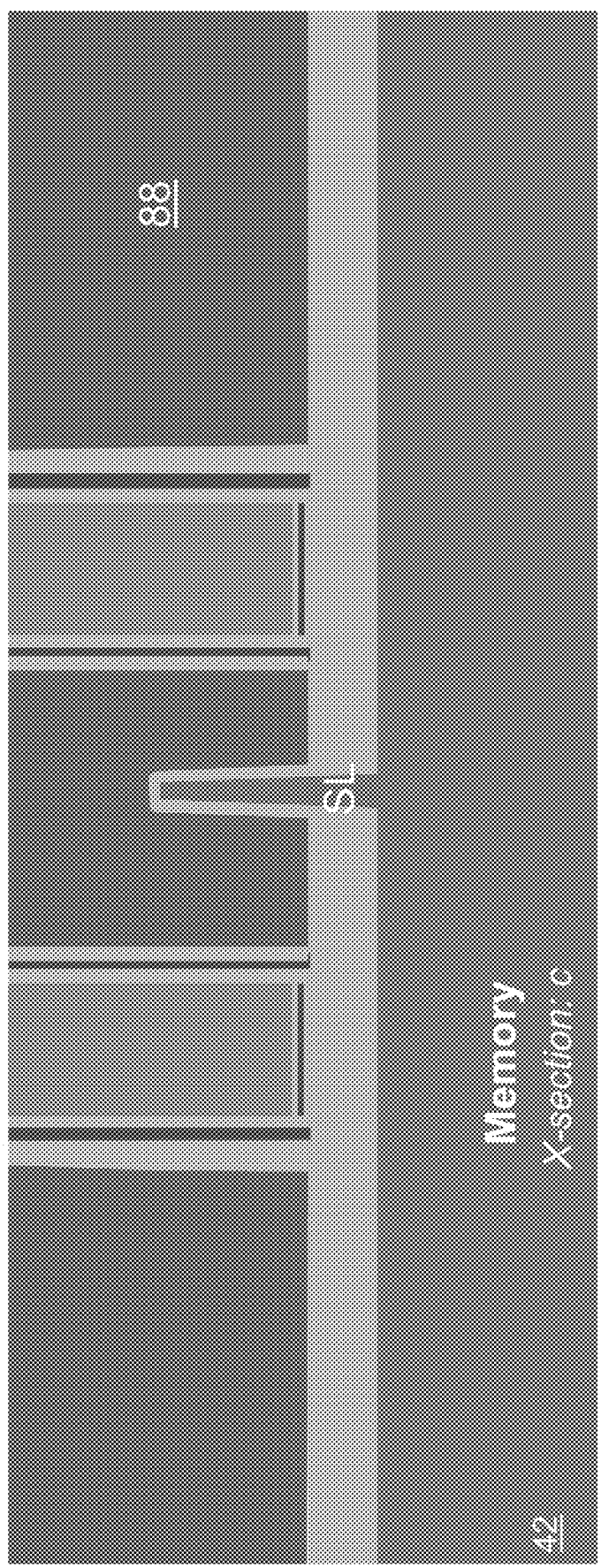
Figure 25E:
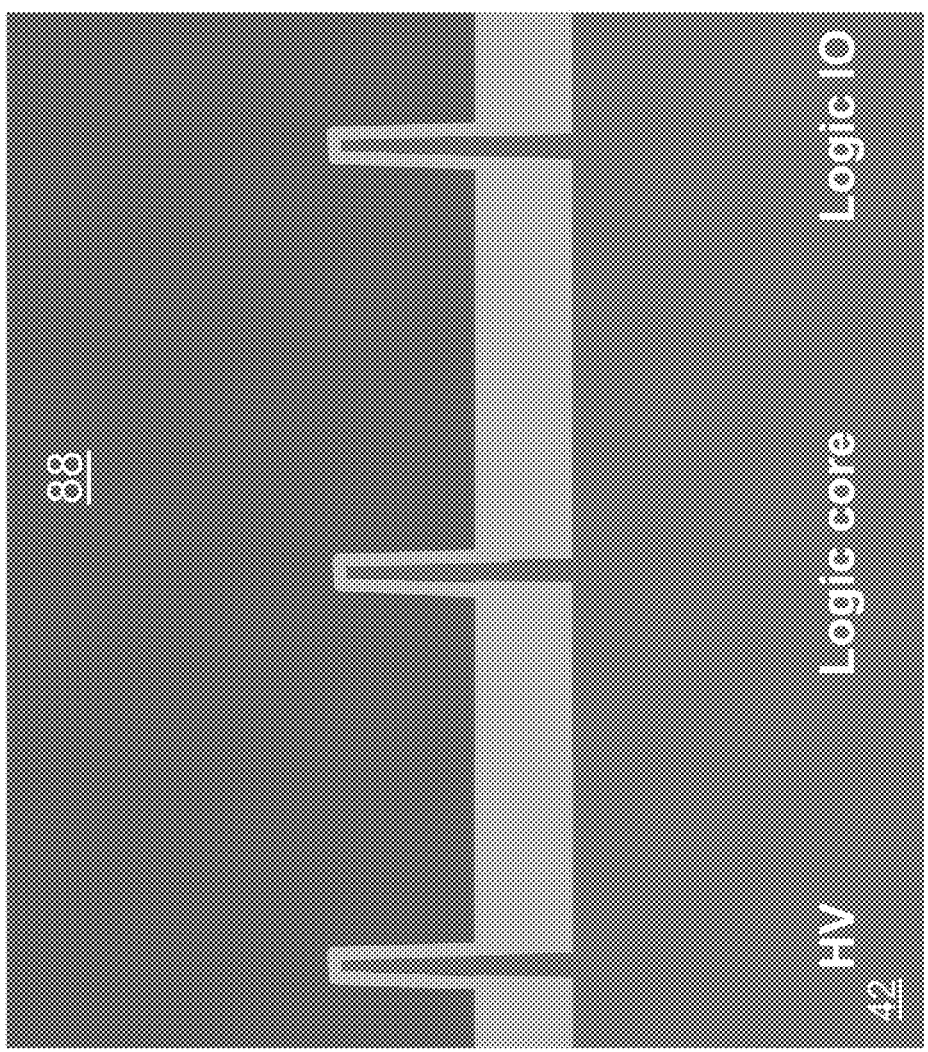
Figure 25D:
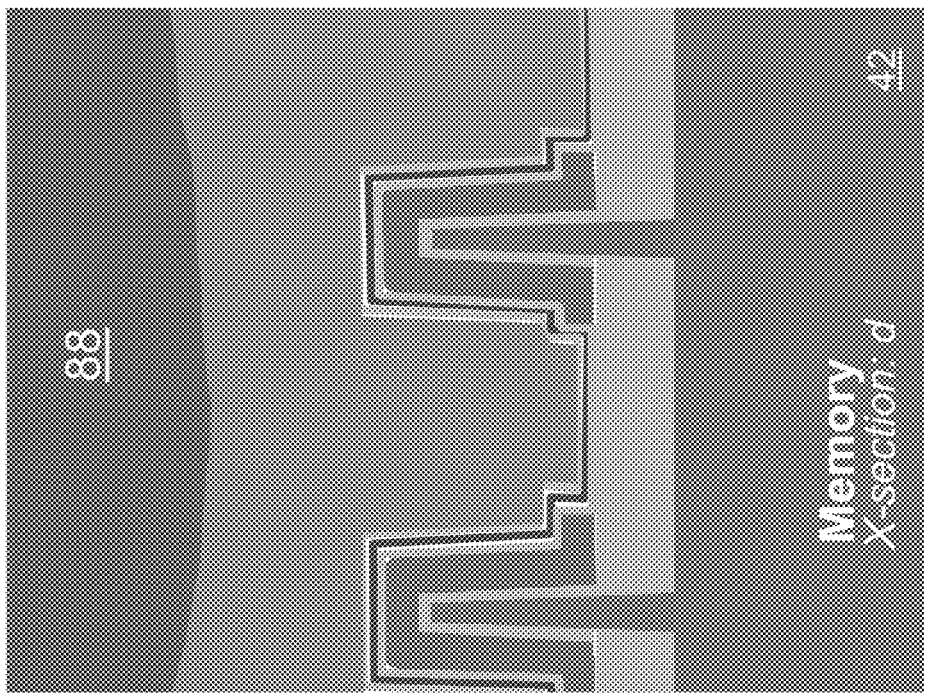

The Memory and HV areas are covered by photo resist PR, and the Logic Core and Logic IO area are subjected to an oxide etch to recess oxide 60, as shown in FIG. 21. One or more implantations are then performed (which preferably includes an anti-punch through implantation that will prevent source to drain leakage in the logic devices formed in these areas). After photo resist removal, photo resist PR is formed in the area between each of the gate stacks S1 and S2 and in the logic areas, followed by an oxide etch to remove the oxide on the substrate fin 58 outside of the pairs of stacks, as shown in FIGS. 22A-22E. Photo resist is then formed on the Memory and HV areas, followed by oxide and nitride etches to remove the oxide and nitride on fins 58. Oxide 86 is then formed on the exposed fins 58 in the Logic Core and Logic IO areas (and other exposed portions of substrate 42), as shown in Figures. FIGS. 23A-23E. Oxide 86 on the fins 58 in the Logic Core and Logic IO areas is thinner than oxide 80 on the fins in the HV area.

Figure 26A:
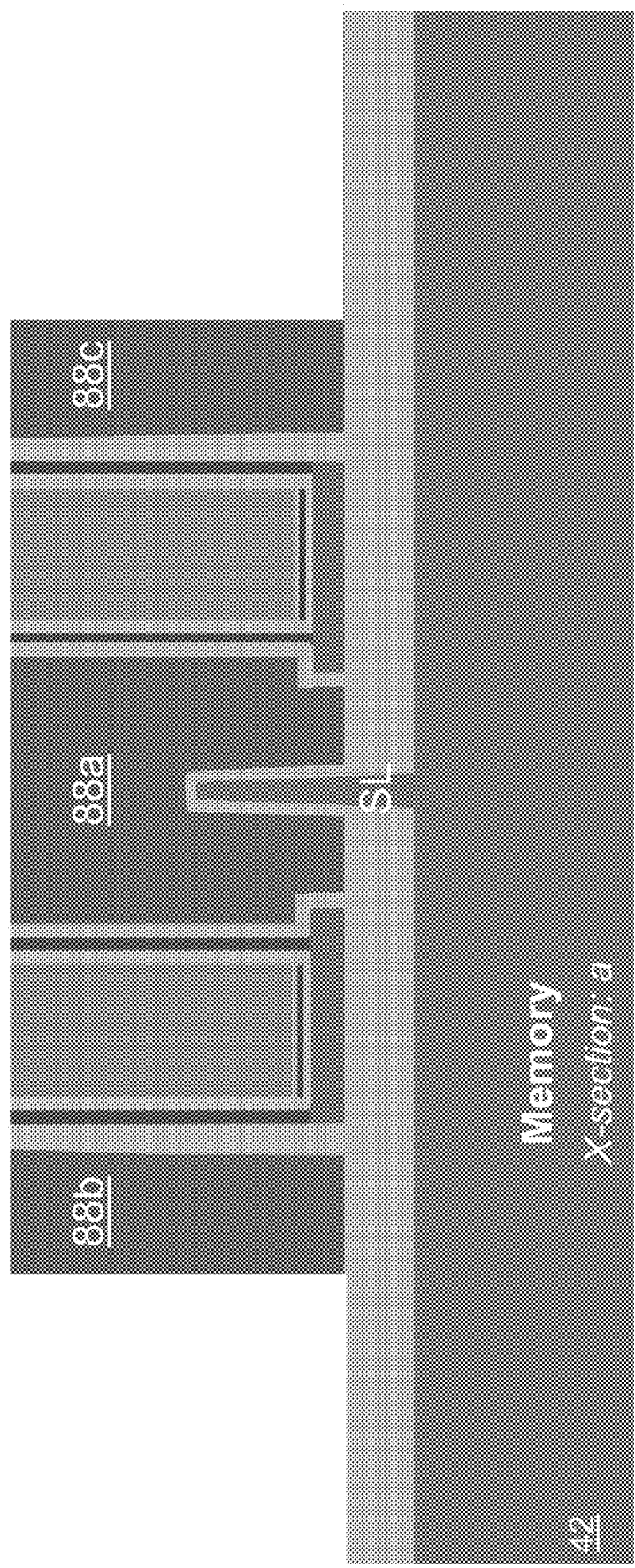
Figure 26B:
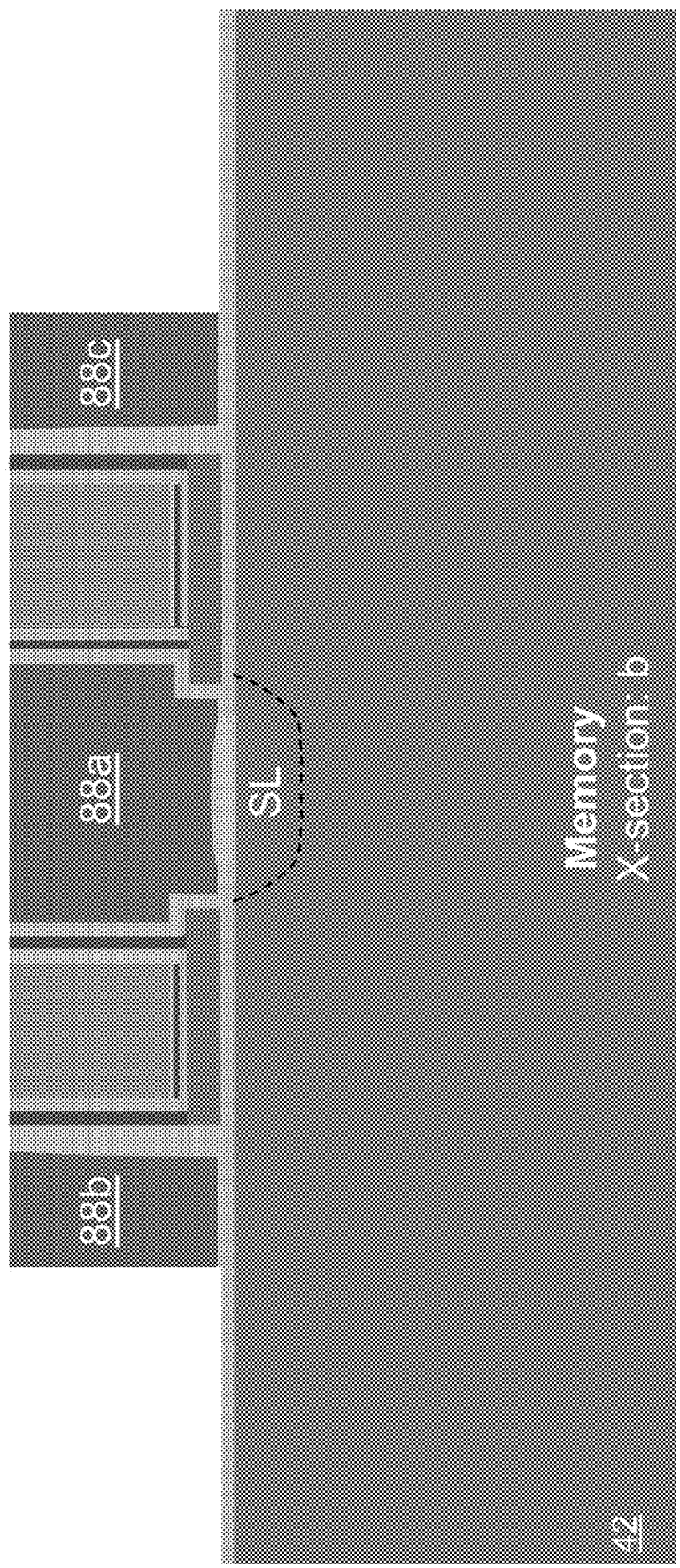
Figure 26C:
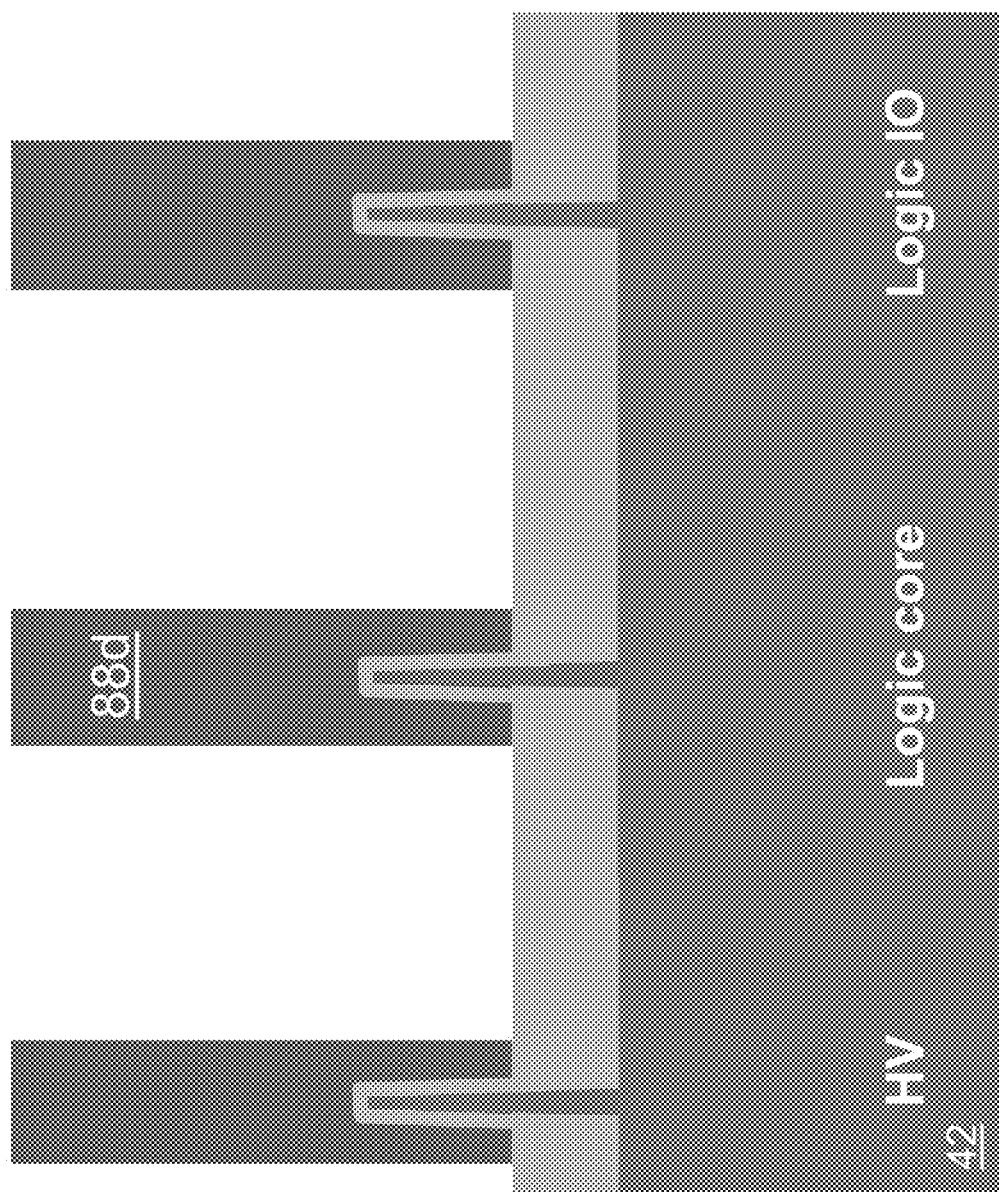

Poly layer 88 is formed over the structures, as shown in FIGS. 24A-24E. A chemical mechanical polish (CMP) is used to remove the upper portions of, and planarize, the structures, as shown in FIGS. 25A-25E. A masking step and poly etch are used to remove a portion of poly layer 88 between adjacent pairs of gate stacks, leaving a poly block 88a between each of gate stacks S1 and S2, and poly blocks 88b and 88c on the outer portions of each pair of gate stacks S1 and S2, as shown in FIGS. 26A and 26B. The poly etch also removes portions of poly layer 88 on fins 58 in the Logic Areas, leaving poly blocks 88d as shown in FIG. 26C. One or more masking and implantation steps are used to selectively implant the substrate in the logic areas.

Figure 27A:
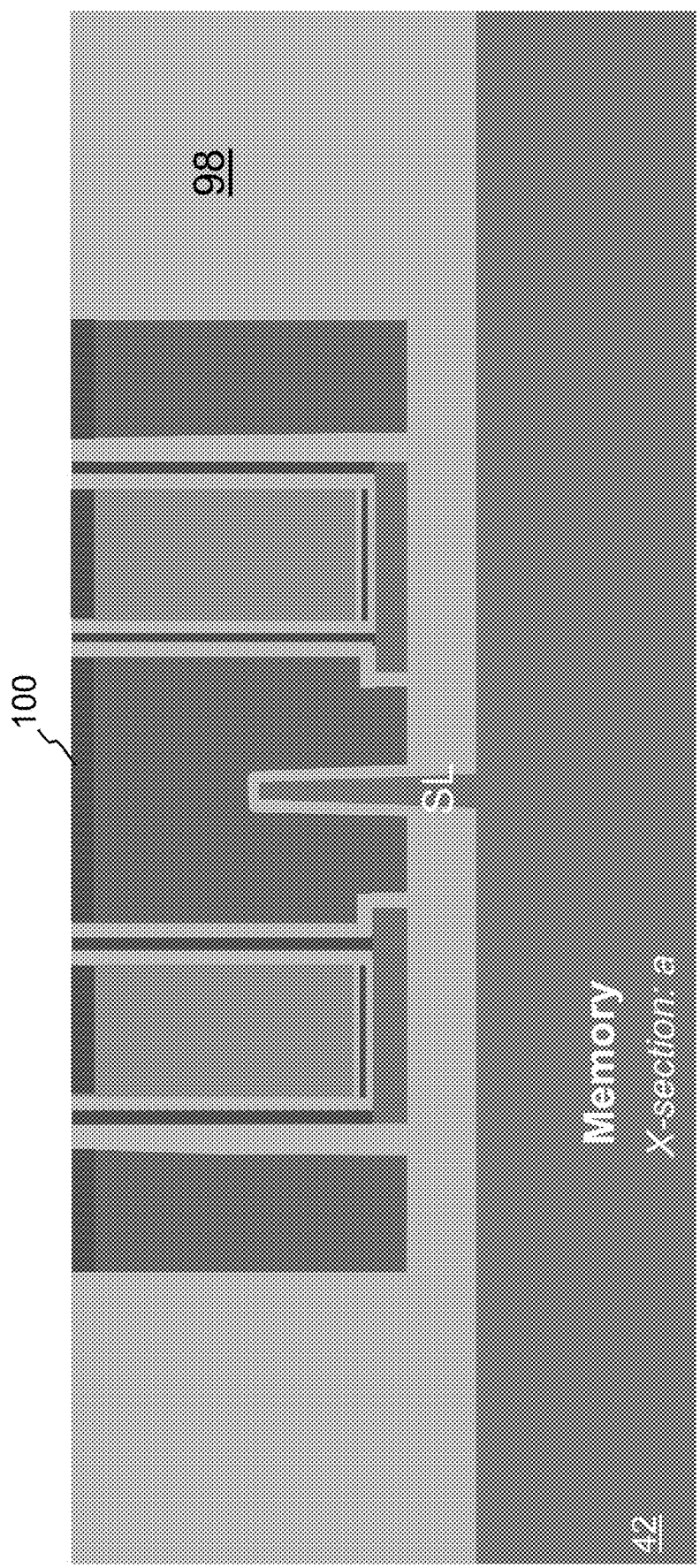
Figure 27B:
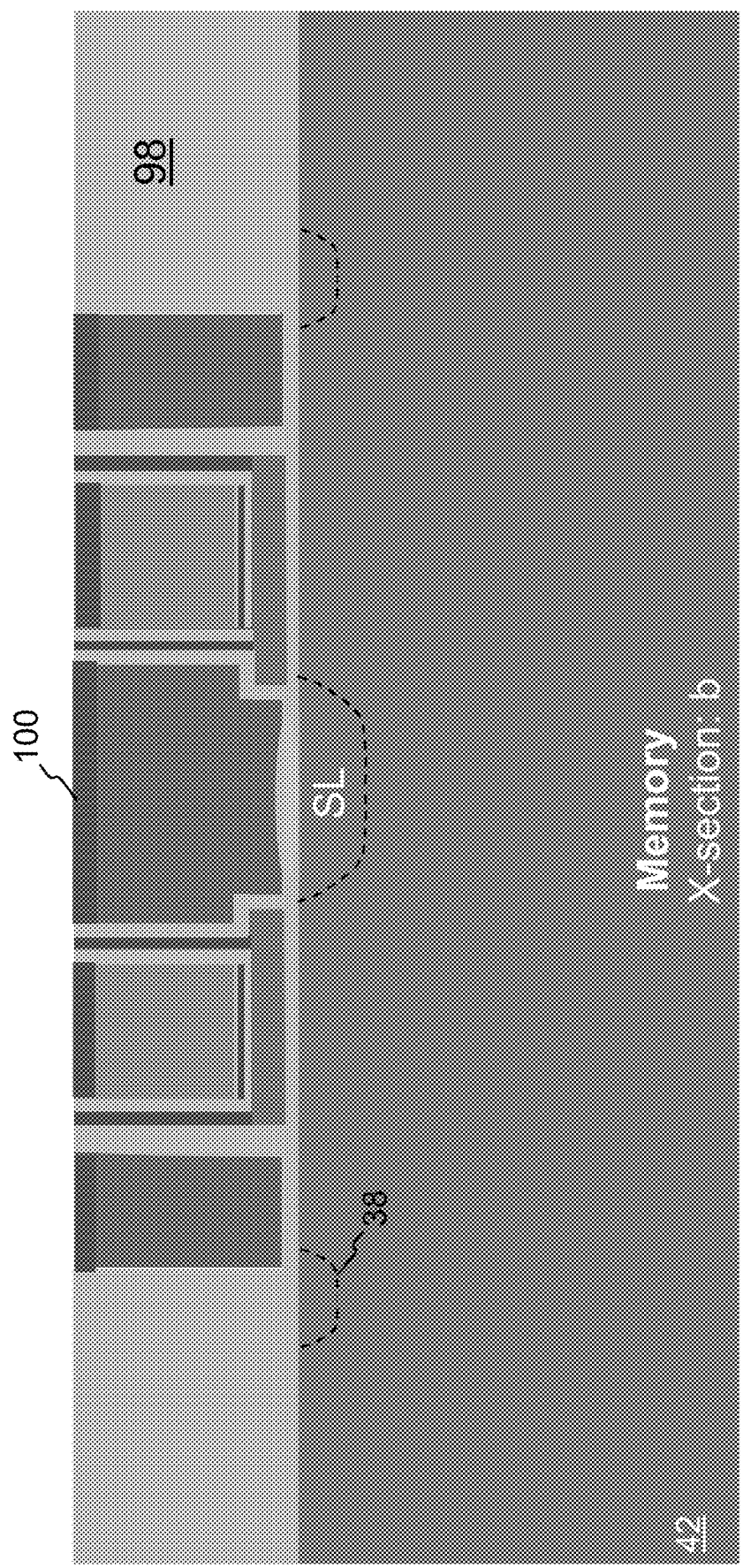

One or more implantations are performed to form source and drain regions in the substrate 42 for the memory cells and logic devices. Specifically, memory cell drain regions 38 are formed adjacent to poly blocks 88b and 88c. Logic source and drain regions are formed in the HV, Logic Core and Logic IO areas adjacent the remaining poly blocks 88d. A layer of insulation (e.g., oxide) 98 is formed over the structures and planarized (e.g., by CMP using poly blocks 88 as the polish stop). Salicide 100 is preferably formed on the exposed surfaces of poly blocks 88 and 68. The resulting structure is shown in FIGS. 27A and 27B.

Additional insulation material is formed over the structure. Contact holes are formed in the insulation material that extend to and expose drain regions 38, as well as the poly block 88 and 68. Preferably, the source and drain regions of the fin for the logic devices and the drain regions of the memory cells can be at least partially etched away, followed by a SiGe (for PFet devices) or SiC (for NFet devices) epitaxy process to form raised drain regions 38a for the memory cells and raised source and drain regions for the logic devices, which induce compressive or tensile stress that improves mobility (i.e., reduces series resistance). The contact holes are then filled with metal to form metal contacts 110 electrically connected to the drain regions 38 and poly blocks 88 and 68, as shown in FIG. 28.

Figure 28:
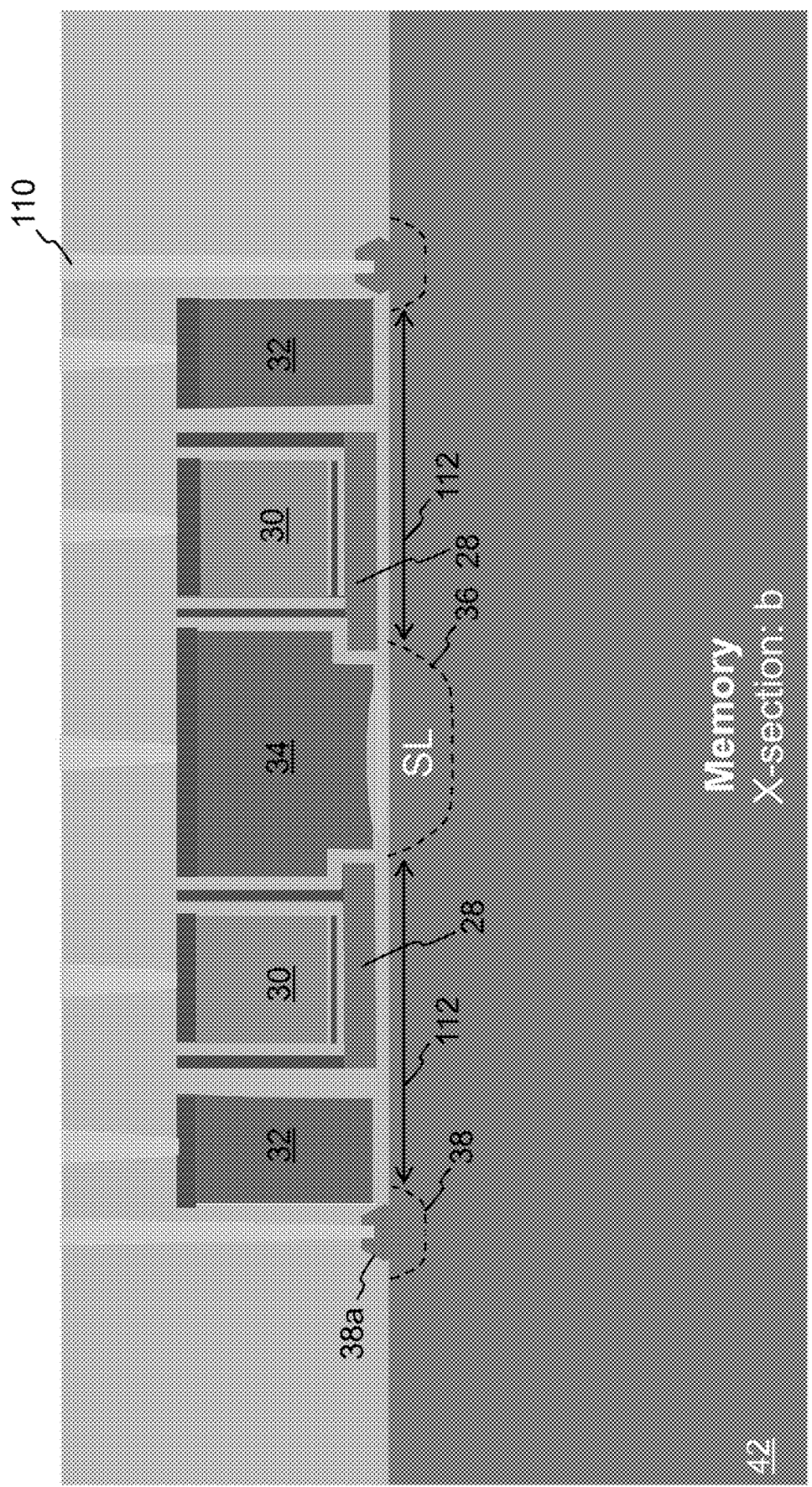

The final structure on fin 58 in the Memory Area 42a is shown in FIG. 28. Pairs of memory cells are formed end to end along each fin 58. Each memory cell includes a channel region 112 of the substrate that extends between the source and drain regions 36 and 38 (i.e., those portions of the substrate along the two side surfaces and the top surface of the fin 58 between the source/drain regions 36/38). Poly 66 is the floating gate 28, which is disposed over and insulated from a first portion of the channel region 112. Poly 68 is the control gate 30, which extends over and is insulated from the floating gate 28. Poly 88b/c are each the select gates 32, each of which is disposed over and insulated from a second portion of the channel region 112. Poly 88a are each the erase gate 34, each of which is adjacent to and insulated from a pair of the floating gates 28, and over and insulated from the source region 36. The erase gate 34 includes a notch facing a corner of the floating gate. The fin 58 has two opposing side surfaces and a top surface. The floating gate 28 wraps around the fin 58 so that it is adjacent to and insulated from both opposing side surfaces, as well as the top surface, of the fin 58. The select gate 32 also wraps around the fin 58 so that it is adjacent to and insulated from both opposing side surfaces, and the top surface, of the fin 58. Therefore, one advantage of the present configuration is that the surface area of the channel region 112 is greater in size versus an equally sized memory cell over a planar channel region (i.e., the amount of surface overlap between the floating and select gates and the substrate is greater than the horizontal area of the substrate occupied by these elements).

The final structures on and around the fins 58 in the HV Area 42b, the Logic Core Area 42c and the Logic IO Area 42d are similar in that the gates each wraps around the respective fin 58 so that it is adjacent to and insulated from both opposing side surfaces, and the top surface, of the fin 58. Therefore, another advantage of the present configuration is that the surface area of the channel region for each of the logic devices is greater in size versus an equally sized logic device over a planar channel region (i.e., the amount of surface overlap between the logic gate and the substrate is greater than the horizontal area of the substrate occupied by this element). The gate oxide 80 in the HV Area is thicker than the gate oxide 86 in the other logic areas, for higher voltage operation. Each logic device includes logic source and drain regions, with a logic channel region there between.

Other advantages include that conformal gates wrapping around the top and both side surfaces of the fin 58 are formed both in the Memory Area (i.e., floating and select gates) and the Logic Area (i.e., logic gates). Further, by recessing the fins in the Memory Area, the tops of the memory cells and the logic devices are approximately equal to each other, even though the gate stacks of the memory cells are taller than the logic gates of the logic devices. In addition, memory cells and three different types of logic devices are all formed on fin shaped substrate structures of the same semiconductor substrate, where each memory cell is formed on a single fin, and each logic device is formed on a single fin, which enables a reduction of fin-to-fin spacing.

Finally, each of the source lines SL extends along one of the horizontally extending fins 58 and through a row of the memory cells, providing a continuous source line that extends across the isolation regions between adjacent cells (in the row direction). This allows for scaling the cells down to a smaller size, because this configuration avoids the need to form source line contacts for each pair of memory cells. Instead, the continuous source line extending along the fin can be electrically connected to a strap through periodic strap contacts (e.g., every 32 or 64 columns). By having a contact every 32 or 64 columns instead of one for every column, the size is the memory cells and thus a memory array of the memory cells can be significantly reduced.

It is to be understood that the present invention is not limited to the embodiment(s) described above and illustrated herein, but encompasses any and all variations falling within the scope of any claims supported thereby. For example, references to the present invention herein are not intended to limit the scope of any claim or claim term, but instead merely make reference to one or more features that may be covered by one or more claims. Materials, processes and numerical examples described above are exemplary only, and should not be deemed to limit any claims. Further, not all method steps need be performed in the exact order illustrated. The fins could continuously extend between memory and logic areas. For example, one or more fins in the Memory Area (on which memory cells are formed) could continuously extend out of the Memory Area and into the Logic Area (on which logic devices are formed), in which case memory devices and logic devices could be formed on the same continuously formed fin. Lastly, single layers of material could be formed as multiple layers of such or similar materials, and vice versa.

It should be noted that, as used herein, the terms "over" and "on" both inclusively include "directly on" (no intermediate materials, elements or space disposed there between) and "indirectly on" (intermediate materials, elements or space disposed there between). Likewise, the term "adjacent" includes "directly adjacent" (no intermediate materials, elements or space disposed there between) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements there between, as well as forming the element indirectly on the substrate with one or more intermediate materials/elements there between.

What is claimed is:

1. A method of forming a memory device, comprising:
   forming a plurality of upwardly extending fins in an upper surface of a semiconductor substrate, wherein each of the fins including first and second side surfaces that oppose each other and that terminate in a top surface;
   forming a memory cell on a first fin of the plurality of fins, by:
   forming spaced apart source and drain regions in the first fin, with a channel region of the first fin extending along the top surface and the opposing side surfaces of the first fin between the source and drain regions,
   forming a floating gate that extends along a first portion of the channel region, wherein the floating gate extends along and is insulated from the first and second side surfaces and the top surface of the first fin,
   forming a select gate that extends along a second portion of the channel region, wherein the select gate extends along and is insulated from the first and second side surfaces and the top surface of the first fin,
   forming a control gate that extends along and is insulated from the floating gate, and
   forming an erase gate that extends along and is insulated from the source region;

wherein a second fin of the plurality of fins has a length that extends in a first direction, wherein the first fin has a length that extends in a second direction that is perpendicular to the first direction, and wherein the source region is formed in the first fin at an intersection of the first and second fins.

2. The method of claim 1, wherein the erase gate extends along and is insulated from the first and second side surfaces and the top surface of the first fin, and extends along and is insulated from the first and second side surfaces and the top surface of the second fin.

3. The method of claim 2, wherein the erase gate extends along and is insulated from an upper edge of the floating gate and includes a notch facing the upper edge of the floating gate.

4. The method of claim 1, further comprising:
forming a logic device on a third fin of the plurality of fins, by:
   forming spaced apart logic source and logic drain regions in the third fin, with a logic channel region of the third fin extending along the top surface and the opposing side surfaces of the third fin between the logic source and logic drain regions, and
   forming a logic gate that extends along the logic channel region, wherein the logic gate extends along and is insulated from the first and second side surfaces and the top surface of the third fin.

5. The method of claim 4, wherein the third fin extends higher than the first and second fins relative to the substrate.

6. The method of claim 4, further comprising:
forming a second logic device on a fourth fin of the plurality of fins, by:
   forming spaced apart second logic source and logic drain regions in the fourth fin, with a second logic channel region of the fourth fin extending along the top surface and the opposing side surfaces of the fourth fin between the second logic source and drain regions, and
   forming a second logic gate that extends along the second logic channel region, wherein the second logic gate extends along and is insulated from the first and second side surfaces and the top surface of the fourth fin.

7. The method of claim 6, wherein:
the logic gate is insulated from the third fin by first insulation material;
the second logic gate is insulated from the fourth fin by second insulation material;
the first insulation material has a thickness that is greater than that of the second insulation material.

8. A method of forming a memory device, comprising:
forming plurality of upwardly extending first fins and a plurality of upwardly extending second fins in an upper surface of a semiconductor substrate, wherein:
   each of the first and second fins including first and second side surfaces that oppose each other and that terminate in a top surface,
   each of the first fins has a length that extends in a first direction,
   each of the second fins has a length that extends in a second direction that is perpendicular to the first direction, and
   the first fins intersect the second fins in a grid like manner;
forming a plurality of memory cells on the first fins, wherein each memory cell is formed on one of the first fins by:
   forming spaced apart source and drain regions in the one first fin, with a channel region of the one first fin extending along the top surface and the opposing side surfaces of the one first fin between the source and drain regions,
   forming a floating gate that extends along a first portion of the channel region, wherein the floating gate extends along and is insulated from the first and second side surfaces and the top surface of the one first fin,
   forming a select gate that extends along a second portion of the channel region, wherein the select gate extends along and is insulated from the first and second side surfaces and the top surface of the one first fin,
   forming a control gate that extends along and is insulated from the floating gate, and
   forming an erase gate that extends along and is insulated from the source region,
   wherein the source region is formed at an intersection of the one first fin and one of the second fins.

9. The method of claim 8, wherein the memory cells are arranged in rows extending in the second direction and columns extending in the first direction, and wherein each of the second fins electrically connects together the source regions of a row of the memory cells.

10. The method of claim 8, wherein for each of the memory cells, the erase gate extends along and is insulated from the first and second side surfaces and the top surface of the one first fin, and extends along and is insulated from the first and second side surfaces and the top surface of the one second fin.

11. The method of claim 10, wherein for each of the memory cells, the erase gate extends along and is insulated from an upper edge of the floating gate and includes a notch facing the upper edge of the floating gate.

12. The method of claim 8, further comprising:
forming a plurality of upwardly extending third fins in the upper surface of the semiconductor substrate;
forming a plurality of logic devices on the third fins, wherein each of the logic devices is formed on one of the third fins by:
   forming spaced apart logic source and logic drain regions in the one third fin, with a logic channel region of the one third fin extending along the top surface and the opposing side surfaces of the one third fin between the logic source and logic drain regions, and
   forming a logic gate that extends along the logic channel region, wherein the logic gate extends along and is insulated from the first and second side surfaces and the top surface of the one third fin.

13. The method of claim 12, wherein each of the plurality of third fins extends higher than each of the plurality of first fins and each of the plurality of second fins relative to the substrate.

14. The method of claim 12, wherein one of the logic gates is insulated from one of the third fins by first insulation material, another one of the logic gates is insulated from another one of the third fins by a second insulation material, and the first insulation material has a thickness that is greater than that of the second insulation material.

\* \* \* \* \*